US010818722B2

(12) United States Patent
Suzuki et al.

(10) Patent No.: US 10,818,722 B2
(45) Date of Patent: Oct. 27, 2020

(54) SOLID-STATE IMAGING DEVICE, METHOD OF MANUFACTURING A SOLID-STATE IMAGING DEVICE, AND ELECTRONIC APPARATUS

(71) Applicant: Sony Corporation, Tokyo (JP)

(72) Inventors: Rena Suzuki, Kanagawa (JP); Hiroki Tojinbara, Kanagawa (JP); Ryoto Yoshita, Kanagawa (JP); Yoichi Ueda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/510,445

(22) Filed: Jul. 12, 2019

(65) Prior Publication Data

US 2019/0341418 A1    Nov. 7, 2019

Related U.S. Application Data

(63) Continuation of application No. 15/725,957, filed on Oct. 5, 2017, now Pat. No. 10,367,027, and a continuation of application No. 15/370,778, filed on Dec. 6, 2016, now Pat. No. 9,960,202, which is a continuation of application No. 14/993,847, filed on (Continued)

(30) Foreign Application Priority Data

Sep. 25, 2013    (JP) .................. 2013-197873

(51) Int. Cl.
*H01L 27/146*    (2006.01)
*H04N 9/04*    (2006.01)
*H04N 5/374*    (2011.01)

(52) U.S. Cl.
CPC .... *H01L 27/14645* (2013.01); *H01L 27/1463* (2013.01); *H01L 27/1464* (2013.01); *H01L 27/14607* (2013.01); *H01L 27/14621* (2013.01); *H01L 27/14623* (2013.01);
(Continued)

(58) Field of Classification Search
CPC ......... H01L 27/14645; H01L 27/14607; H01L 27/14621; H01L 27/14623; H01L 27/1463; H01L 27/14727; H01L 27/1464; H01L 27/14685; H04N 5/374
See application file for complete search history.

(56) References Cited

U.S. PATENT DOCUMENTS 6,008,511 A * 12/1999 Tokumitsu ........ H01L 27/14621
257/232
6,566,723 B1 * 5/2003 Vook ................. H01L 27/14645
250/226

(Continued)

*Primary Examiner* — Nathan W Ha
(74) *Attorney, Agent, or Firm* — Sheridan Ross P.C.

(57) ABSTRACT

Disclosed is a solid-state imaging device including a plurality of pixels and a plurality of on-chip lenses. The plurality of pixels are arranged in a matrix pattern. Each of the pixels has a photoelectric conversion portion configured to photoelectrically convert light incident from a rear surface side of a semiconductor substrate. The plurality of on-chip lenses are arranged for every other pixel. The on-chip lenses are larger in size than the pixels. Each of color filters at the pixels where the on-chip lenses are present has a cross-sectional shape whose upper side close to the on-chip lens is the same in width as the on-chip lens and whose lower side close to the photoelectric conversion portion is shorter than the upper side.

20 Claims, 51 Drawing Sheets

Related U.S. Application Data

Jan. 12, 2016, now Pat. No. 9,548,326, which is a continuation of application No. 14/490,350, filed on Sep. 18, 2014, now Pat. No. 9,276,032.

(52) U.S. Cl.
CPC .. *H01L 27/14627* (2013.01); *H01L 27/14685* (2013.01); *H04N 5/374* (2013.01); *H04N 9/045* (2013.01)

(56) References Cited

U.S. PATENT DOCUMENTS

| | | | |
|---|---|---|---|
| 7,259,788 B1* | 8/2007 | Olding | H01L 27/14609 257/E27.132 |
| 2011/0074989 A1* | 3/2011 | Fossum | H04N 5/2257 348/273 |
| 2013/0048833 A1* | 2/2013 | Hayashi | H04N 9/045 250/208.1 |
| 2013/0307106 A1* | 11/2013 | Egawa | H01L 27/1461 257/432 |
| 2016/0198115 A1* | 7/2016 | Tsuchiya | H04N 5/379 348/294 |
| 2016/0322412 A1* | 11/2016 | Yamamoto | H01L 27/14627 |
| 2016/0372507 A1* | 12/2016 | Yang | H04N 5/374 |
| 2016/0373634 A1* | 12/2016 | Moon | H01L 27/14609 |
| 2016/0373665 A1* | 12/2016 | Ogino | H01L 27/14629 |

\* cited by examiner

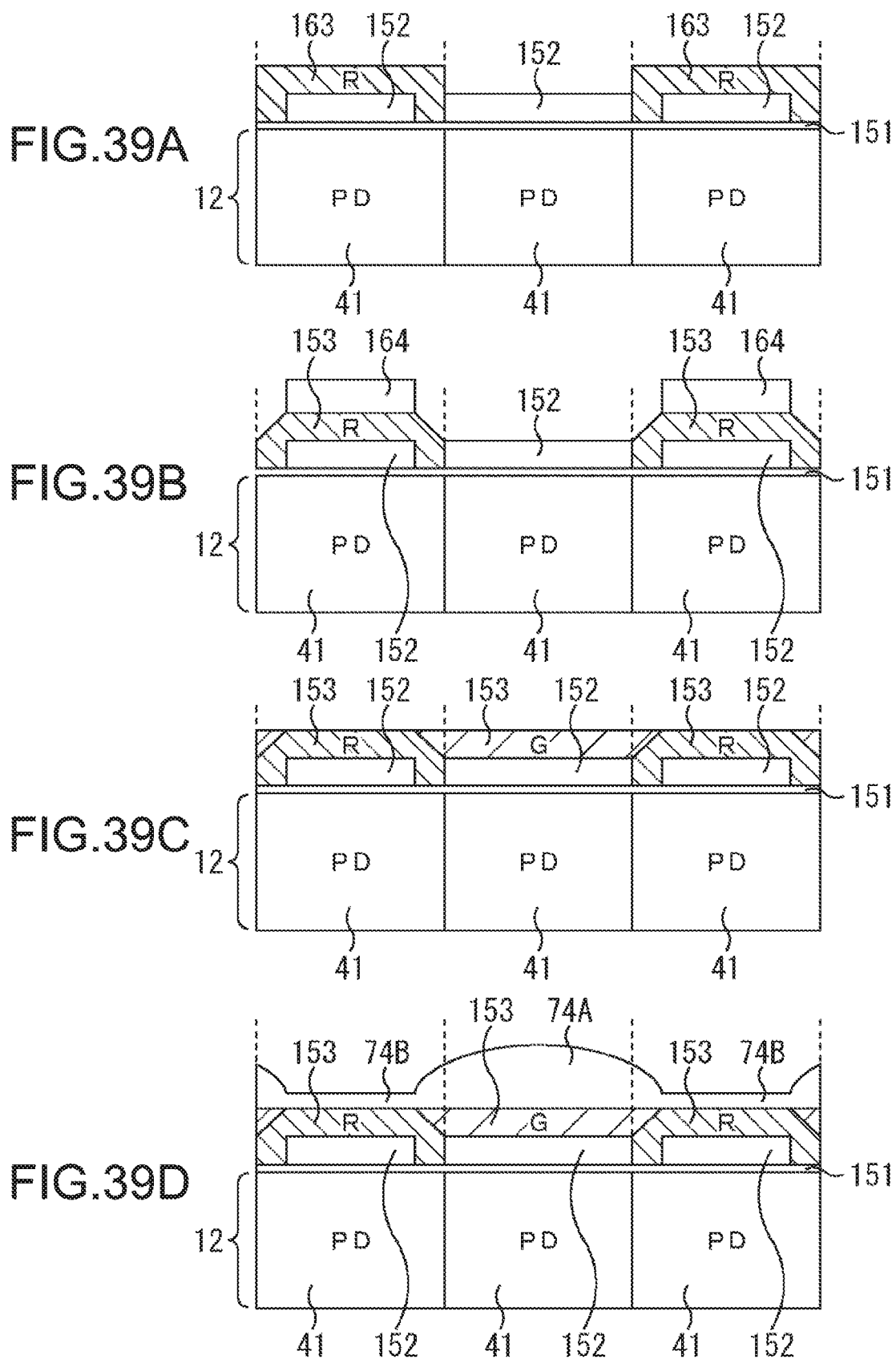

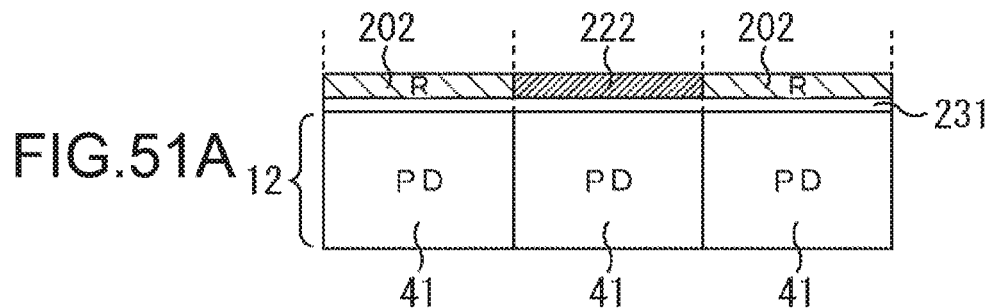
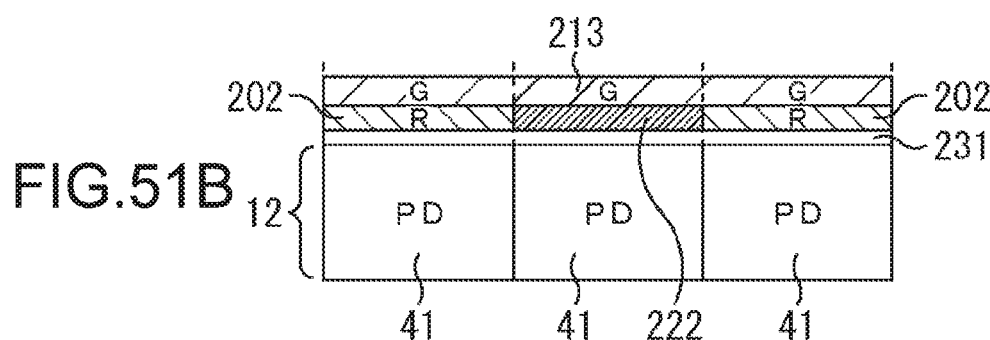
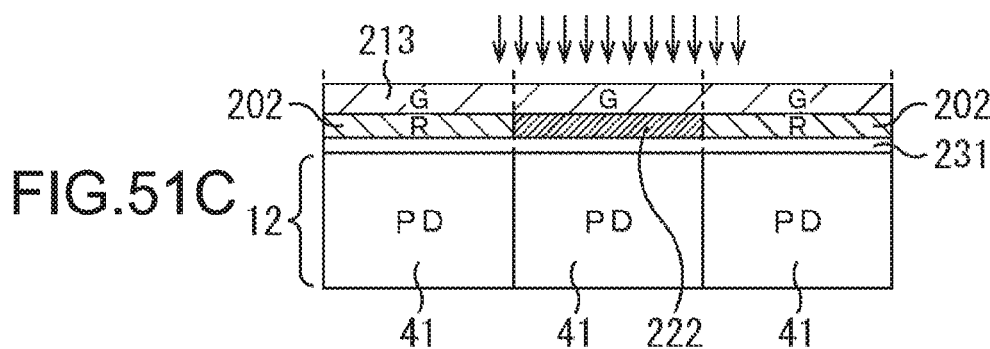
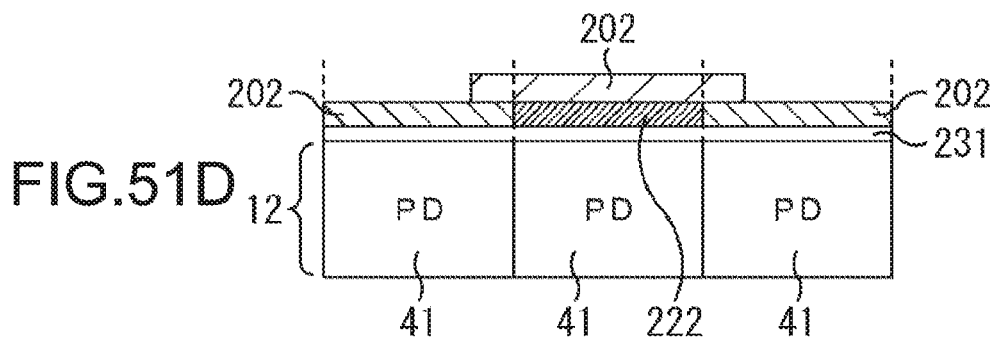

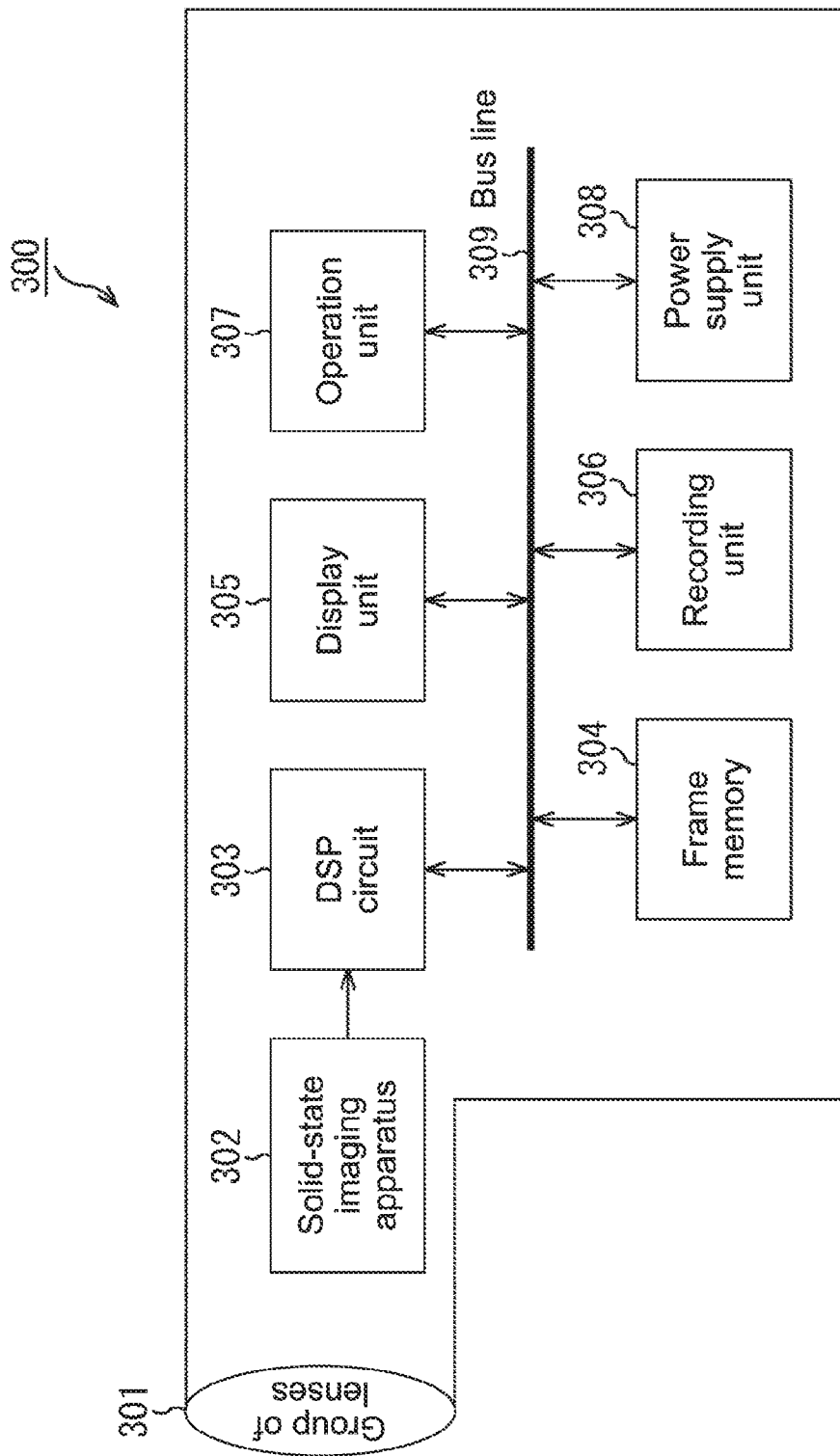

SOLID-STATE IMAGING DEVICE, METHOD OF MANUFACTURING A SOLID-STATE IMAGING DEVICE, AND ELECTRONIC APPARATUS

CROSS REFERENCE TO RELATED APPLICATIONS

This application is a continuation of U.S. patent application Ser. No. 15/725,957, filed Oct. 5, 2017, is a continuation of U.S. patent application Ser. No. 15/370,778, filed Dec. 6, 2016, now U.S. Pat. No. 9,960,202, which is a continuation of U.S. patent application Ser. No. 14/993,847, filed Jan. 12, 2016, now U.S. Pat. No. 9,548,326, which is a continuation of U.S. patent application Ser. No. 14/490,350, filed Sep. 18, 2014, now U.S. Pat. No. 9,276,032, which claims priority to Japanese Patent Application No. JP 2013-197873, filed Sep. 25, 2013, the entire disclosures of which are hereby incorporated herein by reference.

BACKGROUND

The present disclosure relates to solid-state imaging devices, methods of manufacturing the solid-state imaging devices, and electronic apparatuses and, in particular, to a solid-state imaging device, a method of manufacturing the solid-state imaging device, and an electronic apparatus capable of preventing the degradation of color mixture.

In recent years, CMOS type solid-state imaging devices (CMOS image sensors) have been installed in various electronic apparatuses such as digital cameras, video cameras, monitoring cameras, copiers, and facsimile machines.

In solid-state imaging devices, on-chip lenses are formed over photodiodes serving as light receiving portions. However, the manufacturing of the on-chip lenses with a desired curvature has become difficult since it is requested to downsize the on-chip lenses to suit to finer pixels.

Accordingly, there has been proposed the technology of achieving an improvement in sensitivity in a pixel structure in which on-chip lenses larger in size than pixels are formed for every other pixel to suit to finer pixels (see, for example, Japanese Patent Application Laid-open No. 2007-287891 (hereinafter, referred to as Patent Document 1).

SUMMARY

Since the pixel structure disclosed in Patent Document 1 is the pixel structure of a surface irradiation type, it is desired that the pixel structure be applied to a rear surface irradiation type to further improve sensitivity. However, the application of the pixel structure disclosed in Patent Document 1 to the rear surface irradiation type may cause the degradation of color mixture.

The present disclosure has been made in view of the above circumstances, and it is therefore desirable to prevent the degradation of color mixture in the pixel structure of the rear surface irradiation type in which on-chip lenses larger in size than pixels are formed for every other pixel.

A first embodiment of the present disclosure provides a solid-state imaging device including a plurality of pixels and a plurality of on-chip lenses. The plurality of pixels are arranged in a matrix pattern. Each of the pixels has a photoelectric conversion portion configured to photoelectrically convert light incident from a rear surface side of a semiconductor substrate. The plurality of on-chip lenses are arranged for every other pixel. The on-chip lenses are larger in size than the pixels. Each of color filters at the pixels where the on-chip lenses are present has a cross-sectional shape whose upper side close to the on-chip lens is the same in width as the on-chip lens and whose lower side close to the photoelectric conversion portion is shorter than the upper side.

A second embodiment of the present disclosure provides a method of manufacturing a solid-state imaging device having a plurality of pixels and a plurality of on-chip lenses. The plurality of pixels are arranged in a matrix pattern. Each of the pixels has a photoelectric conversion portion configured to photoelectrically convert light incident from a rear surface side of a semiconductor substrate. The plurality of on-chip lenses are arranged for every other pixel. The on-chip lenses are larger in size than the pixels. The method includes forming each of color filters at the pixels where the on-chip lenses are present such that the color filter has a cross-sectional shape whose upper side close to the on-chip lens is the same in width as the on-chip lens and whose lower side close to the photoelectric conversion portion is shorter than the upper side.

A third embodiment of the present disclosure provides an electronic apparatus including a solid-state imaging device. The solid-state imaging device includes a plurality of pixels and a plurality of on-chip lenses. The plurality of pixels are arranged in a matrix pattern. Each of the pixels has a photoelectric conversion portions configured to photoelectrically convert light incident from a rear surface side of a semiconductor substrate. The plurality of on-chip lenses are arranged for every other pixel. The on-chip lenses are larger in size than the pixels. Each of color filters at the pixels where the on-chip lenses are present has a cross-sectional shape whose upper side close to the on-chip lens is the same in width as the on-chip lens and whose lower side close to the photoelectric conversion portion is shorter than the upper side.

In the first and third embodiments of the present disclosure, the plurality of pixels each having the photoelectric conversion portion configured to photoelectrically convert light incident from the rear surface side of the semiconductor substrate are arranged in a matrix pattern, the plurality of on-chip lenses larger in size than the pixels are arranged for every other pixel, and each of the color filters at the pixels where the on-chip lenses are present has the cross-sectional shape whose upper side close to the on-chip lens is the same in width as the on-chip lens and whose lower side close to the photoelectric conversion portion is shorter than the upper side.

In the second embodiment of the present disclosure, each of the color filters at the pixels where the on-chip lenses are present is formed such that the color filter has the cross-sectional shape whose upper side close to the on-chip lens is the same in width as the on-chip lens and whose lower side close to the photoelectric conversion portion is shorter than the upper side in the solid-state imaging device including the plurality of pixels arranged in a matrix pattern, each of the pixels having the photoelectric conversion portion configured to photoelectrically convert light incident from the rear surface side of the semiconductor substrate, and the plurality of on-chip lenses arranged for every other pixel, the on-chip lenses being larger in size than the pixels.

The solid-state imaging device and the electronic apparatus may be independent apparatuses or modules incorporated in other apparatuses.

According to the first and third embodiments of the present disclosure, it is possible to prevent the degradation of color mixture.

Note that the effect of the present disclosure is not limited to the one described above, but any of effects described in the present disclosure may be produced.

These and other objects, features and advantages of the present disclosure will become more apparent in light of the following detailed description of best mode embodiments thereof, as illustrated in the accompanying drawings.

BRIEF DESCRIPTION OF DRAWINGS

FIGS. 39A to 39D are views for describing the method of manufacturing the pixels according to the eighth embodiment;

FIGS. 51A to 51D are views for describing the method of manufacturing the pixels according to the fourteenth embodiment;

FIG. 53 is a block diagram showing a configuration example of an imaging apparatus serving as an electronic apparatus according to an embodiment of the present disclosure.

DETAILED DESCRIPTION OF EMBODIMENTS

Hereinafter, modes (hereinafter referred to as embodiments) for carrying out the technology of the present disclosure will be described. Note that the description will be given in the following order.

1. Schematic Configuration Example of Solid-State Imaging Device
2. Circuit Configuration Example of Pixels
3. First Embodiment of Pixels
4. Method of Manufacturing Pixels According to First Embodiment
5. Second Embodiment of Pixels
6. Third Embodiment of Pixels
7. Fourth Embodiment of Pixels
8. Fifth Embodiment of Pixels
9. Sixth Embodiment of Pixels
10. Other Arrangement Examples of Color Filters
11. Seventh Embodiment of Pixels
12. First Method of Manufacturing Pixels According to Seventh Embodiment
13. Second Method of Manufacturing Pixels According to Seventh Embodiment
14. Eighth Embodiment of Pixels
15. Method of Manufacturing Pixels According to Eighth Embodiment
16. Ninth Embodiment of Pixels
17. Tenth Embodiment of Pixels
18. Eleventh Embodiment of Pixels
19. Twelfth Embodiment of Pixels
20. Thirteenth Embodiment of Pixels
21. Method of Manufacturing Pixels According to Thirteenth Embodiment
22. Fourteenth Embodiment of Pixels
23. Method of Manufacturing Pixels According to Fourteenth Embodiment
24. Fifteenth Embodiment of Pixels
25. Application Example to Electronic Apparatuses 1. Schematic Configuration Example of Solid-State Imaging Device FIG. 1 shows the schematic configuration of a solid-state imaging device according to an embodiment of the present disclosure.

Figure 1:
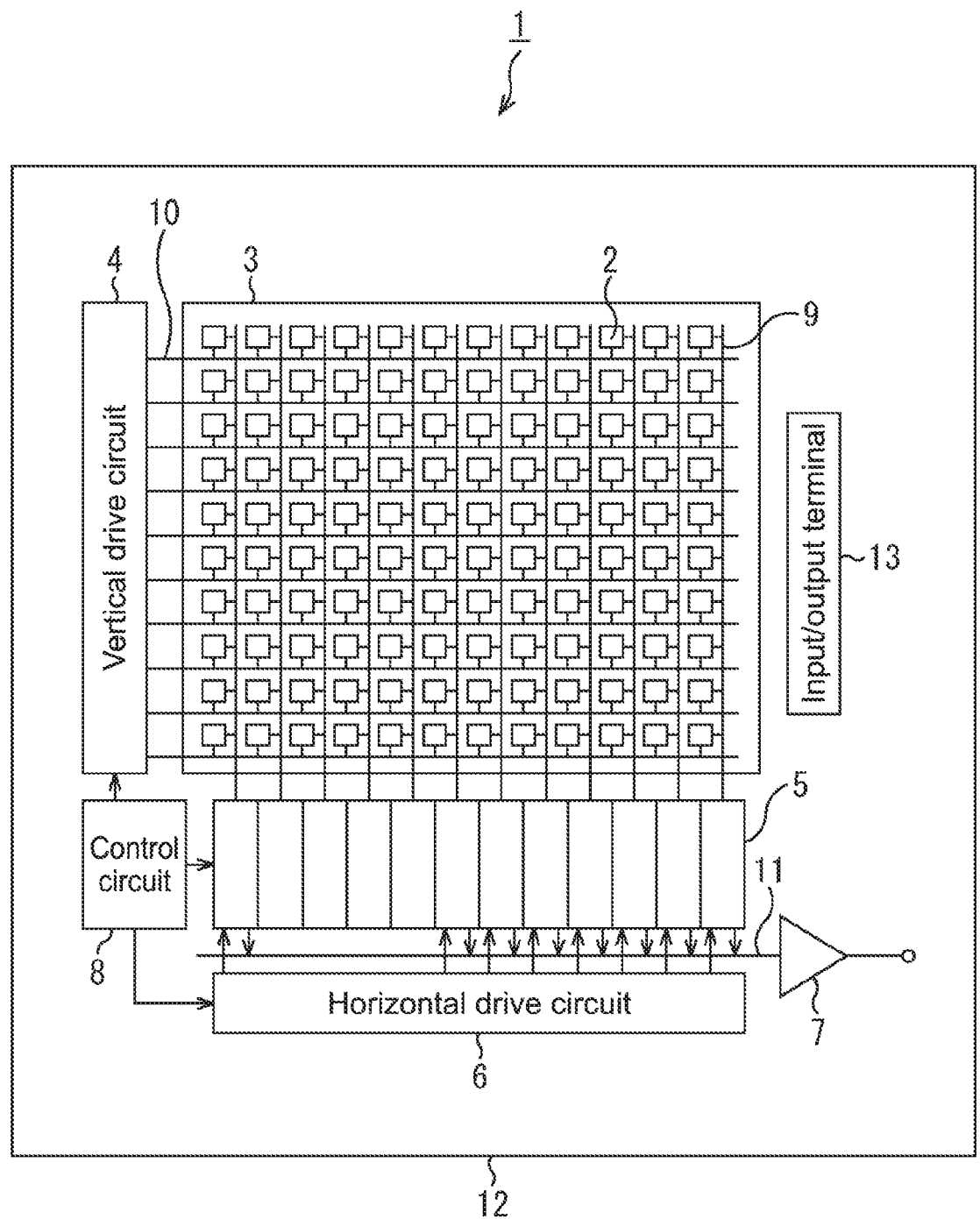
FIG. 1 is a view showing the schematic configuration of a solid-state imaging device according to an embodiment of the present disclosure.

The solid-state imaging device 1 of FIG. 1 has a semiconductor substrate 12 using, for example, silicon (Si) as a semiconductor. The semiconductor substrate 12 has a pixel array unit 3 in which a plurality of pixels 2 are arranged in a matrix pattern and peripheral circuit units on the periphery of the pixel array unit 3. The peripheral circuit units have a vertical drive circuit 4, column signal processing circuits 5, a horizontal drive circuit 6, an output circuit 7, a control circuit 8, and the like.

Each of the pixels 2 has a photodiode serving as a photoelectric conversion element and a plurality of pixel transistors. The plurality of transistors are composed of four MOS transistors, for example, a transfer transistor, a selection transistor, a reset transistor, and an amplification transistor.

In addition, each of the pixels 2 may have a shared pixel structure. The shared pixel structure is composed of a plurality of photodiodes, a plurality of transfer transistors, a shared floating diffusion (floating diffusion region), and other shared individual pixel transistors. That is, in the shared pixel structure, the photodiodes and the transfer transistors constituting the plurality of unit pixels share other individual pixel transistors. A configuration example of the pixels 2 will be described later with reference to FIG. 2.

The control circuit 8 receives an input clock and data for commanding an operations mode or the like and outputs data such as the internal information of the solid-state imaging device 1. That is, based on a vertical synchronization signal, a horizontal synchronization signal, and a master clock, the control circuit 8 generates a clock signal and a control signal that server as the bases of the operations of the vertical drive circuit 4, the column signal processing circuits 5, the horizontal drive circuit 6, and the like. Then, the control circuit 8 outputs the clock signal and the control signal thus generated to the vertical drive circuit 4, the column signal processing circuits 5, the horizontal drive circuit 6, and the like.

The vertical drive circuit 4 is composed of, for example, a shift register, selects pixel drive wiring 10, and supplies a pulse for driving the pixels 2 to the selected pixel drive wiring 10 to drive the pixels 2 on a line-by-line basis. That is, the vertical drive circuit 4 sequentially selects and scans each of the pixels 2 of the pixel array unit 3 on a line-by-line basis and supplies a pixel signal based on a signal charge generated in the photoelectric conversion portion of each of the pixels 2 according to a light receiving amount to the column signal processing circuit 5 via a vertical signal line 9.

The column signal processing circuits 5 are arranged for each column of the pixels 2 and performs signal processing such as noise reduction on a signal output from the pixels 2 of one line for each column of the pixel 2. For example, the column signal processing circuits 5 perform signal processing such as CDS (Correlated Double Sampling) and AD conversion for eliminating fixed pattern noise unique to the pixels 2.

The horizontal drive circuit 6 is composed of, for example, a shift register, sequentially outputs a horizontal scanning pulse to select each of the column signal processing circuits 5 by turns, and causes each of the column signal processing circuits 5 to output an pixel signal to a horizontal signal line 11.

The output circuit 7 performs signal processing on a signal sequentially supplied from each of the column signal processing circuits 5 via the horizontal signal line 11 and outputs the processed signal. The output circuit 7 performs buffering only or various digital signal processing such as black level adjustment and column fluctuation correction according to circumstances. An input/output terminal 13 sends and receives signals to and from an outside.

The solid-state imaging device 1 configured as described above is a CMOS image sensor called a column AD type in which the column signal processing circuits 5 for performing CDS processing and AD conversion processing are arranged on a pixel-column-by-pixel-column basis.

2. Circuit Configuration Example of Pixels

Figure 2:
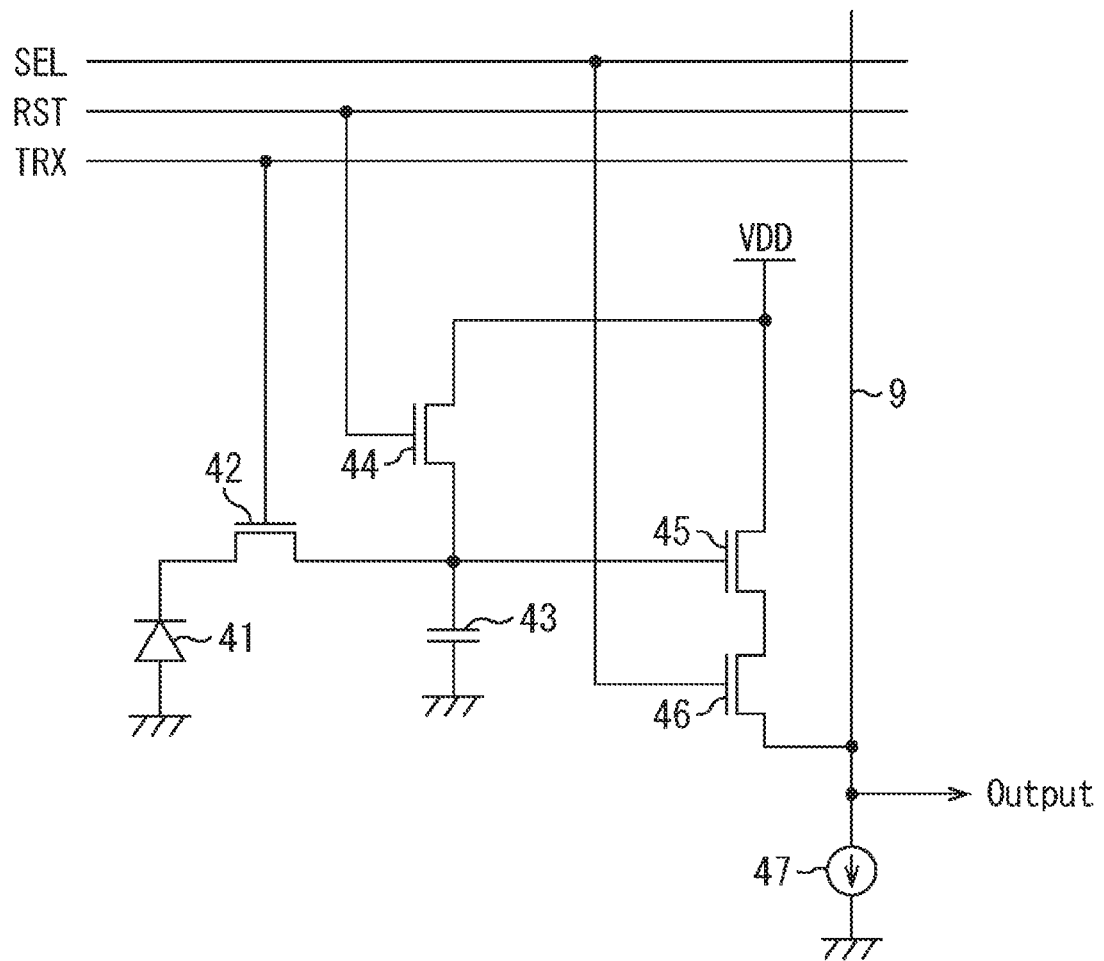
FIG. 2 is a view showing a circuit configuration example of pixels.

FIG. 2 shows a circuit configuration example of the pixels 2.

Each of the pixels 2 has a photodiode 41 serving as a photoelectric conversion element, a transfer transistor 42, a FD (Floating Diffusion) 43, a reset transistor 44, an amplification transistor 45, and a selection transistor 46.

The photodiode 41 is a photoelectric conversion portion that generates and accumulates a charge (signal charge) according to a received light amount. The anode terminal of the photodiode 41 is grounded, and the cathode terminal thereof is connected to the FD 43 via the transfer transistor 42.

When the transfer transistor 42 is turned on by a transfer signal TRX, it reads a charge generated by the photodiode 41 and transfers the same to the FD 43.

The FD 43 is a charge retention portion that retains a charge read from the photodiode 41 to be read as a signal. When the reset transistor 44 is turned on by a reset signal RST, it discharges a charge accumulated in the FD 43 to a drain (constant voltage source VDD) to reset the potential of the FD 43.

The amplification transistor 45 outputs a pixel signal according to the potential of the FD 43. That is, the amplification transistor 45 constitutes a source follower circuit with a load MOS serving as a constant current source 47 connected via a vertical signal line 9, and a pixel signal indicating a level according to a charge accumulated in the FD 43 is output from the amplification transistor 45 to a column signal processing circuit 5 via the selection transistor 46. The constant current source 47 is provided as, for example, part of the column signal processing circuit 5.

The selection transistor 46 is turned on when the pixel 2 is selected by a selection signal SEL, and outputs the pixel signal of the pixel 2 to the column signal processing circuit 5 via the vertical signal line 9. Respective signal lines through which the transfer signal TRX, the selection signal SEL, and the reset signal RST are transmitted correspond to the pixel drive wiring 10 of FIG. 1.

The pixel 2 is configured as described above. The configuration of the pixel 2 is not limited to the above one, but other configurations of the pixel 2 may be employed.

For example, the circuit configuration of the pixel 2 shown in FIG. 2 uses the four pixel transistors of the transfer transistor 42, the reset transistor 44, the amplification transistor 45, and the selection transistor 46. However, it may use the three pixel transistors excluding the selection transistor 46. The respective pixel transistors shown in FIG. 2 operate as n-channel MOS transistors.

Hereinafter, a description will be given of a pixel structure that prevents the degradation of color mixture in the solid-state imaging device 1 of the rear surface irradiation type in which on-chip lenses larger in size than pixels are formed for every other pixel.

3. First Embodiment of Pixels (Cross-Sectional Configuration View of Pixels)

Figure 3:
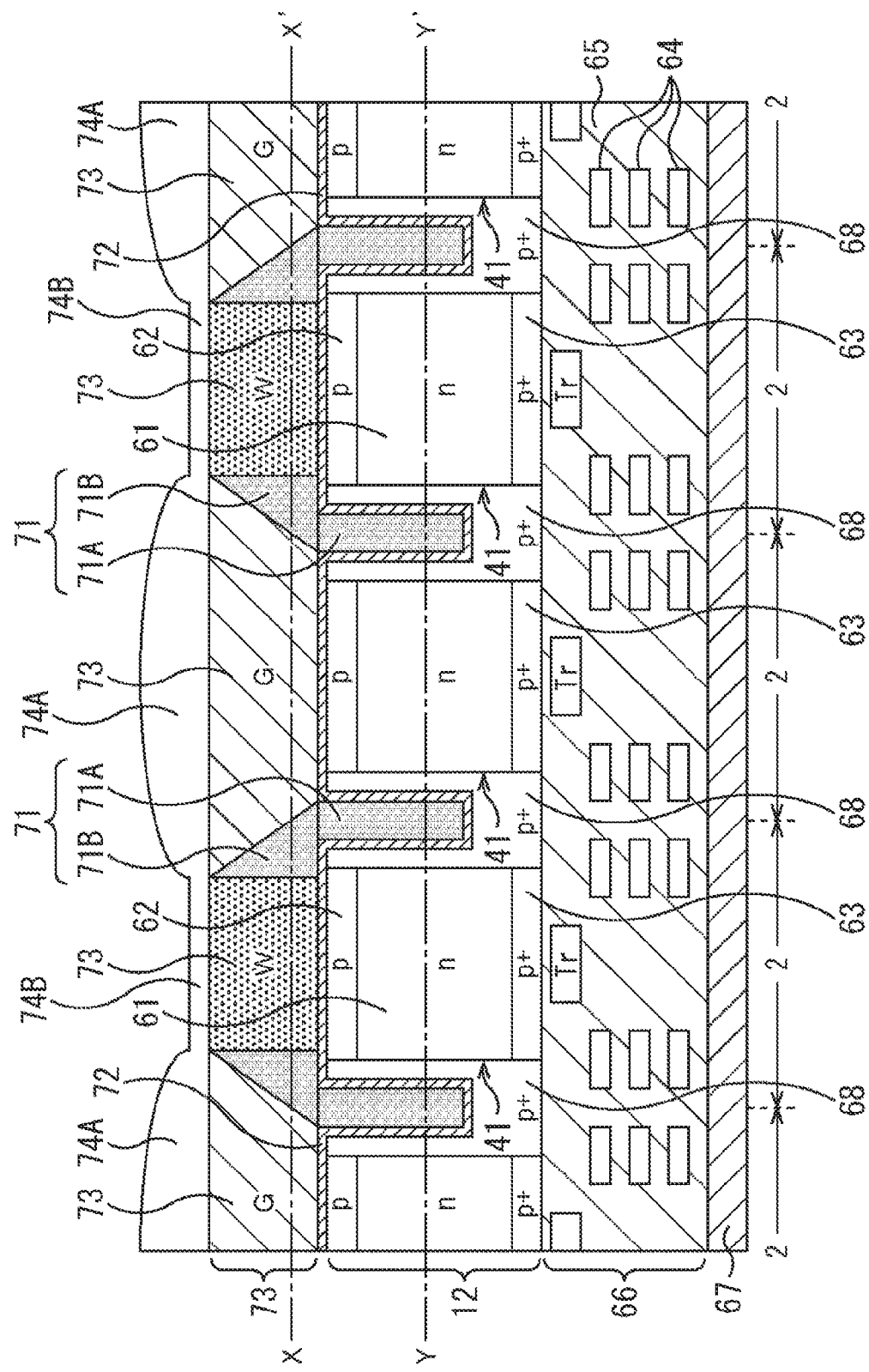
FIG. 3 is a cross-sectional configuration view according to a first embodiment of the pixels.

FIG. 3 is a cross-sectional configuration view according to a first embodiment of the pixels 2. FIG. 3 shows the cross-sectional configuration of the plurality of pixels 2 arranged side by side in a horizontal direction inside the pixel array unit 3.

The semiconductor substrate 12 is made of, for example, an n-type silicon substrate serving as a first conductive type and has a thickness of about 3 to 5 μm. In FIG. 3, the upper side is the rear surface side of the semiconductor substrate 12 where light is incident and the lower side is the front surface side thereof where pixel transistors are formed. Accordingly, the solid-state imaging device 1 employing the pixel structure of FIG. 3 is the CMOS image sensor of the rear surface irradiation type in which light is incident from the rear surface side of the semiconductor substrate 12.

As shown in FIG. 3, in the semiconductor substrate 12, the photodiode 41 formed by bonding together an n-type charge accumulation region 61 serving as a first conductive type, a p-type dark current prevention region 62 serving as a second conductive type, and a p+-type dark current prevention region 63 is formed for each of the pixels 2. Here, "p+" of the dark current prevention region 63 indicates that impurity concentration is higher than "p" of the dark current prevention region 62.

A signal charge generated according to an incident light amount is accumulated in the charge accumulation region 61. In addition, since electrons generated at the interface of the semiconductor substrate 12 rejoin with holes serving as a multiplicity of carriers inside the dark current prevention regions 62 and 63, a dark current is prevented.

On the front surface side (lower side of FIG. 3) of the semiconductor substrate 12, a multilevel wiring layer 66 composed of a plurality of pixel transistors Tr each performing the reading or the like of a charge accumulated in the photodiode 41, a plurality of wiring layers 64, and an interlayer insulation film 65 is formed. In addition, on the lower side of the multilevel wiring layer 66, a support substrate 67 is attached.

Between the two adjacent photodiodes 41, a p+-type element separation layer 68 is formed. The element separation layer 68 has the function of electrically separating the adjacent pixels from each other.

The element separation layer 68 has an embedded light-shielding portion 71A embedded at a desired depth from the rear surface side of the semiconductor substrate 12. The embedded light-shielding portion 71A is connected to a light-shielding wall 71B formed in a color filter layer 73 at the interface on the rear surface side of the semiconductor substrate 12, and the embedded light-shielding portion 71A and the light-shielding wall 71B constitute a light-shielding portion 71. As the material of the light-shielding portion 71, a metal material such as tungsten and aluminum may be, for example, used.

The entire surface on the rear surface side of the semiconductor substrate 12 is covered with a high dielectric constant film 72. More specifically, the side walls and the bottom sides of the embedded light-shielding portions 71A embedded in the element separation layers 68 inside the semiconductor substrate 12 and the interfaces on the rear surface side of the p-type dark current prevention regions 62 and the element separation layers 68 are covered with the high dielectric constant film 72. The high dielectric constant film 72 prevents physical damage caused when trenches serving as the embedded light-shielding portions 71A are formed or pinning deviation caused on the peripheries of the trenches when impurity is inactivated by ion irradiation. As the high dielectric constant film 72, hafnium oxide ($HfO_2$), tantalum pentoxide ($Ta_2O_5$), or zirconium dioxide ($ZrO_2$) may be, for example, used.

Color filters 73 colored in any of R (Red), G Green), B (Blue), and W (White) are formed over the photodiodes 41 on the rear surface side of the semiconductor substrate 12, and the light-shielding walls 71B are formed between (at the side portions of) the color filters 73 at the respective pixels 2. The color filters 73 colored in R, G, or B cause only light having a prescribed wavelength corresponding to R, G, or B among incident light to be incident on the photodiodes 41. The color filters 73 colored in W cause incident light having all wavelengths to be incident on the photodiodes 41. Note that when R, G, B, and W of the color filters 73 are not particularly distinguished from each other, the color filters 73 are also called color filter layers 73.

As shown in FIG. 3, on-chip lenses 74A larger in size than pixels 2 are formed on the upper surfaces of the color filter layers 73 for every other pixel. Note that between the on-chip lenses 74A formed for every other pixel, on-chip lens flattened layers 74B made of the same material as the on-chip lenses 74A are formed.

In the following description, the on-chip lenses 74A and the on-chip lens flattened layers 74B are collectively called an on-chip lens layer 74. The on-chip lens layer 74 may be made of, for example, a resin material such as a styrene resin, an acrylic resin, a styrene-acrylic copolymer resin, and a siloxane resin.

In the example of FIG. 3, the color filter layers 73 at the pixels 2 where the on-chip lenses 74A are present are the color filters 73 colored in R, G, or B, and the color filter layers 73 at the pixels 2 where the on-chip lenses 74A are absent are the color filters 73 colored in W. However, as will be described later with reference to FIGS. 24 to 27, the method of arranging the colors of the color filters 73 is not limited to this example.

The upper surfaces of the color filters 73 colored in R, G, or B at the pixels 2 where the on-chip lenses 74A are present are the same in size as the on-chip lenses 74A. In a cross-sectional shape, as shown in FIG. 3, each of the color filters 73 colored in R, G, or B at the pixels 2 where the on-chip lenses 74A are present is formed in a trapezoidal shape whose upper side on the side of the on-chip lens 74A is the same in width as the on-chip lens 74A and whose lower side on the side of the photodiode 41 is shorter than the upper side.

On the other hand, each of the color filters 73 colored in W at the pixels 2 where the on-chip lenses 74A are absent is formed in a rectangular shape whose upper side on the side of the on-chip lens flattened layer 74B and the lower side on the side of the photodiode 41 are the same in length.

Therefore, the cross section of each of the light-shielding walls 71B formed between the adjacent color filters 73 is formed in a triangular shape whose side partially contacting the embedded light-shielding portion 71A serves as its bottom side and whose height perpendicular to the bottom side corresponds to the film thickness of the color filter layers 73.

In other words, each of the light-shielding walls 71B is formed to have a slant surface such that the color filter 73 at the pixel 2 where the on-chip lens 74A is present has an opening made larger toward the upper layer thereof close to the on-chip lens 74A and formed to have a vertical surface at the pixel 2 where the on-chip lens 74A is absent.

Figure 4A:
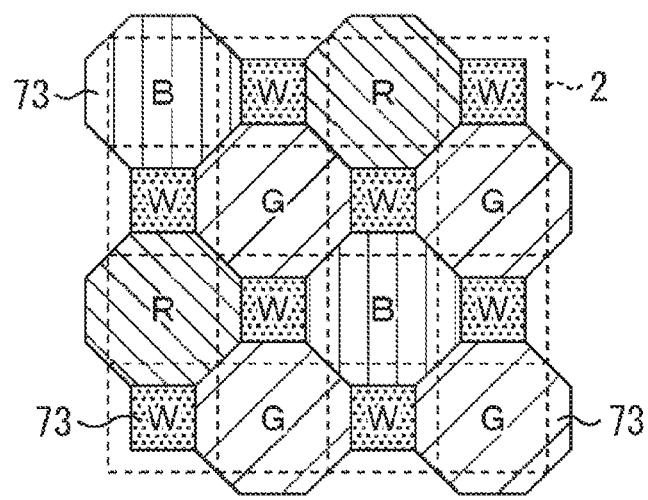
FIGS. 4A to 4C are a plan view and cross-sectional views of the pixels according to the first embodiment.

FIG. 4A is a plan view as seen from the upper surfaces of the color filter layers 73. In addition, FIG. 4B is a cross-sectional view taken along the line X-X' of FIG. 3, and FIG. 4C is a cross-sectional view taken along the line Y-Y' of FIG. 3.

In the pixel array unit 3, as shown in FIG. 4A, the color filters 73 colored in R, G, or B where the on-chip lenses 74A are present and the color filters 73 colored in W where the on-chip lenses 74A are absent are arranged in a checkered pattern.

In addition, each of the color filters 73 colored in R, G, or B larger in size than the pixels 2 is formed in an octagonal shape or a shape close to a circle circumscribing the four corners of the pixel 2 formed in a square shape.

Figure 4B:
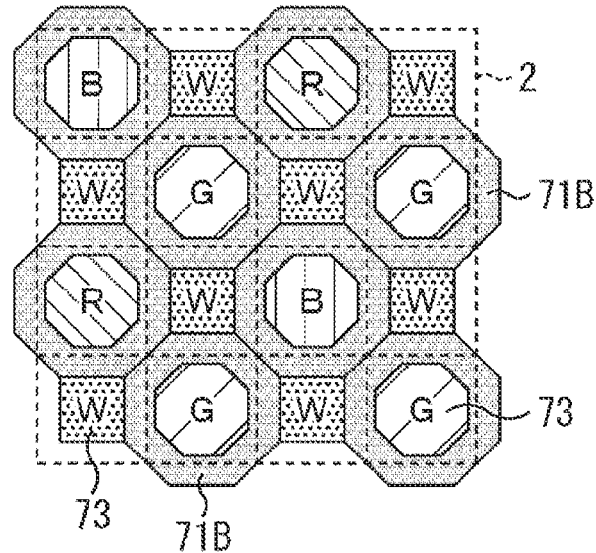
Figure 4C:
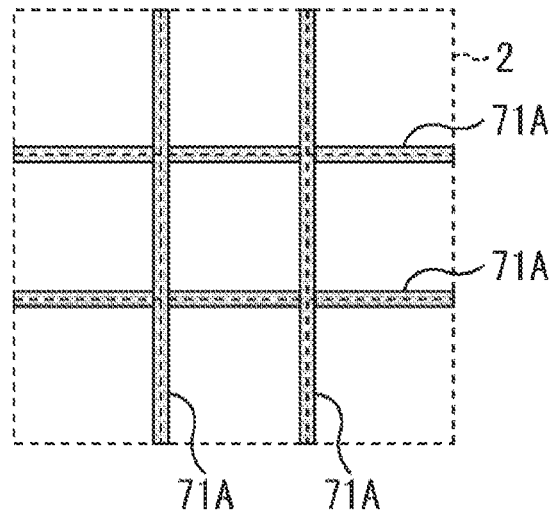

Each of the light-shielding walls 71B inside the color filter layers 73 is formed as an equilateral octagonal or circular peripheral portion as shown in FIG. 4B, and each of the embedded light-shielding portions 71A inside the semiconductor substrate 12 is formed on the boundary of the rectangle pixel region of the pixel 2. When the pitch of the size of the pixels 2 is X, the opening diameter of the color filters colored in R, G, or B larger in size than the pixels 2 is $\sqrt{2}X$.

As described above, in the solid-state imaging device 1, the on-chip lenses 74A are formed on only the color filters 73 colored in R, G, or B and having a large opening and are not formed on the color filters 73 colored in W and having a small opening. At the pixels 2 where the on-chip lenses 74A are present, light may be efficiently incident on the photodiodes 41 with the incident light condensed. At the pixels 2 where the on-chip lenses 74A are absent, a difference in the sensitivity between the pixels 2 where the color filters 73 colored in R, G, or B are arranged and the pixels 2 where the color filters 73 colored in W are arranged may be further reduced since the on-chip lenses 74A are not provided.

In addition, in the solid-state imaging device 1 according to the first embodiment, it is possible to manufacture the pixels 2 having the two different types of sensitivities for different purposed in such a way that the pixels 2 having the two types of opening areas formed by the light-shielding walls 71B are arranged in a checkered pattern.

Then, the pixels 2 having a small opening area are defined as W pixels where the color filters 73 colored in W are arranged, and the pixels 2 having a large opening area are defined as the RGB pixels (R pixels, G pixels, or B pixels) where the color filters 73 colored in R, G, or B are arranged. Thus, it is possible to reduce a difference in the sensitivity between the W pixels and the RGB pixels and prevent a reduction in dynamic range due to saturation. On this occasion, since the configuration inside the semiconductor substrate 12 including the photodiodes 41 is common to all the pixels, other characteristics including a saturation signal amount are the same in all the pixels.

Moreover, in the solid-state imaging device 1 according to the first embodiment, it is possible to reflect and refract slant light incident on the on-chip lenses 74A with the light-shielding walls 71B arranged between the color filters 73 colored in R, G, B, or W to cause the light to be incident on the photodiodes 41 in the same pixels without being leaked.

Accordingly, even in the pixel structure of the rear surface irradiation type in which the distance between the on-chip lenses 74A and the photodiodes 41 is short, it is possible to prevent color mixture from the pixels 2 where the on-chip lenses 74A are arranged to the pixels 2 where the on-chip lenses 74A are not arranged.

Furthermore, with the embedded light-shielding portions 71A embedded in the element separation layers 68 inside the semiconductor substrate 12, it is possible to prevent the leakage of light into the adjacent pixels caused when the incident light is diffracted.

Thus, in the solid-state imaging device 1 according to the first embodiment described above, it is possible to prevent the degradation of color mixture while achieving the pixel structure of the rear surface irradiation type in which the on-chip lenses 74A larger in size than the pixels are formed for every other pixel.

Note that in the pixel structure according to the first embodiment described above, it is also possible to apply so-called pupil correction technology in which the two-dimensional positions of the light-shielding walls 71B and the on-chip lenses 74A are deviated according to the direction of the principal ray of light to correct shading at the peripheral pixels of the pixel array unit 3.

In addition, although the above example describes the case in which the number of the types of opening sizes is two, the number of the types of the opening sizes is not limited to two. For example, it may also be possible to change the opening sizes in multiple stages such that the area ratio (large opening size/small opening size) of the pixels 2 having a large opening size to the pixels 2 having a small opening size approximates one toward the periphery of the pixel array unit 3 to optimize balance in the sensitivity between the pixels while giving consideration to peripheral light reduction due to shading.

4. Method of Manufacturing Pixels According to First Embodiment

Next, a description will be given, with reference to FIGS. 5 to 18, of the method of manufacturing the pixels 2 according to the first embodiment.

Figure 5:
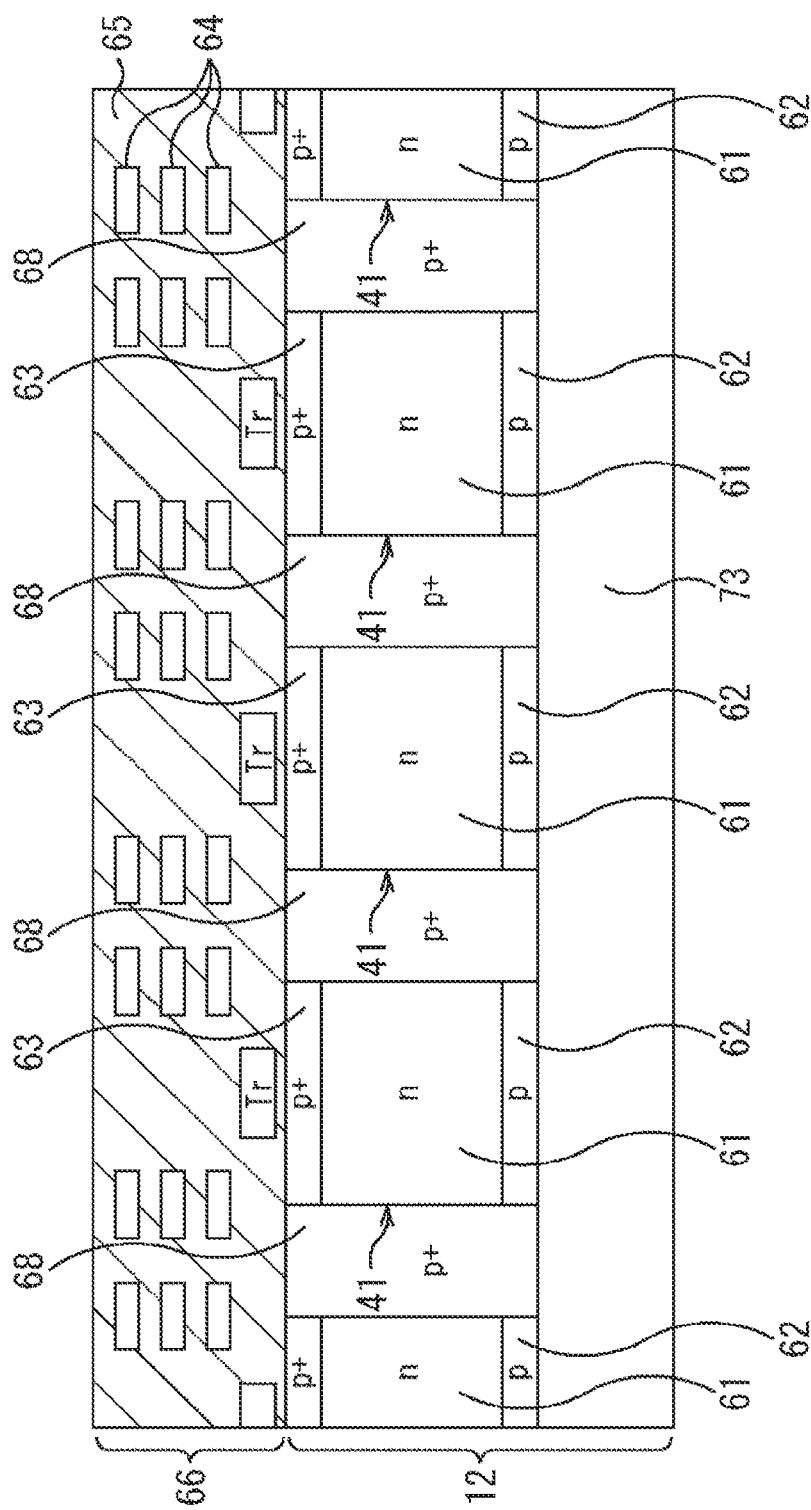
FIG. 5 is a view for describing the method of manufacturing the pixels according to the first embodiment.

First, as shown in FIG. 5, the n-type charge accumulation region 61, the p-type dark current prevention region 62, and p+-type dark current prevention region 63 constituting the photodiode 41 are formed for each of the pixels 2, and the element separation layers 68 are formed inside the semiconductor substrate 12. In addition, on the front surface side of the semiconductor substrate 12, the multilevel wiring layer 66 composed of the plurality of pixel transistors Tr, the plurality of wiring layers 64, and the interlayer insulation film 65 is formed.

Figure 6:
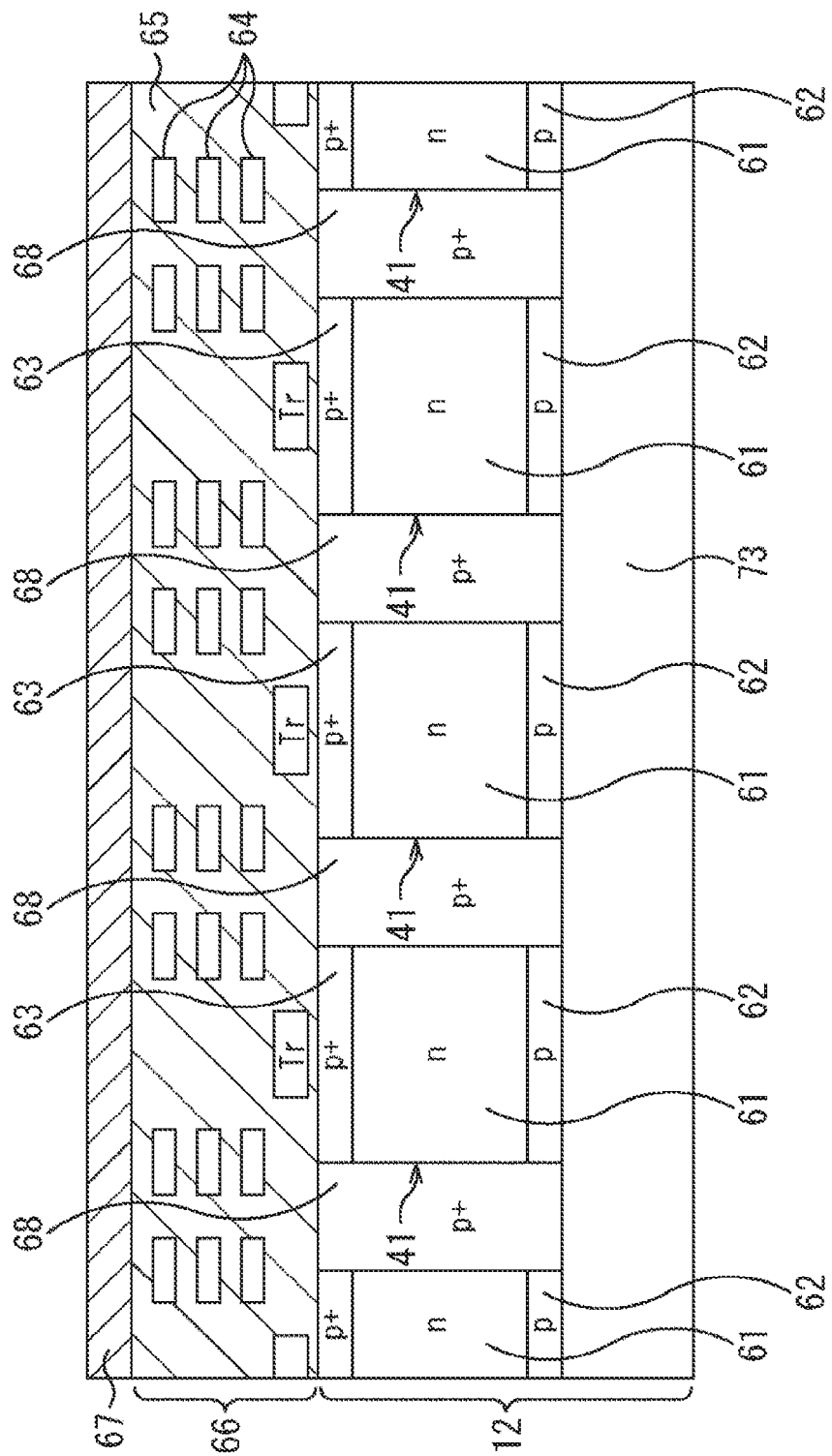
FIG. 6 is a view for describing the method of manufacturing the pixels according to the first embodiment.

Next, as shown in FIG. 6, the support substrate 67 is bonded to the upper portion of the multilevel wiring layer 66 by an organic adhesive or physical bonding using plasma irradiation.

Figure 7:
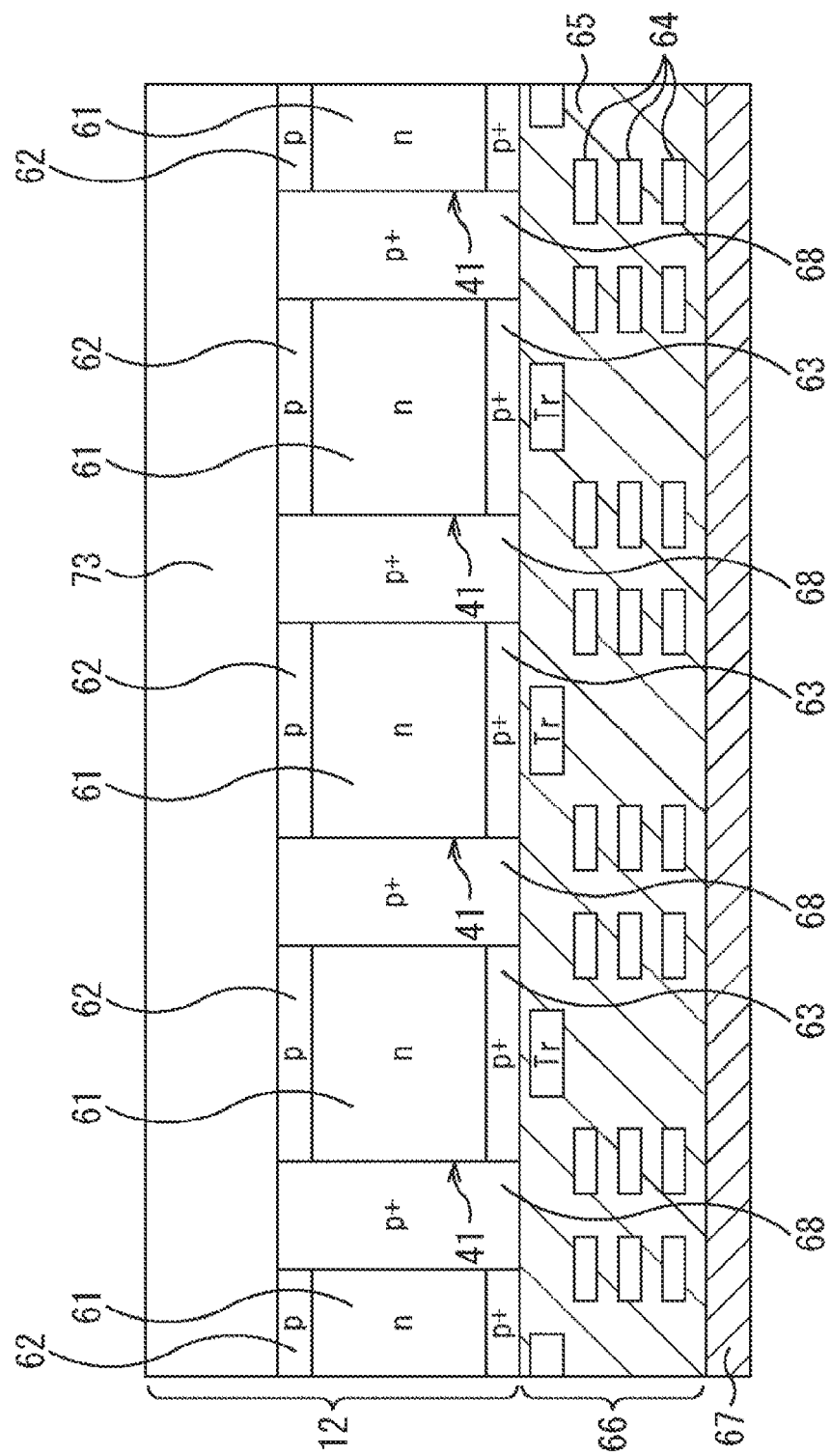
FIG. 7 is a view for describing the method of manufacturing the pixels according to the first embodiment.
Figure 8:
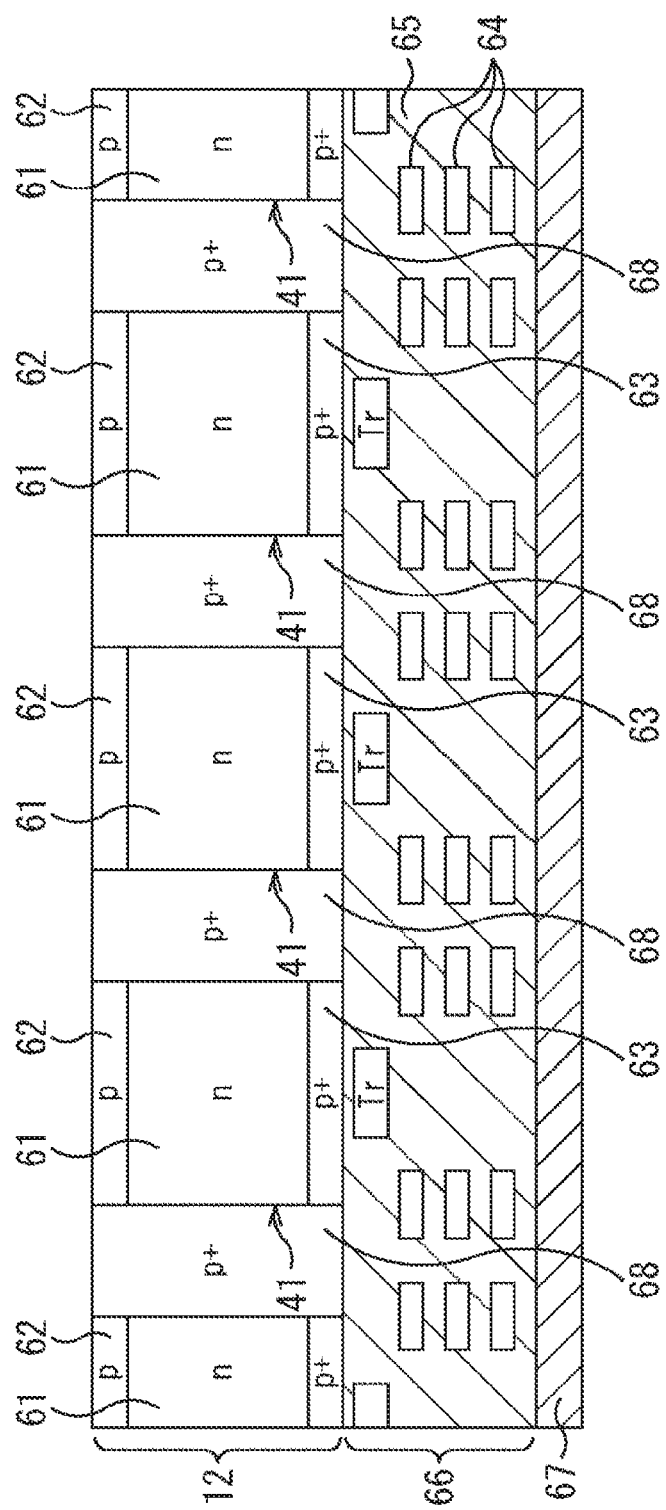
FIG. 8 is a view for describing the method of manufacturing the pixels according to the first embodiment.

Then, after the support substrate 67 and the semiconductor substrate 12 bonded together are entirely turned upside down as shown in FIG. 7, the semiconductor substrate 12 is polished by a physical polishing method until the p-type dark current prevention regions 62 are exposed as shown in FIG. 8.

Figure 9:
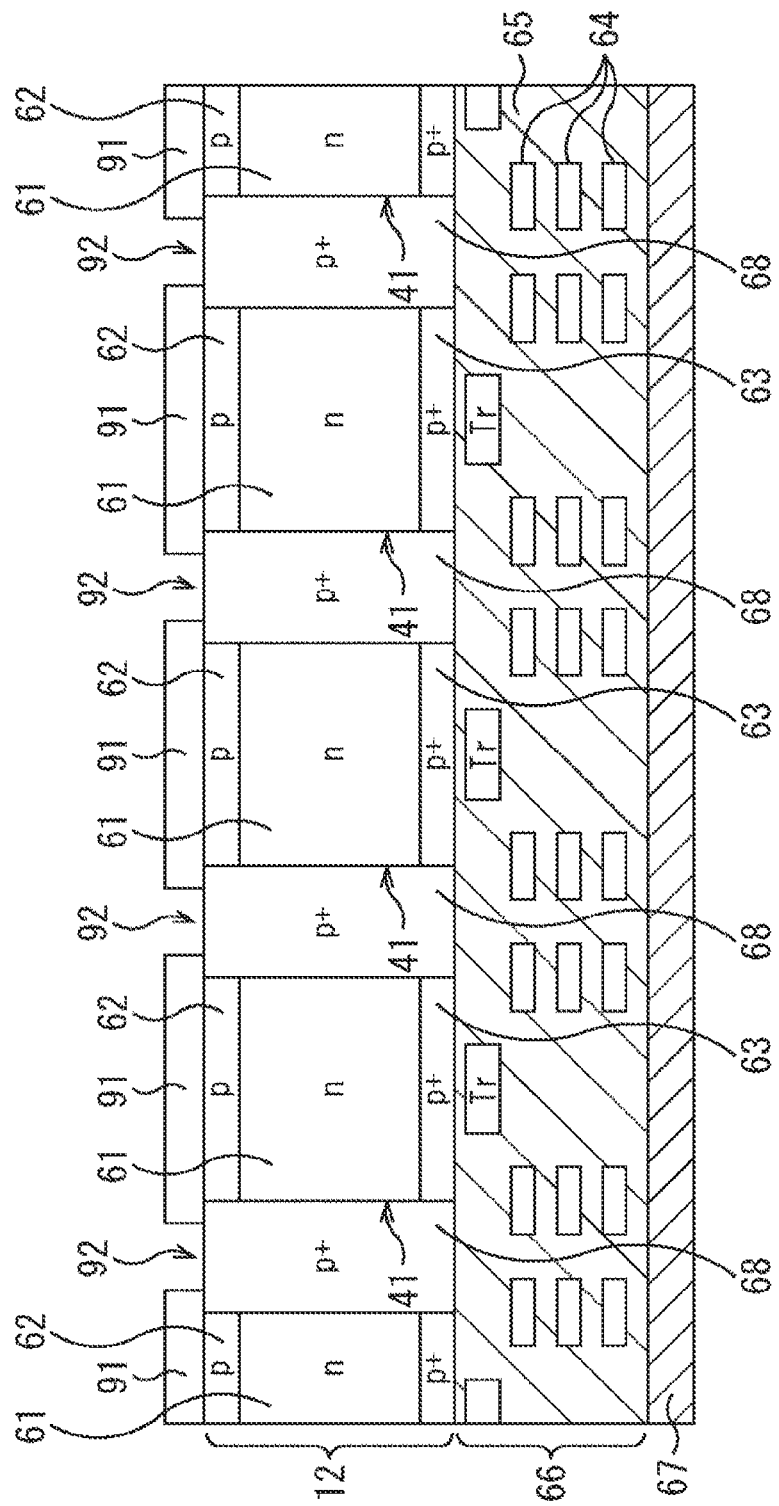
FIG. 9 is a view for describing the method of manufacturing the pixels according to the first embodiment.

Next, as shown in FIG. 9, after a photoresist 91 is formed on the rear surface side of the semiconductor substrate 12, the photoresist 91 is patterned to form opening portions 92 in regions where the embedded light-shielding portions 71 of the element separation layers 68 are to be formed.

Figure 10:
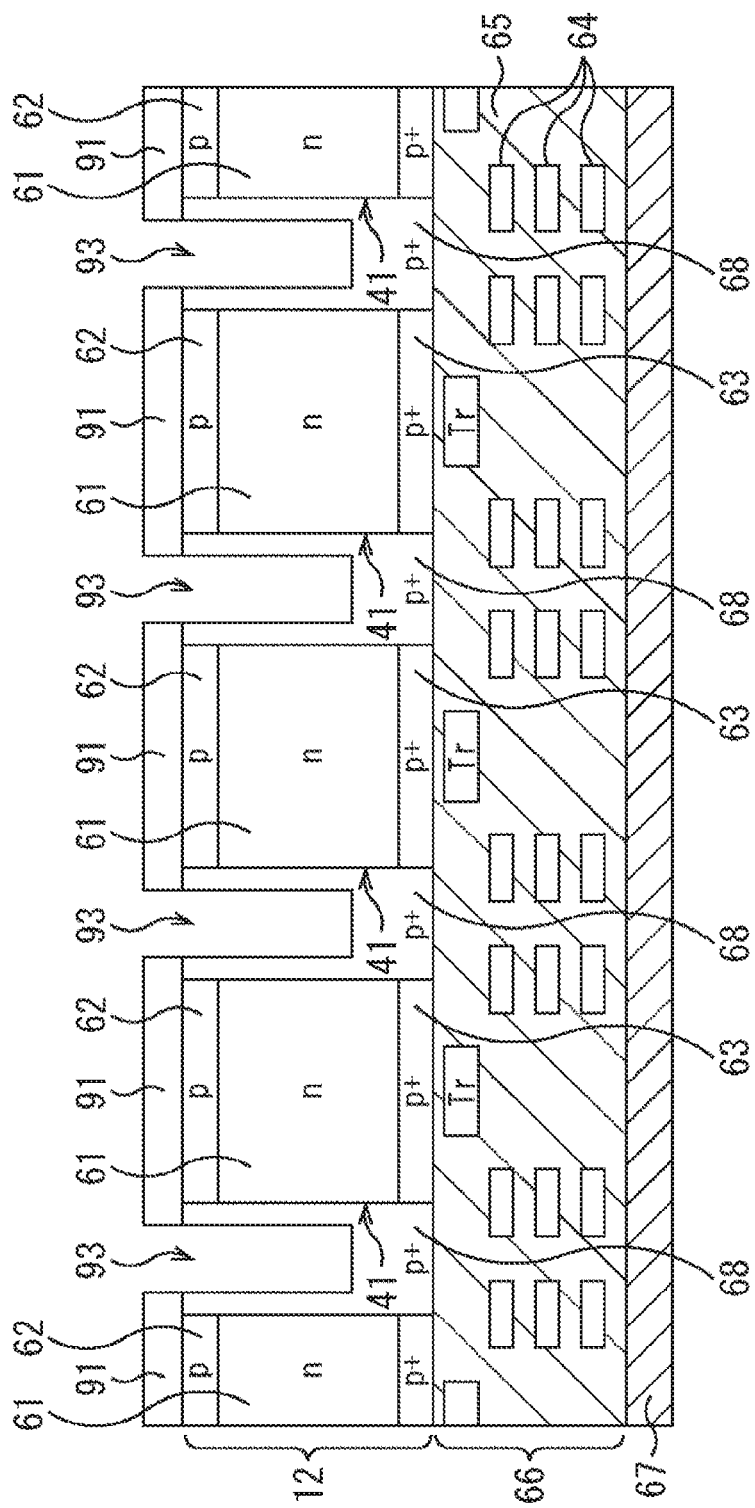
FIG. 10 is a view for describing the method of manufacturing the pixels according to the first embodiment.

Dry etching is performed using the patterned photoresist 91 as a mask, whereby the element separation layers 68 are dug by a desired depth to form the trench portions 93 as shown in FIG. 10. The depth of the trench portions 93 may be formed such that slant light incident from the rear surface side of the semiconductor substrate 12 is allowed to be shielded on the side of the light receiving surface.

Figure 11:
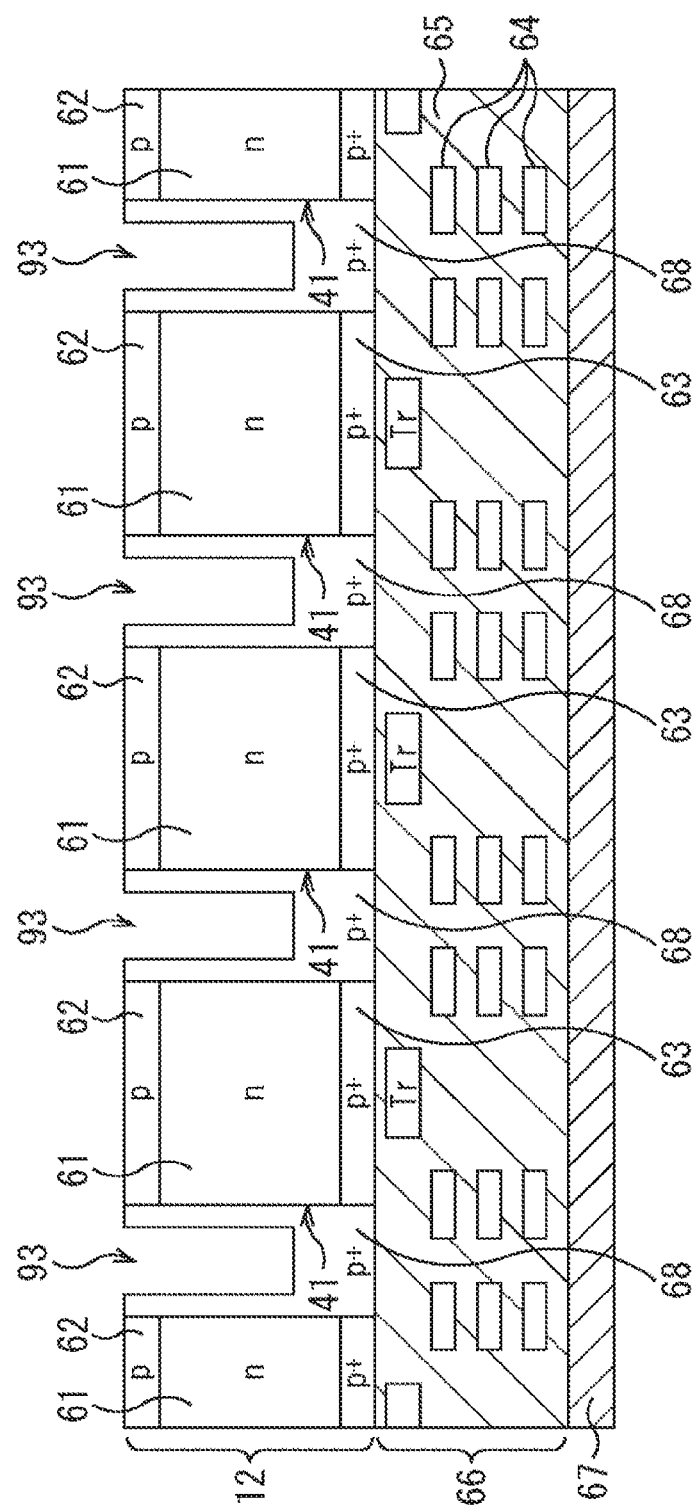
FIG. 11 is a view for describing the method of manufacturing the pixels according to the first embodiment.

After the trenches 93 are formed in the element separation layers 68 of the semiconductor substrate 12, the photoresist 91 is removed as shown in FIG. 11.

Figure 12:
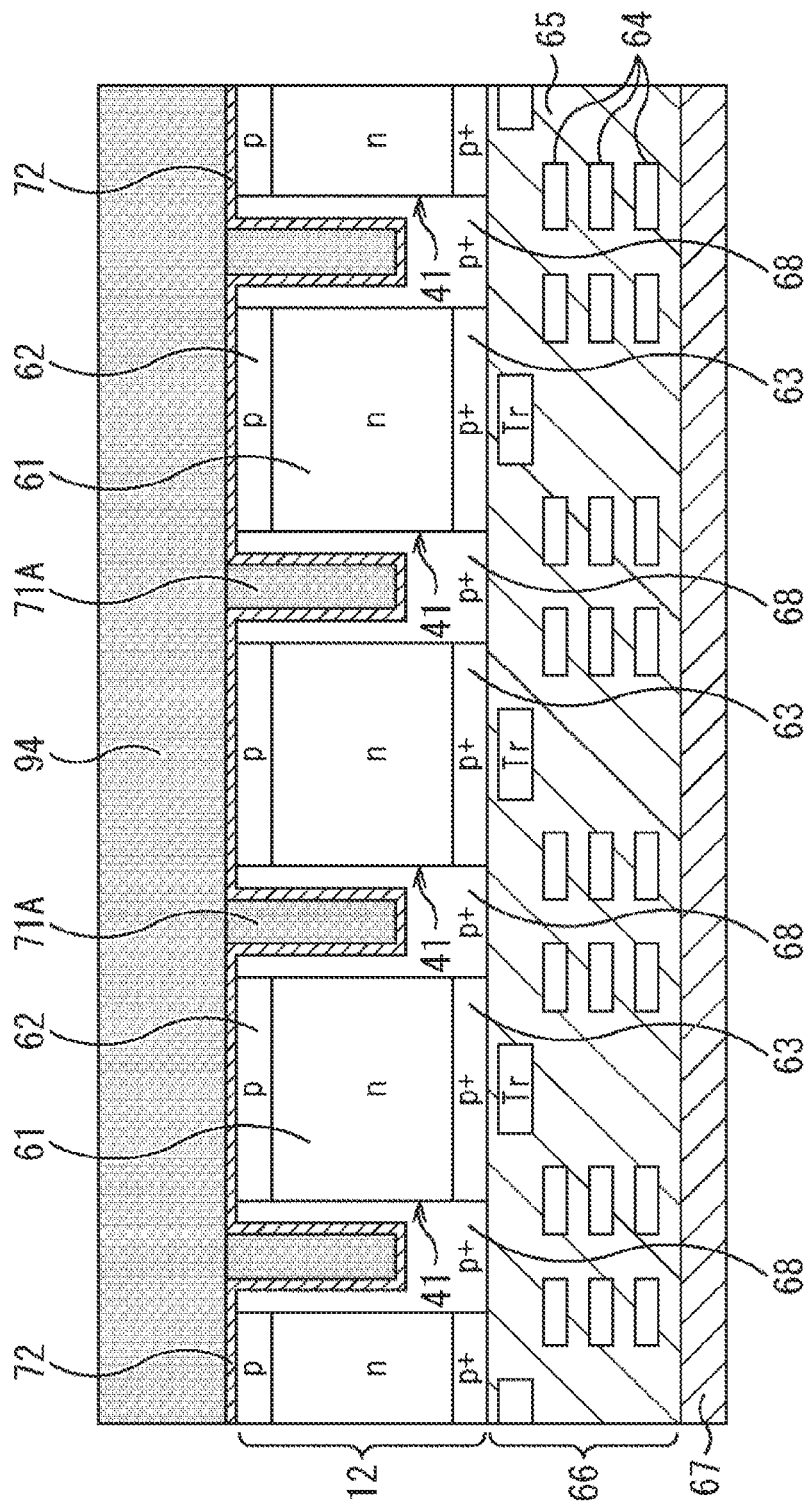
FIG. 12 is a view for describing the method of manufacturing the pixels according to the first embodiment.

After that, as shown in FIG. 12, a light-shielding material 94 such as tungsten is, for example, deposited by a CVD (Chemical Vapor Deposition) method or a PVD (Physical Vapor Deposition) method on the upper surface on the rear surface side of the semiconductor substrate 12 including the trench portions 93.

Then, an etching operation is performed twice on the light-shielding material 94 deposited on the upper surface on the rear surface side of the semiconductor substrate 12, whereby the light-shielding walls 71B each having a triangular cross section are formed.

Figure 13:
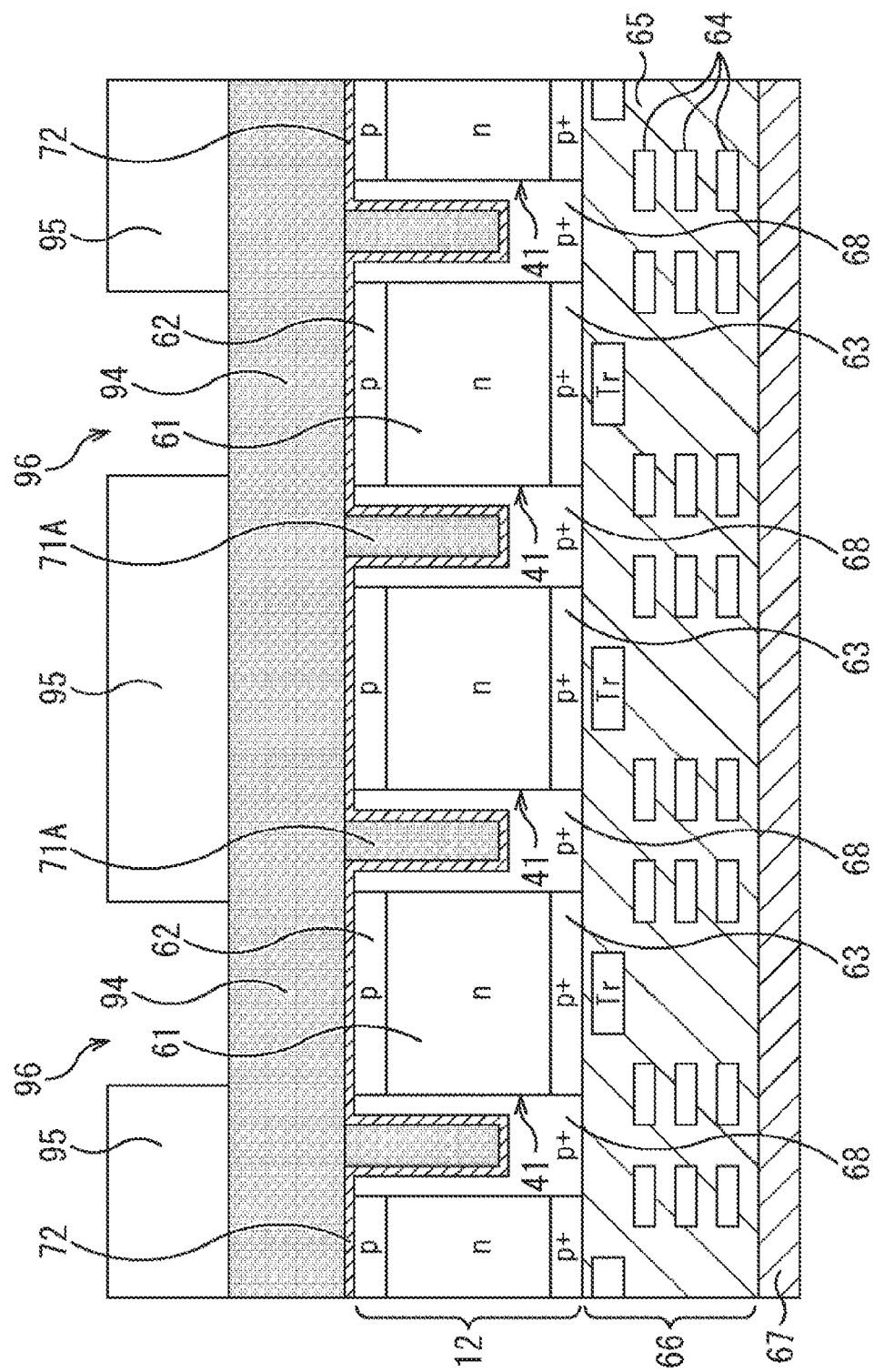
FIG. 13 is a view for describing the method of manufacturing the pixels according to the first embodiment.

Specifically, first, as shown in FIG. 13, a photoresist 95 is formed as the first etching operation on the light-shielding material 94 and patterned to form opening portions 96 in regions where the color filters 73 colored in W are to be formed.

Figure 14:
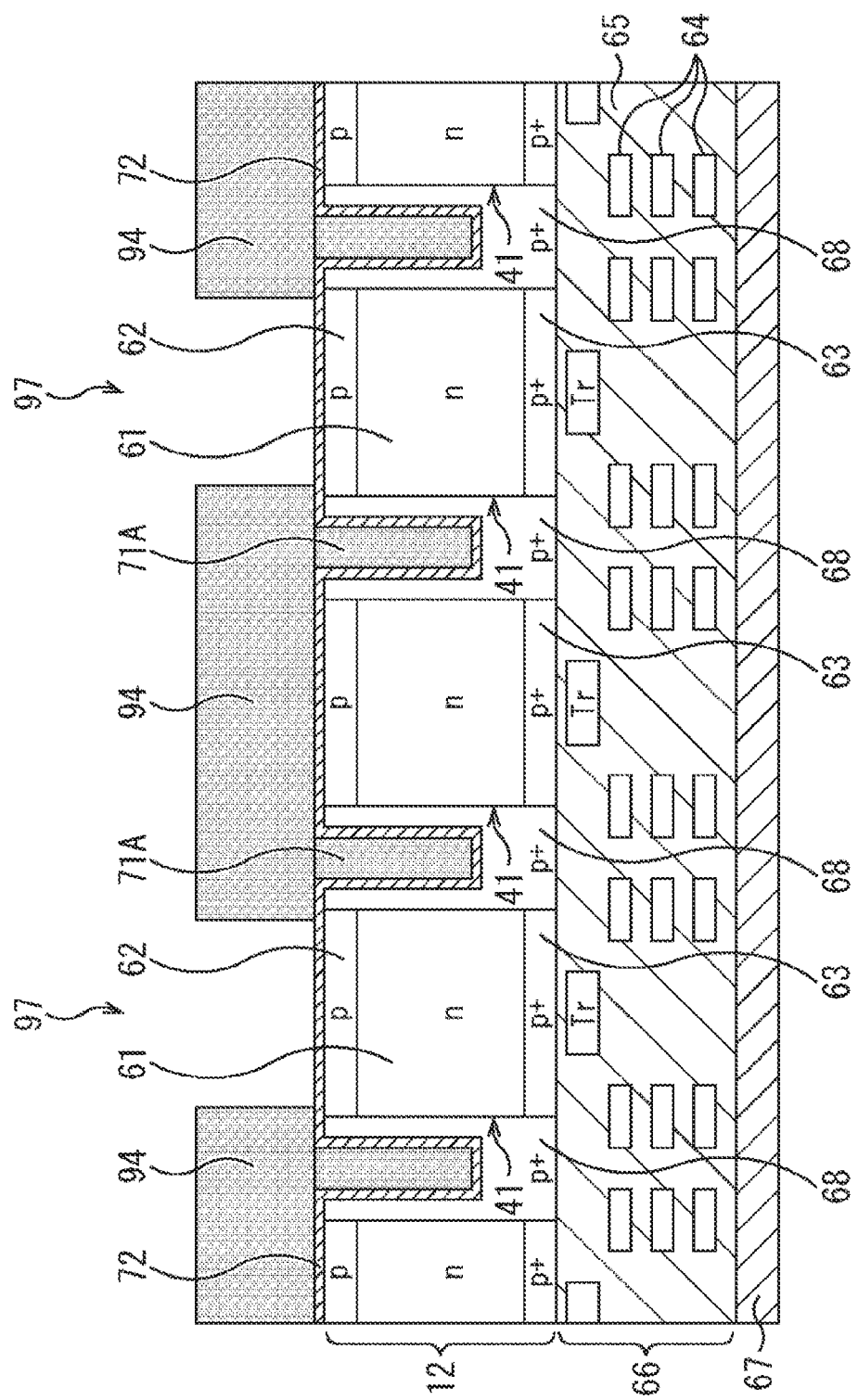
FIG. 14 is a view for describing the method of manufacturing the pixels according to the first embodiment.

Then, as shown in FIG. 14, dry etching is performed using the patterned photoresist 95 as a mask, whereby opening portions 97 are formed corresponding to the regions where the color filters 73 colored in W are to be formed. In the first etching operation, dry etching is performed using, for example, the mixed gas of $SF_6/Cl_2$ to form the vertical cross sections of the light-shielding walls 71B. After that, the photoresist 95 is removed.

Figure 15:
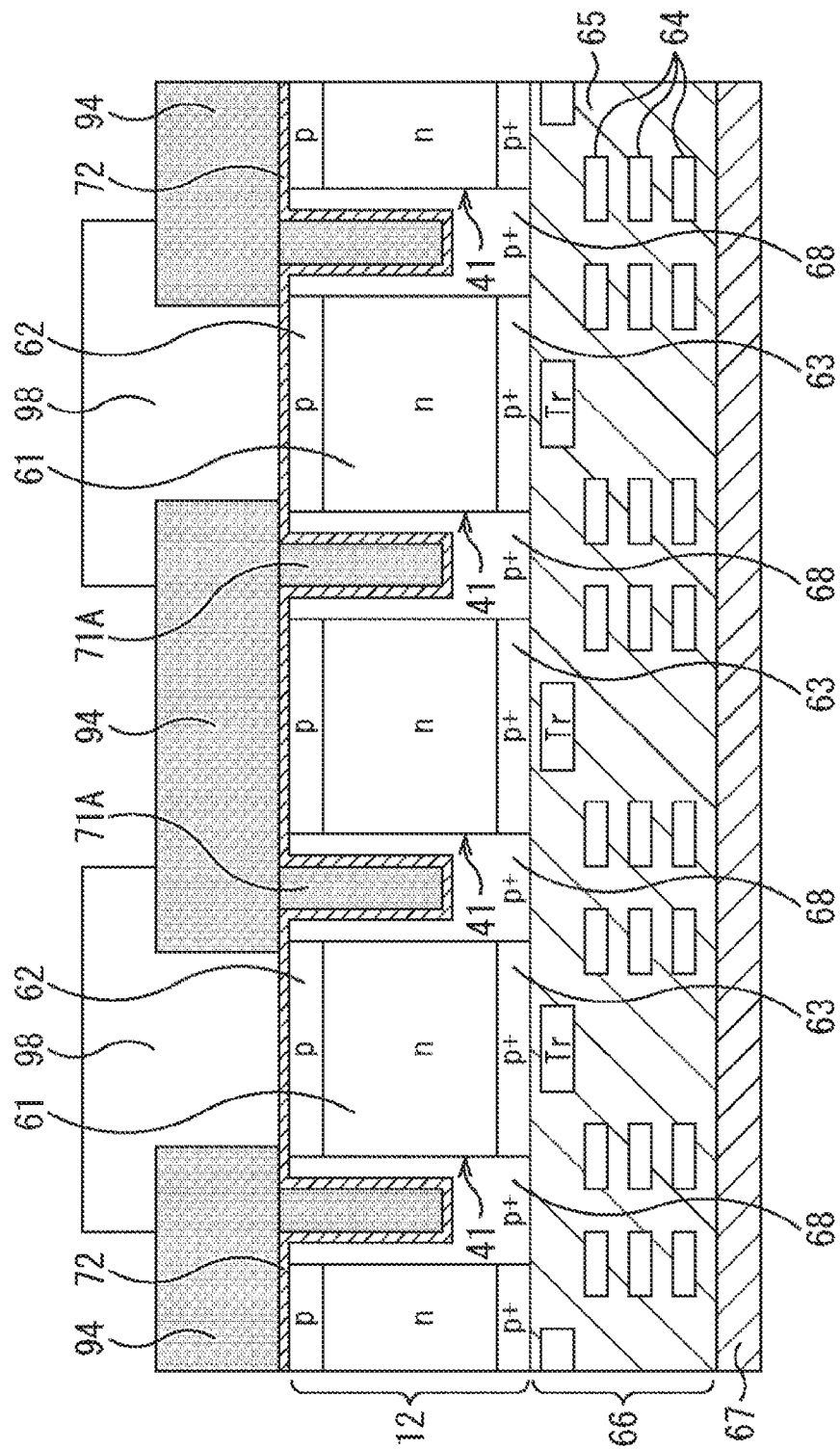
FIG. 15 is a view for describing the method of manufacturing the pixels according to the first embodiment.

Next, in the second etching operation, as shown in FIG. 15, a photoresist 98 having a film thickness larger than the light-shielding material 94 and having a prescribed width about the opening portion 97 where the color filter 73 colored in W is to be formed is patterned.

Figure 16:
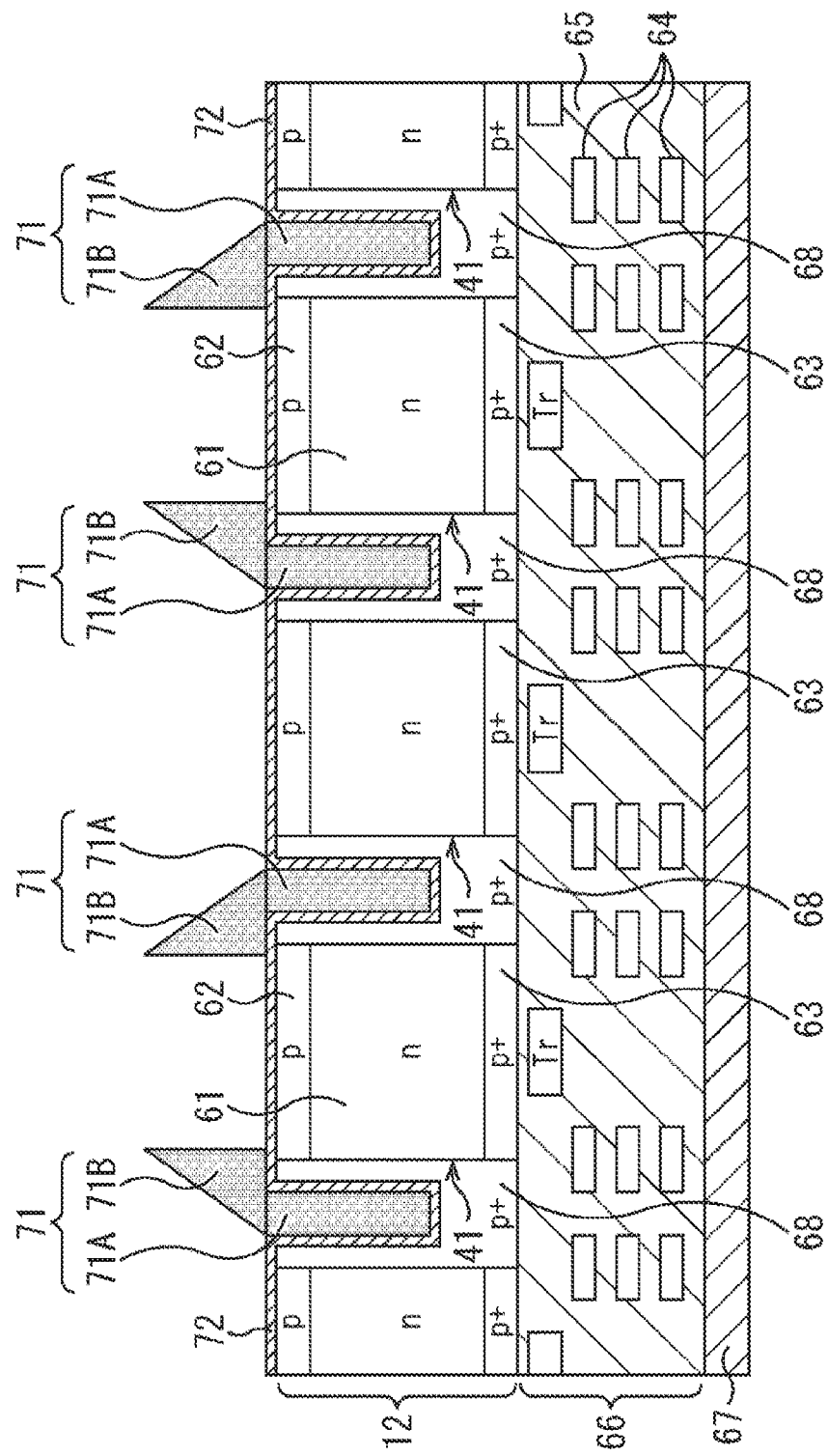
FIG. 16 is a view for describing the method of manufacturing the pixels according to the first embodiment.

Then, dry etching is performed using the patterned photoresist 98 as a mask, whereby the light-shielding material 94 is etched to form the slant surfaces of the light-shielding walls 70B on the side of the RGB pixels as shown in FIG. 16. In the manner described above, the embedded light-shielding portions 71A embedded in the element separation layers 68 and the light-shielding walls 71B formed in the color filter layers 73 are formed. As the etching method of forming a taper angle, it is possible to employ the method of using, for example, the mixed gas of $CF_4/Cl_2$ as etching gas, change the mixing ratio to control a selection ratio with respect to the photoresist 98, and perform an etching operation on the photoresist 95 while moving the photoresist 95 backward.

Figure 17:
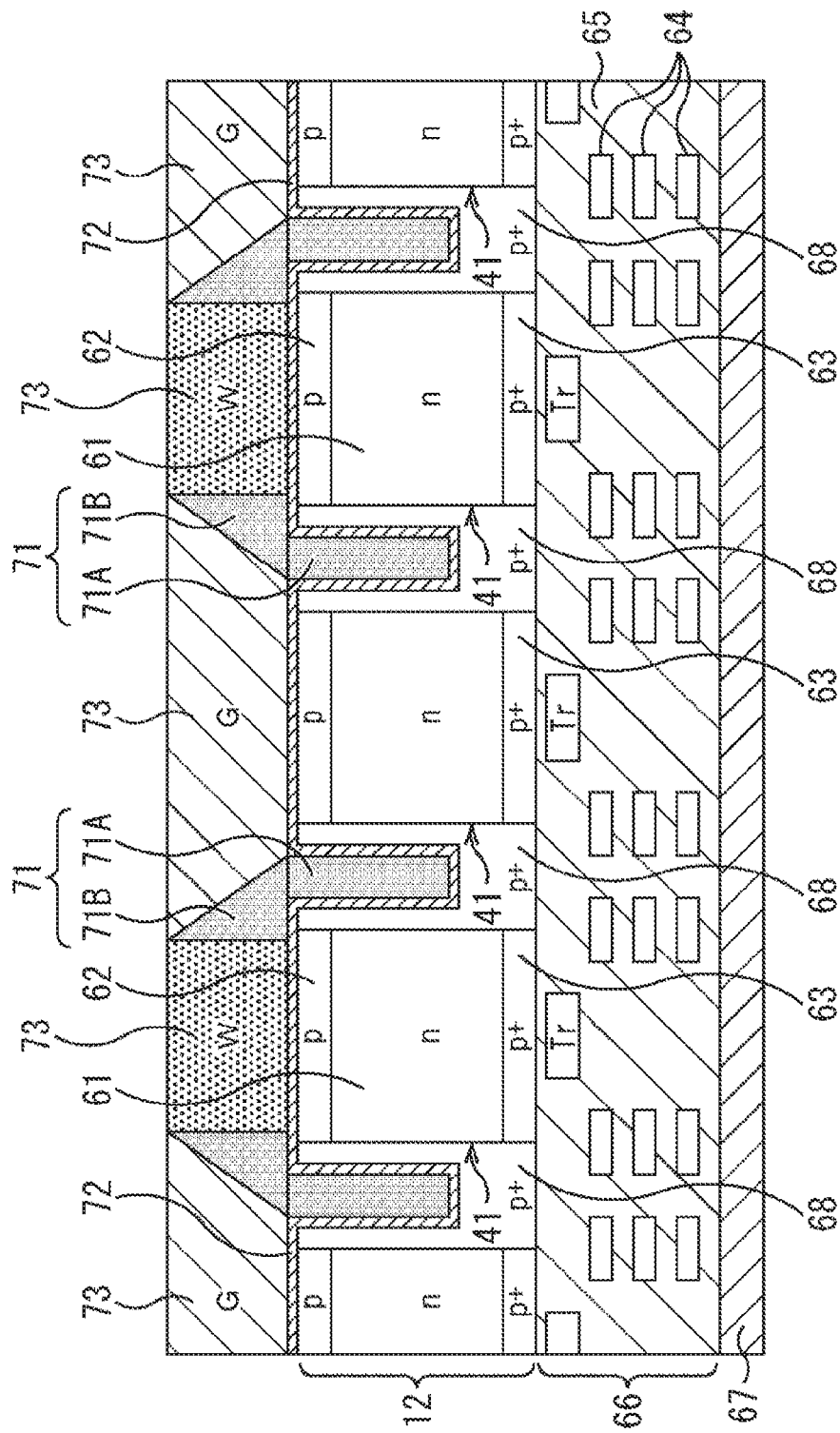
FIG. 17 is a view for describing the method of manufacturing the pixels according to the first embodiment.
Figure 18:
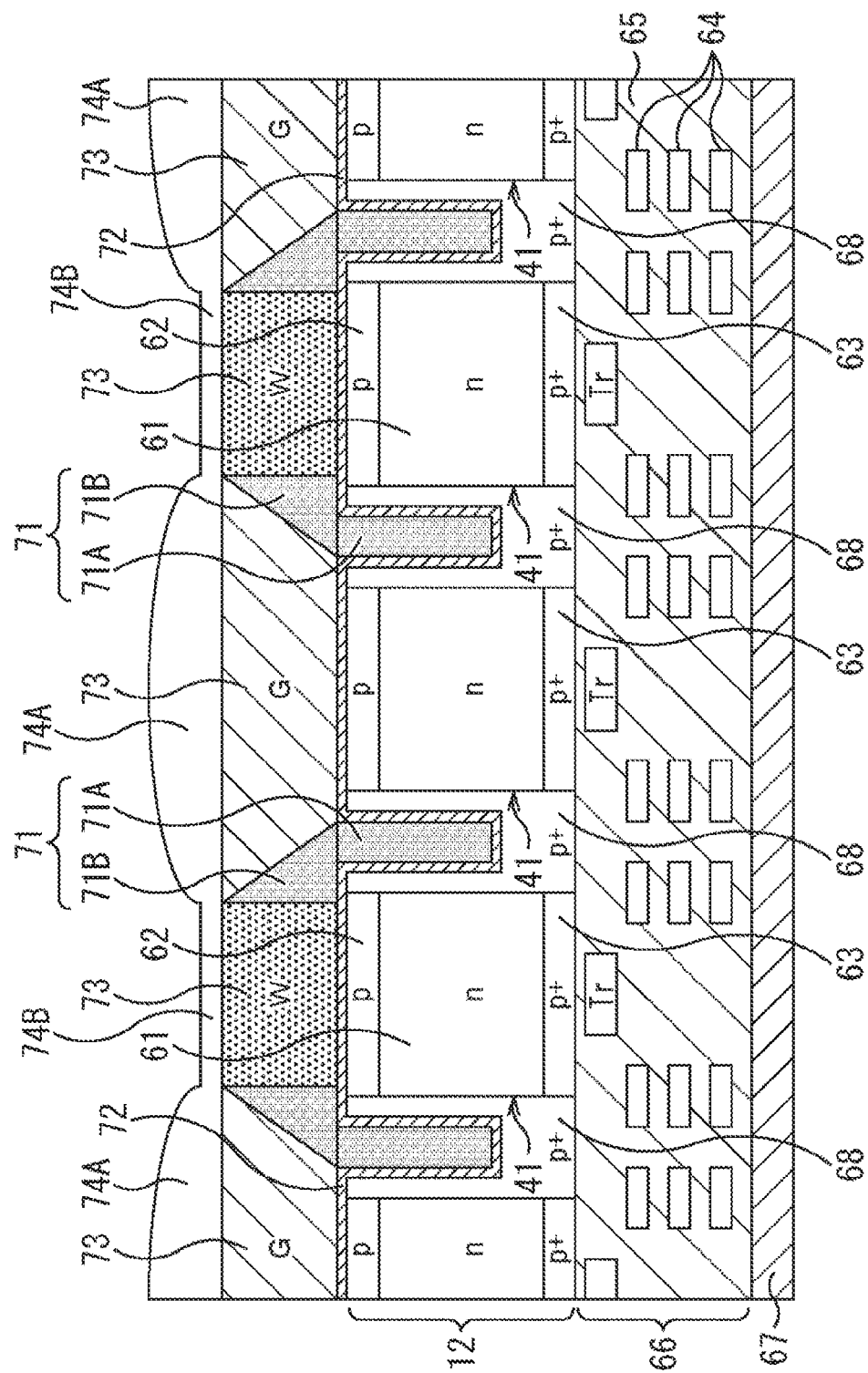
FIG. 18 is a view for describing the method of manufacturing the pixels according to the first embodiment.

Next, the color filter layers 73 are formed as shown in FIG. 17, and then the on-chip lens layer 74 is formed as shown in FIG. 18. Thus, the pixel structure shown in FIG. 3 is completed.

Note that in the example described above, the embedded light-shielding portions 71A and the light-shielding walls 71B of the light-shielding portions 71 are formed at the same time using the same light-shielding material 94. However, the embedded light-shielding portions 71A and the light-shielding walls 71B may be made of different materials. On this occasion, the light-shielding walls 71B may be made of a metal material different from the material of the embedded light-shielding portions 71A or be made of a low refractive index material having a lower refractive index than that of the color filter layers 73.

In the solid-state imaging device 1 according to the first embodiment described above, the W pixels have the transmittance of incident light about three times as large as the RGB pixels. However, as shown in FIG. 4A, since the opening area ratio of the RGB pixels having a large opening to the W pixels having a small opening is about 0.21 time, the W pixels are not first saturated.

Moreover, in the RGB pixels where the light-shielding walls 71B have the slant surface, a slant light component that is reflected by the light-shielding walls 71B and does not reach the photodiodes 41 is more frequently generated than the W pixels where the light-shielding walls 71B have the vertical surface. Therefore, a difference in the sensitivity between the RGB pixels and the W pixels is further reduced, whereby the configuration having an excellent sensitivity balance is achieved.

In addition, with a change in the plane shape of the light-shielding walls 71B from the equilateral octagonal shape shown in FIG. 4B, it is also possible to form any opening area and achieve the optimization of a further sensitivity balance.

5. Second Embodiment of Pixels (Cross-Sectional Configuration View of Pixels)

Figure 19:
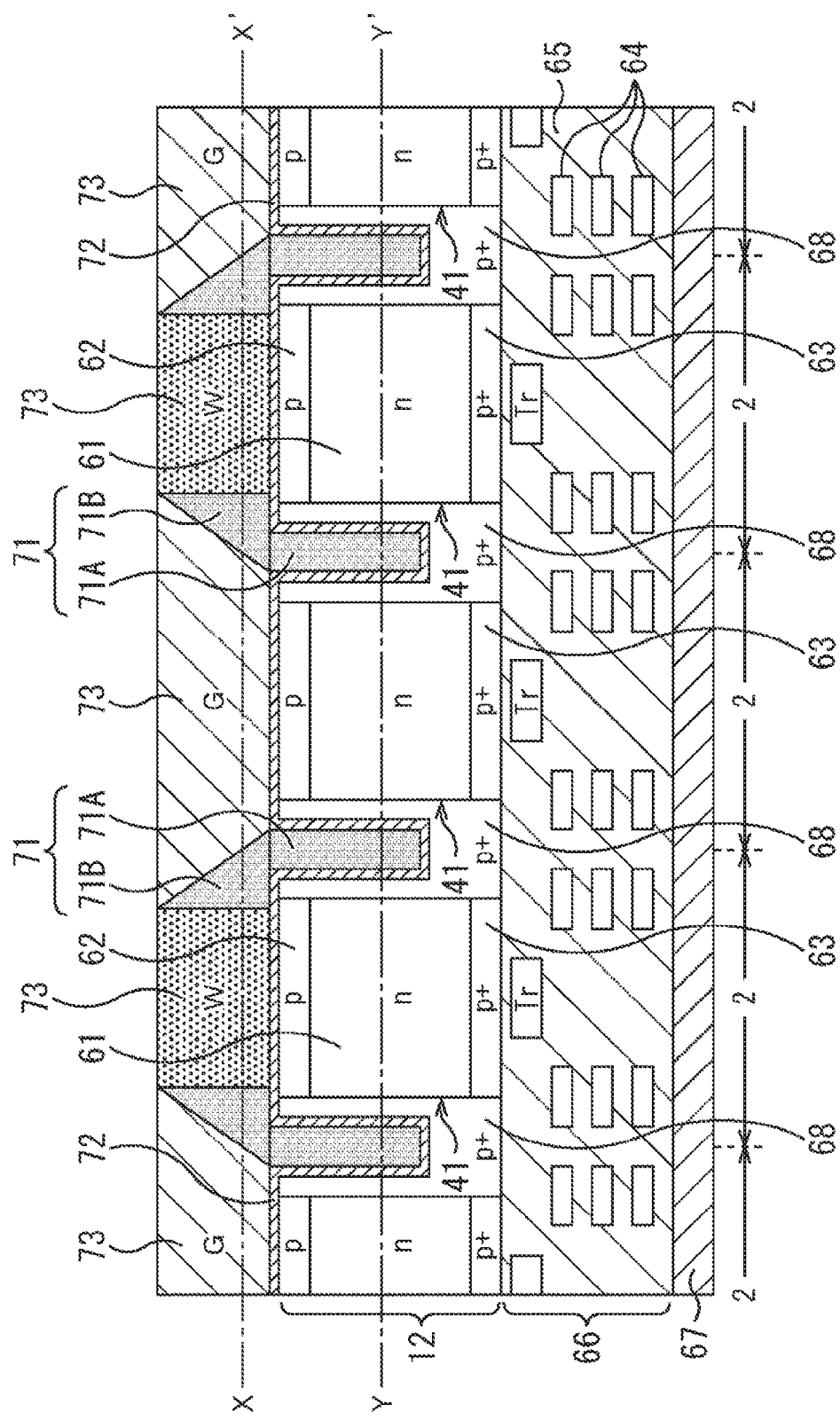
FIG. 19 is a cross-sectional configuration view according to a second embodiment of the pixels.

FIG. 19 is a cross-sectional configuration view according to a second embodiment of the pixels 2.

Note that components corresponding to the components of FIG. 3 according to the first embodiment described above are denoted by the same symbols in FIGS. 19 to 23 and only components different from the components of the pixel structure shown in FIG. 3 will be described.

In comparison with the pixel structure according to the first embodiment, a pixel structure according to the second embodiment shown in FIG. 19 does not have the on-chip lenses 74A provided on the color filter layers 73.

In recent years, since the manufacturing of on-chip lenses has approached its limit to suit to finer pixels, it is difficult to manufacture the on-chip lenses with a desired curvature. Therefore, the configuration without the on-chip lenses 74A as shown in FIG. 19 may solve the problem of such a manufacturing limit of the on-chip lenses. Since the light-shielding walls 71B are made of a material having a lower refractive index than the surrounding color filter layers 73 or a metal material, light condensing efficiency may be sufficiently obtained without the on-chip lenses 74A.

6. Third Embodiment of Pixels
(Cross-Sectional Configuration View of Pixels)

Figure 20:
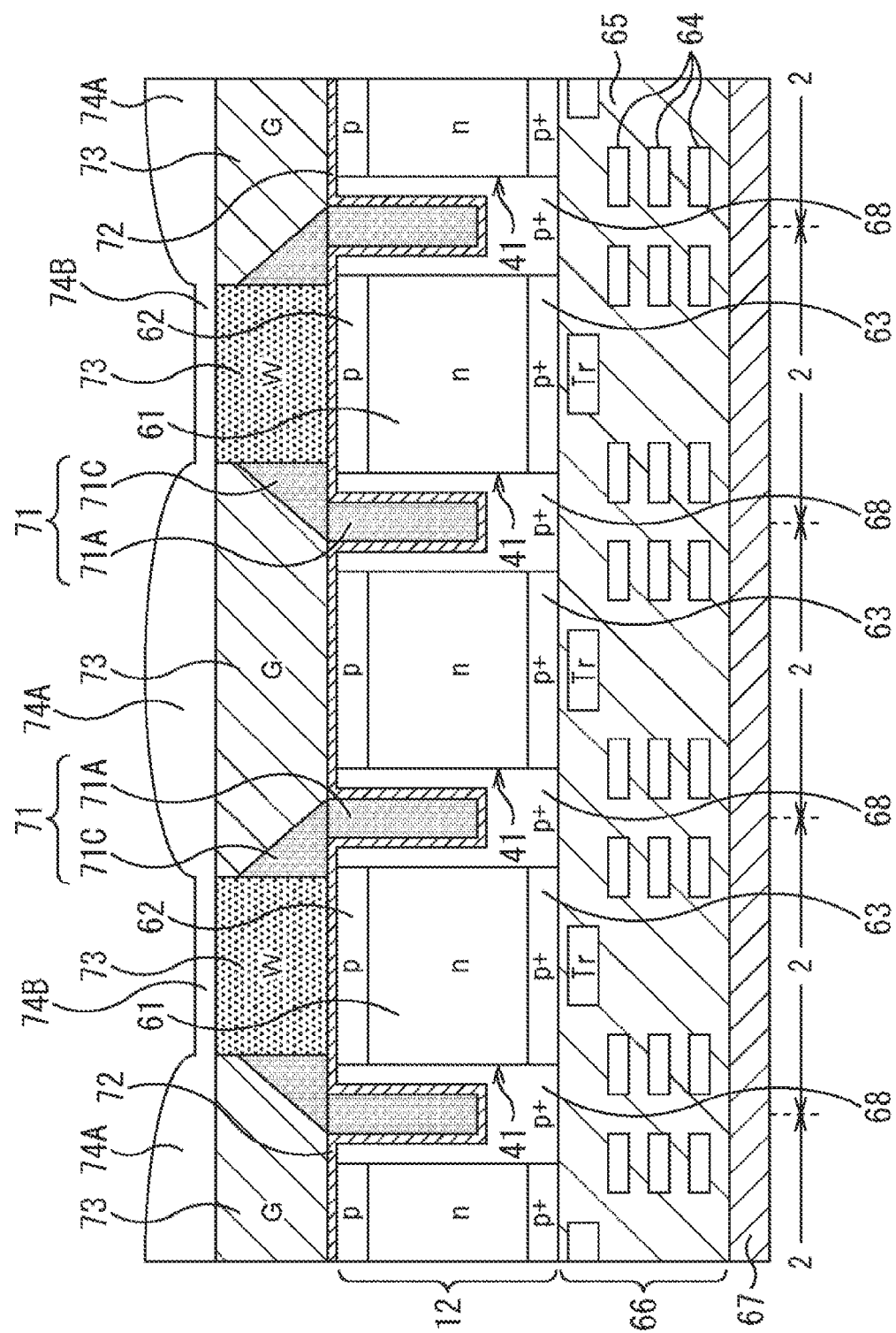
FIG. 20 is a cross-sectional configuration view according to a third embodiment of the pixels.

FIG. 20 is a cross-sectional configuration view according to a third embodiment of the pixels 2.

In the third embodiment shown in FIG. 20, light-shielding walls 71C are formed instead of the light-shielding walls 71B of FIG. 3. A pixel structure according to the third embodiment is different from the pixel structure according to the first embodiment in the height of the triangular shapes of the cross sections of the light-shielding walls 71C.

The height of the light-shielding walls 71C is formed to be lower than that of the light-shielding walls 71B according to the first embodiment, and the upper ends of the light-shielding walls 71C do not reach the upper ends of the color filter layers 73.

The color filter layers 73 desirably have a certain degree of thickness to sufficiently disperse incident light. With such a configuration, the thickness of the color filter layers 73 may be set at a desired level without suffering from a fluctuation in the height of the light-shielding walls 71C. On this occasion, if the light-shielding walls 71C ensure a certain degree of height, the effect of preventing color mixture from the pixels 2 having a large opening to the pixels 2 having a small opening and the effect of preventing the diffraction of incident light at the pixels 2 having a small opening may be satisfactorily maintained when compared with the first embodiment.

7. Fourth Embodiment of Pixels
(Cross-Sectional Configuration View of Pixels)

Figure 21:
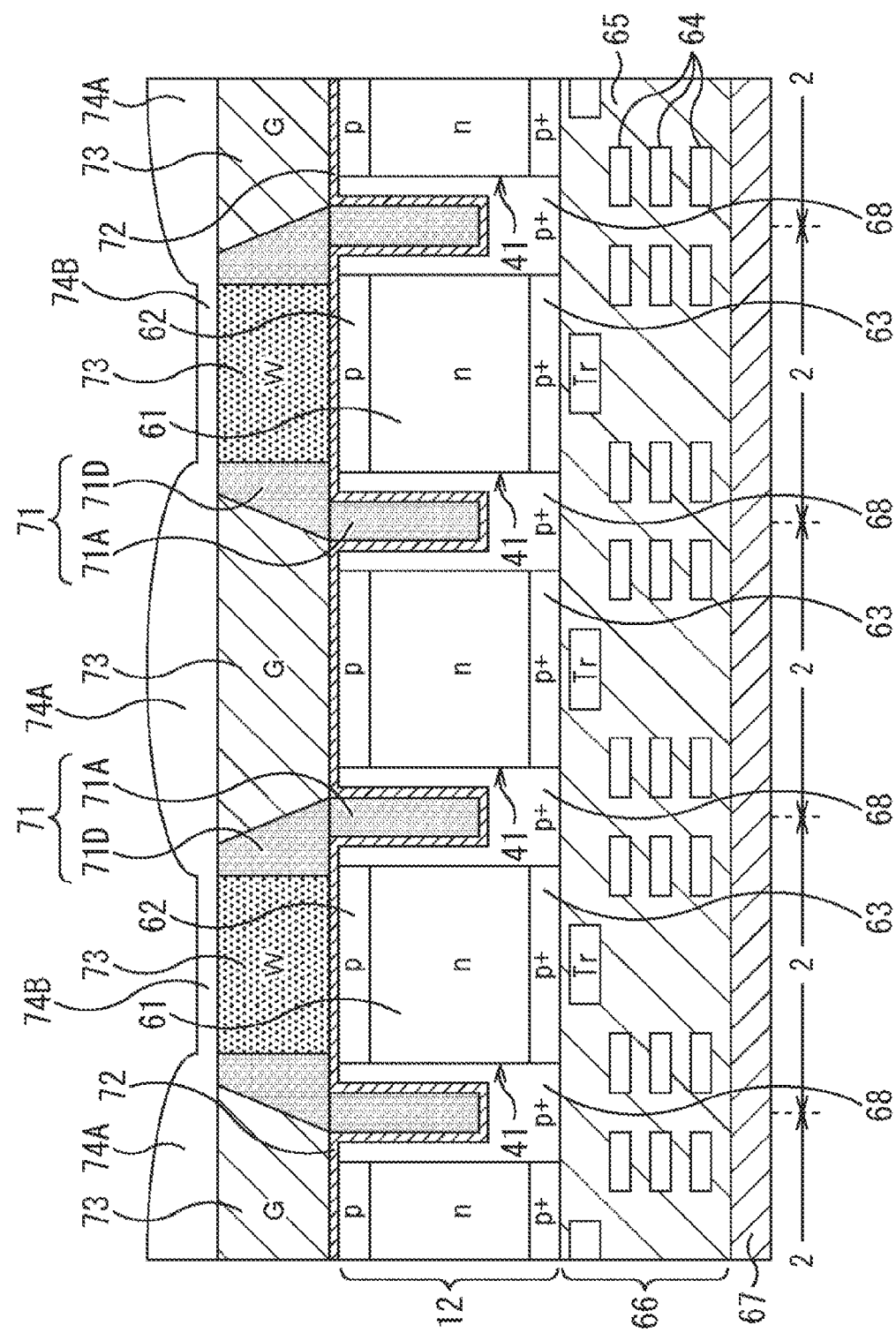
FIG. 21 is a cross-sectional configuration view according to a fourth embodiment of the pixels.

FIG. 21 is a cross-sectional configuration view according to a fourth embodiment of the pixels 2.

In the fourth embodiment shown in FIG. 21, light-shielding walls 71D are formed instead of the light-shielding walls 71B of FIG. 3. A pixel structure according to the fourth embodiment is different from the pixel structure according to the first embodiment in the cross-sectional shape of the light-shielding walls 71D.

While the cross section of the light-shielding walls 71B according to the first embodiment is formed in the triangular shape, the cross section of the light-shielding walls 71D is formed in a trapezoidal shape as shown in FIG. 21.

If the cross section of the light-shielding walls 71D is formed in the trapezoidal shape at the time of forming the light-shielding walls 71D by dry etching, it is possible to form the light-shielding walls 71D without causing a fluctuation in the height of the light-shielding walls 71D. Accordingly, the pixel structure of the fourth embodiment may achieve a robust configuration that is further free from a fluctuation in process.

8. Fifth Embodiment of Pixels
(Cross-Sectional Configuration View of Pixels)

Figure 22:
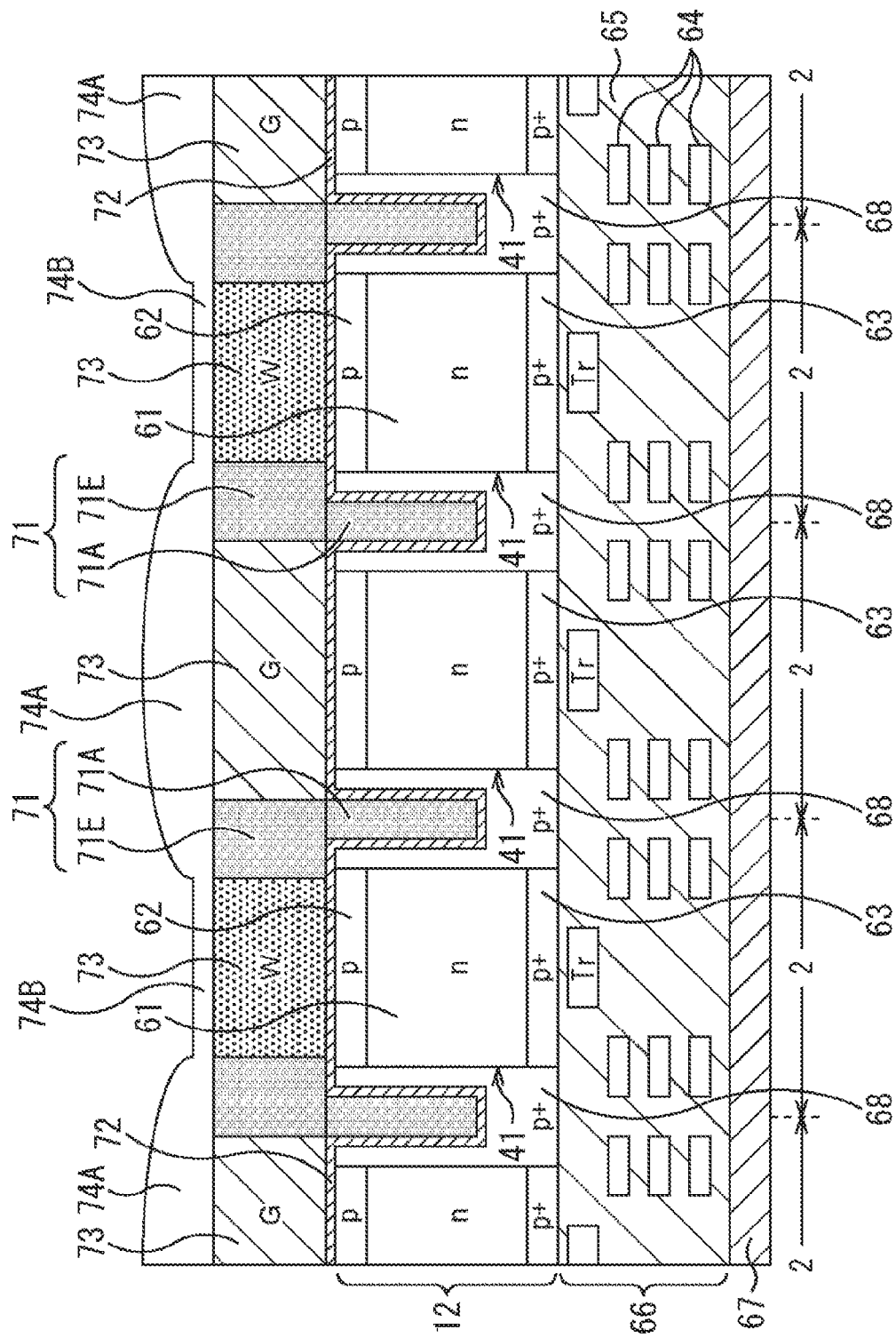
FIG. 22 is a cross-sectional configuration view according to a fifth embodiment of the pixels.

FIG. 22 is a cross-sectional configuration view according to a fifth embodiment of the pixels 2.

In the fifth embodiment shown in FIG. 22, light-shielding walls 71E are formed instead of the light-shielding walls 71B of FIG. 3. A pixel structure according to the fifth embodiment is different from the pixel structure according to the first embodiment in the cross-sectional shape of the light-shielding walls 71E.

While the cross section of the light-shielding walls 71B according to the first embodiment is formed in the triangular shape, the cross section of the light-shielding walls 71E is formed in a square shape whose side wall on the side of the RGB pixel having a large opening is also vertical as shown in FIG. 22.

Although the effect of increasing sensitivity at the pixels 2 having a large opening is not produced, it becomes easy to arbitrarily adjust the opening areas of the pixels 2 having a small opening with the protrusion amount of the light-shielding walls 71E. Thus, it becomes easy to adjust a difference in the sensitivity between the W pixels and the RGB pixels and perform adjustment to prevent the W pixels from being saturated earlier than the RGB pixels. In addition, since both side walls (vertical surfaces) of the light-shielding walls 71E may be etched in a lump, it is possible to manufacture the pixels at a lower cost when compared with the first embodiment.

9. Sixth Embodiment of Pixels
(Cross-Sectional Configuration View of Pixels)

Figure 23:
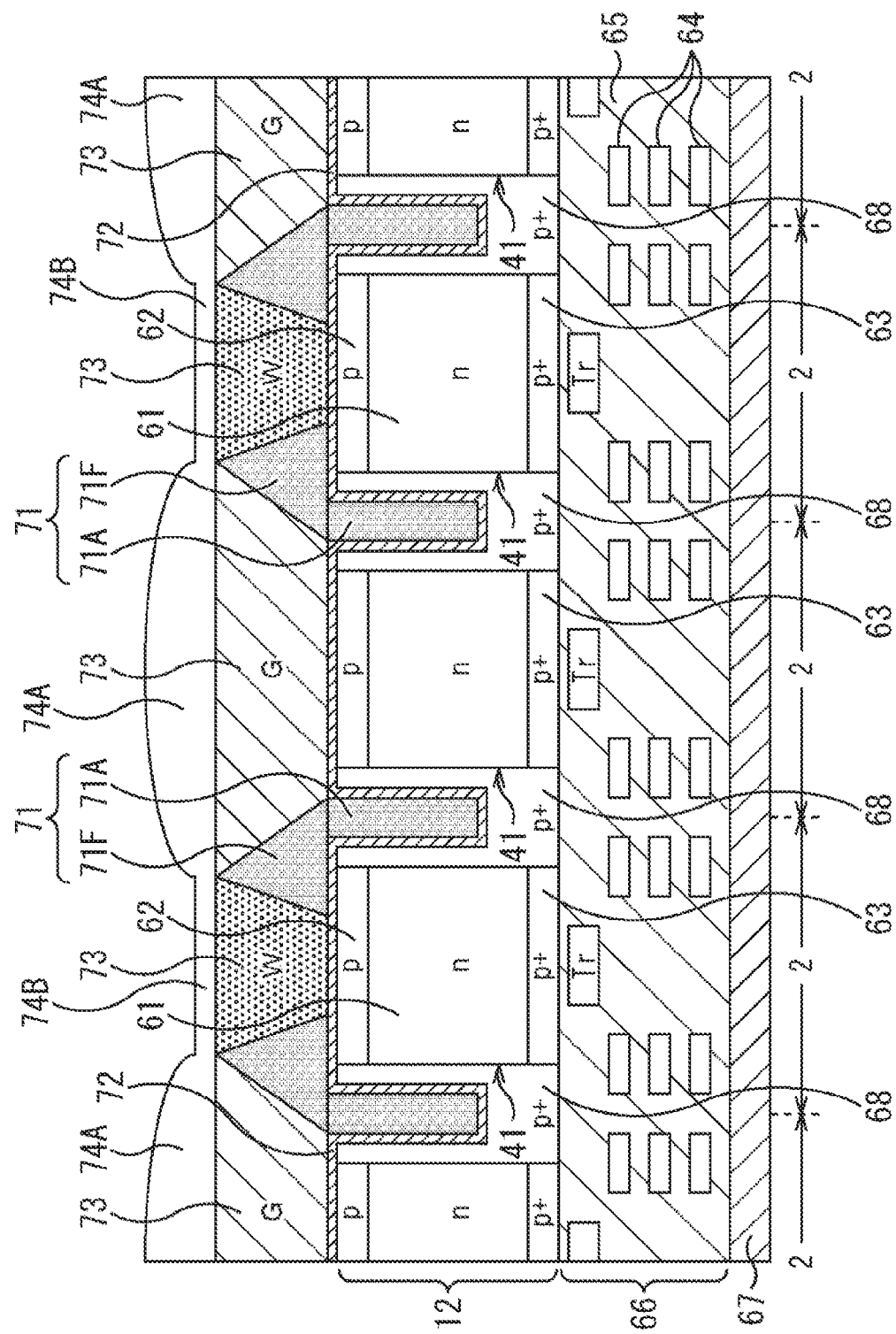
FIG. 23 is a cross-sectional configuration view according to a sixth embodiment of the pixels.

FIG. 23 is a cross-sectional configuration view according to a sixth embodiment of the pixels 2.

In the sixth embodiment shown in FIG. 23, light-shielding walls 71F are formed instead of the light-shielding walls 71B of FIG. 3. A pixel structure according to the sixth embodiment is different from the pixel structure according to the first embodiment in the cross-sectional shape of the light-shielding walls 71F.

While the cross section of the light-shielding walls 71B according to the first embodiment is formed in the vertical triangular shape whose side wall on the side of the pixel having a small opening is vertical, the cross section of the light-shielding walls 71F is formed in a triangular shape whose side walls on both sides of the RGB pixel having a large opening and the W pixel having a small opening are slant surfaces as shown in FIG. 23.

With such a configuration, it is possible to adjust sensitivity at the W pixels having a small opening and provide any difference in the sensitivity between the W pixels having a small opening and the RGB pixels having a large opening. In addition, when the slant surfaces of both the side walls are formed to be different in angle from each other, two etching operations are desirably performed. However, since both the side walls may be processed in a lump if they are formed to be the same in angle each other, the pixels may be manufactured at a lower cost.

10. Other Arrangement Examples of Color Filters

Next, a description will be given, with reference to FIGS. 24 to 27, of other arrangement examples of the colors of the color filters 73.

In the example described above, the color filters 73 colored in R, G, or B are arranged at the pixels 2 having a large opening and the color filters 73 colored in W are arranged at the pixels 2 having a small opening as shown in FIG. 4A.

The first method of arranging the color filters 73 shown in FIG. 4A is an arrangement method that gives priority to a dynamic range and sensitivity.

Figure 24:
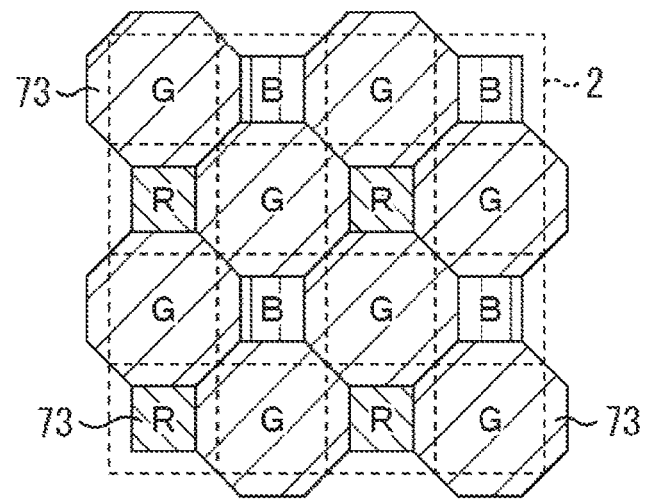
FIG. 24 is a view showing another arrangement example of color filters.

FIG. 24 is a plan view showing a second method of arranging the color filters 73.

According to the second method of arranging the color filters 73, the color filters 73 colored in G are arranged at all the pixels 2 having a large opening and the color filters 73 colored in R or B are arranged at the pixels 2 having a small opening.

In recent years, the manufacturing of finer pixels has been accelerated with an increase in the number of pixels and a reduction in the sizes of sensors in the field of digital still cameras or the like, and thus concerns are rising that brightness S/N ratio and color S/N ratio reduce. As a countermeasure for addressing the reduction in brightness S/N ratio and color S/N ratio, it is effective to increase the sensitivity of G pixels identified by human eyes with high resolution and apply a low-pass filter to R pixels and B pixels identified by human eyes with low resolution to reduce noise. Accordingly, the second method of arranging the color filters 73 shown in FIG. 24 is an arrangement method that contributes to the improvement in brightness S/N ratio and color S/N ratio.

Figure 25:
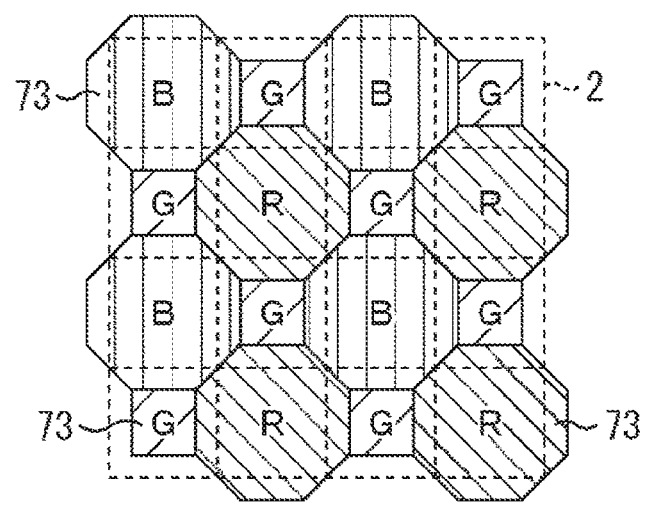
FIG. 25 is a view showing another arrangement example of the color filters.

FIG. 25 is a plan view showing a third method of arranging the color filters 73.

According to the third method of arranging the color filters 73, the color filters 73 colored in R or B are arranged at the pixels 2 having a large opening and the color filters 73 colored in G are arranged at the pixels 2 having a small opening.

It is likely that scanners and copiers having a light source attach importance to color reproducibility and color S/N ratio since brightness S/N ratio is sufficiently ensured by the light source. In such an application, the third arrangement method shown in FIG. 25 is effective.

Figure 26:
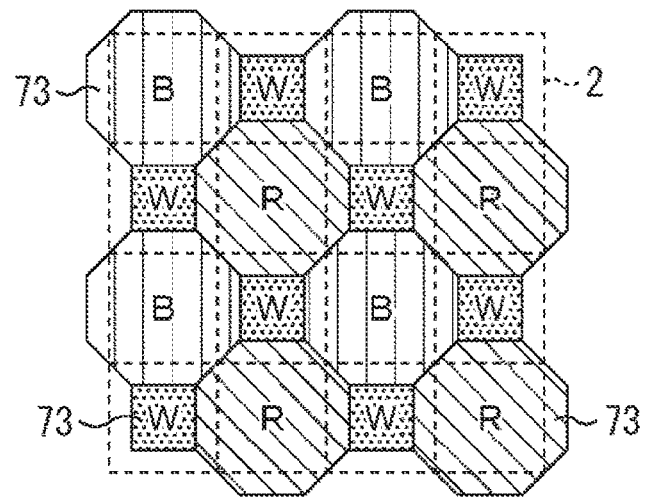
FIG. 26 is a view showing another arrangement example of the color filters.

FIG. 26 is a plan view showing a fourth method of arranging the color filters 73.

According to the fourth method of arranging the color filters 73, the color filters 73 colored in R or B are arranged at the pixels 2 having a large opening and the color filters 73 colored in W are arranged at the pixels 2 having a small opening.

As in the third arrangement method shown in FIG. 25, color S/N ratio may be improved according to such an arrangement method. In addition, the arrangement method produces the effect of improving brightness S/N ratio with the arrangement of W pixels instead of G pixels. Note that a G signal in the W pixels may be found by interpolation from pixels adjacent to the W pixels.

Figure 27:
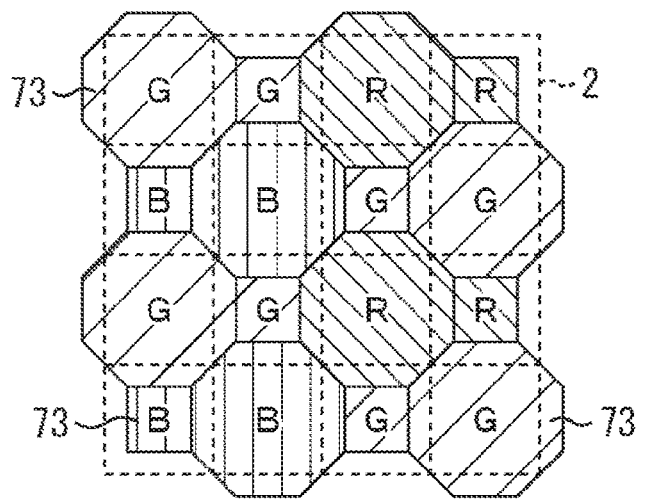
FIG. 27 is a view showing another arrangement example of the color filters.

FIG. 27 is a plan view showing a fifth method of arranging the color filters 73.

According to the fifth method of arranging the color filters 73, the color filters 73 colored in R, G, or B are arranged at all the pixels 2 having a large opening and all the pixels 2 having a small opening. However, the color filters 73 colored in R, G, or B are arranged such that the color filters 73 at the pixels 2 having a large opening and the adjacent color filters 73 at the pixels 2 having a small opening are the same in color.

According to such arrangement methods, high-sensitivity pixels and high dynamic-range pixels may be used for different purposes.

As described above, the first to fifth arrangement methods may be arbitrarily selected as the method of arranging the color filters 73 of the solid-state imaging device 1. In this regard, the same applies to other embodiments that will be described below.

According to the first to sixth embodiments of the pixels 2 described above, the leakage of light into the adjacent pixels due to the diffraction of the incident light may be prevented by the embedded light-shielding portions 71A embedded in the element separation layers 68 inside the semiconductor substrate 12.

In addition, by the light-shielding walls 71B to 71F arranged between the color filters 73 colored in R, G, B, or W, slant light incident on the on-chip lenses 74A may be incident on the photodiodes 41 in the same pixels without being leaked.

Accordingly, the degradation of color mixture may be prevented in the pixel structure of the rear surface irradiation type in which the on-chip lenses 74A larger in size than the pixels 2 are formed for every other pixel.

Next, the still other embodiments of the pixels 2 of the solid-state imaging device 1 will be described.

Prior to the descriptions of the embodiments, a description will be given, with reference to FIG. 28, of the problems to be solved by the technology of the present disclosure again.

Figure 28:
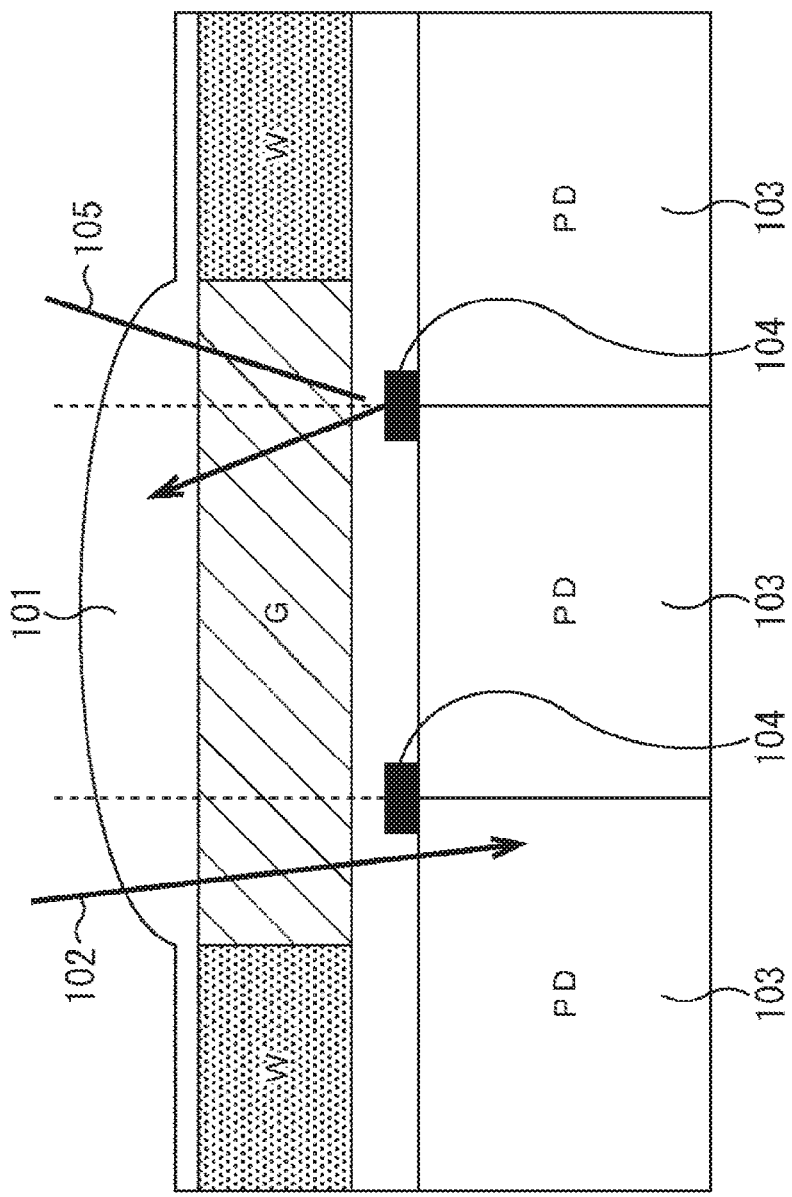
FIG. 28 is a view for describing problems to be solved by the technology of the present disclosure.

FIG. 28 is a schematic cross-sectional configuration view showing a pixel structure in a case in which the pixel structure of the front-surface irradiation type in which on-chip lenses larger in size than pixels are formed for every other pixel is applied to a rear-surface irradiation type.

In the case in which the pixel structure of the front-surface irradiation type in which the on-chip lenses larger in size than the pixels are formed for every other pixel is applied to the rear-surface irradiation type, incident light 102 passing through the peripheral portions of on-chip lenses 101 larger in size than pixels is not incident on expected central photodiodes 103 but is incident on unexpected left photodiodes 103, which causes color mixture.

In addition, a large vignetting component is generated when incident light 105 is reflected by inter-pixel light-shielding films 104 provided at the boundary portions between the pixels, which reduces sensitivity.

In view of these problems, the present disclosure may prevent the degradation of color mixture and a reduction in sensitivity in the pixel structure of the rear-surface irradiation type in which the on-chip lenses larger in size than the pixels are formed for every other pixel.

11. Seventh Embodiment of Pixels (Cross-Sectional Configuration View of Pixels)

Figure 29:
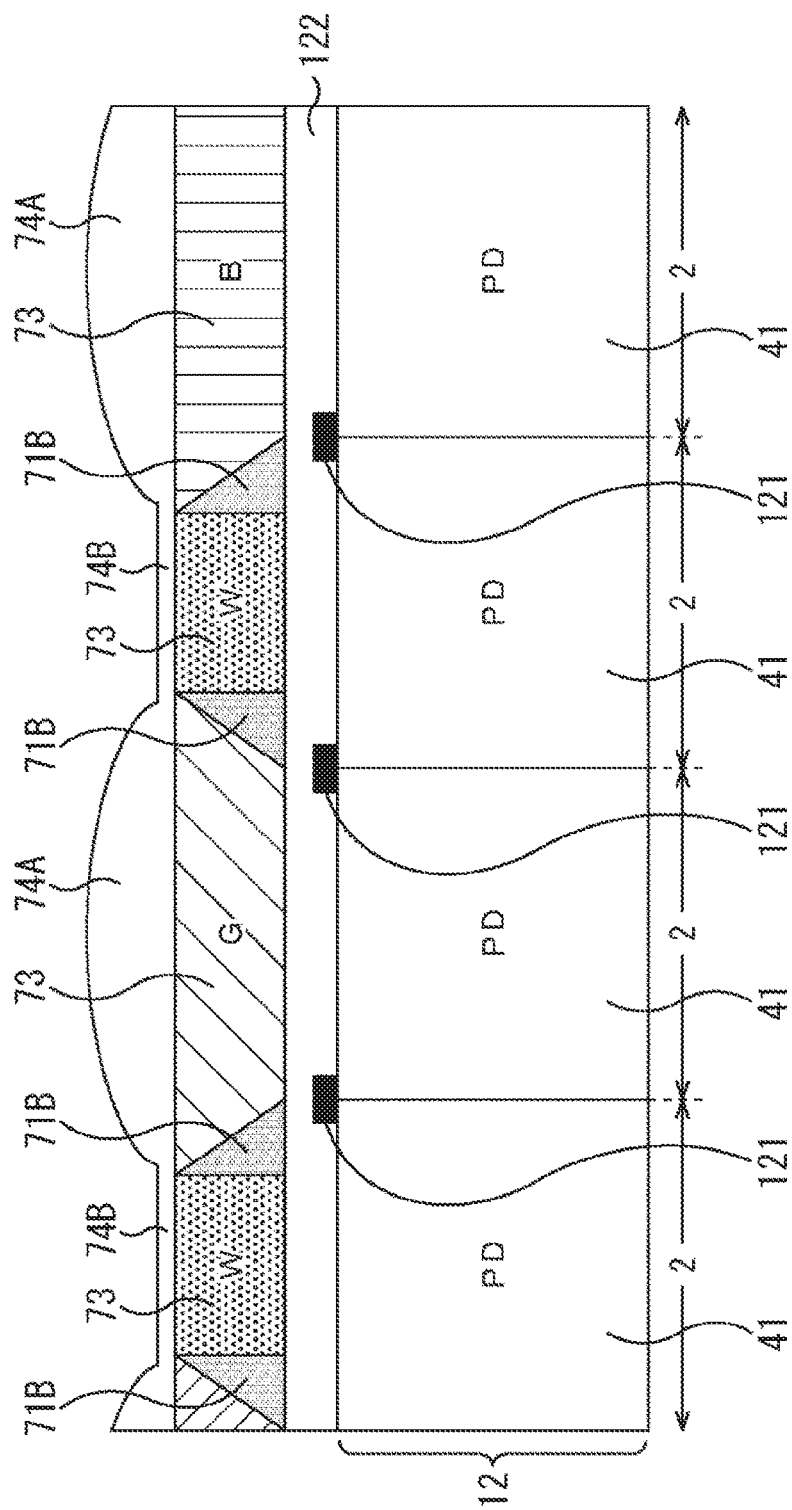
FIG. 29 is a cross-sectional configuration view according to a seventh embodiment of the pixels.

FIG. 29 is a cross-sectional configuration view according to a seventh embodiment of the pixels 2.

Note that components corresponding to the components of FIG. 3 according to the first embodiment described above are denoted by the same symbols in FIG. 29 and only components different from the components of the pixel structure shown in FIG. 3 will be described.

According to the seventh embodiment, the photodiodes 41 are formed on a pixel-by-pixel basis inside the semiconductor substrate 12 as shown in FIG. 29. Each of the photodiodes 41 is shown in such a way that the charge accumulation region 61 and the dark current prevention regions 62 and 63 shown in FIG. 3 are simplified.

In addition, the seventh embodiment of FIG. 29 does not have the embedded light-shielding portions 71A of FIG. 3 and omits the illustration of the element separation layers 68. Moreover, the seventh embodiment also omits the illustrations of the multilevel wiring layer 66 and the support substrate 67 formed on the front surface side of the semiconductor substrate 12.

At pixel boundaries on the upper surface on the rear surface side of the semiconductor substrate 12, inter-pixel light-shielding films 121 are formed to prevent the leakage of incident light into the adjacent pixels 2. The inter-pixel light-shielding films 121 may be metal films made of, for example, tungsten, aluminum, copper, or the like.

On the upper surface on the rear surface side of the semiconductor substrate 12 including the inter-pixel light-shielding films 121, a flattened film 122 is formed. The flattened film 122 is formed by, for example, coating an organic material such as a resin by rotation. Alternatively, the flattened film 122 may be formed by, for example, depositing an inorganic transparent film made of $SiO_2$ or the like and then flattening the same with CMP (Chemical Mechanical Polishing).

Note that an anti-reflection film made of an oxide film or the like may be formed between the flattened film 122 and the semiconductor substrate 12.

As in the first embodiment of FIG. 3, the color filter layers 73 and the light-shielding walls 71B are formed on the upper surface of the flattened film 122, and the on-chip lenses 74A and the on-chip lens flattened layers 74B are further formed on the color filter layers 73 and the light-shielding walls 71B.

Note that in the example of FIG. 29, the color filters 73 colored in W are arranged at all the pixels 2 having a small opening and the color filters 73 colored in R, G, and B are arranged sideways in a row at the pixels 2 having a large opening as the method of arranging the colors of the color filter layers 73. The arrangement method is not limited to this, but any of the arrangement methods shown in FIG. 4A and FIGS. 24 to 27 may be employed.

In a pixel structure according to the seventh embodiment configured as described above, the light-shielding walls 71B are made of a low refractive index material or a metal material. Further, at the pixels 2 where the on-chip lenses 74A are present, the side walls of the light-shielding walls 71B are formed in slant surfaces such that the color filters 73 have an opening made larger toward the upper layers thereof close to the on-chip lenses 74A. On the other hand, at the pixels 2 where the on-chip lenses 74A are absent, the side walls of the light-shielding walls 71B are formed in vertical surfaces.

Figure 30:
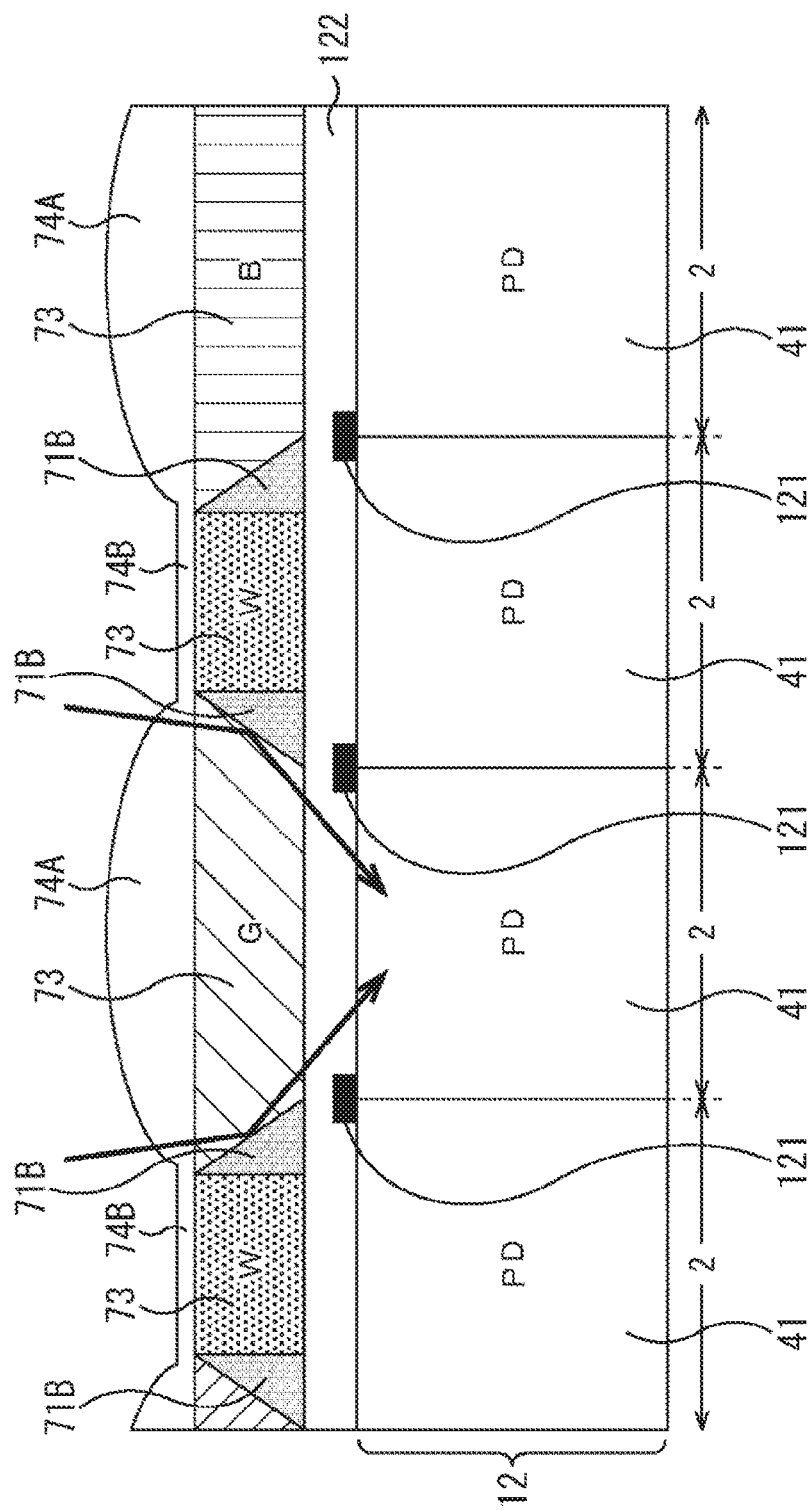
FIG. 30 is a view for describing the effect of the pixels according to the seventh embodiment.

Thus, as indicated by arrows in FIG. 30, incident light is entirely reflected by the slant surfaces of the light-shielding walls 71B at the pixels 2 where the on-chip lenses 74A are present, which makes it possible to prevent vignetting caused by the light-shielding walls 71B themselves and increase light condensing efficiency. In addition, since incident light is reflected by the light-shielding walls 71B, it is possible to prevent vignetting caused by the inter-pixel light-shielding films 121.

On the other hand, at the pixels 2 where the on-chip lenses 74A are absent, the side walls of the light-shielding walls 71B are not tapered but are formed in the vertical surfaces, whereby the openings at the lower surfaces of the color filters 73 are made the same in size as the openings at the upper surfaces thereof.

Accordingly, even in the pixel structure of the rear-surface irradiation type in which the distance between the on-chip lenses 74A and the photodiodes 41 is short, it is possible to prevent color mixture from the pixels 2 where the on-chip lenses 74A are present to the pixels 2 where the on-chip lenses 74A are absent.

That is, in the solid-state imaging device 1 according to the seventh embodiment, the degradation of color mixture may be prevented in the pixel structure of the rear-surface irradiation type in which the on-chip lenses larger in size than the pixels are formed for every other pixel.

Figure 31:
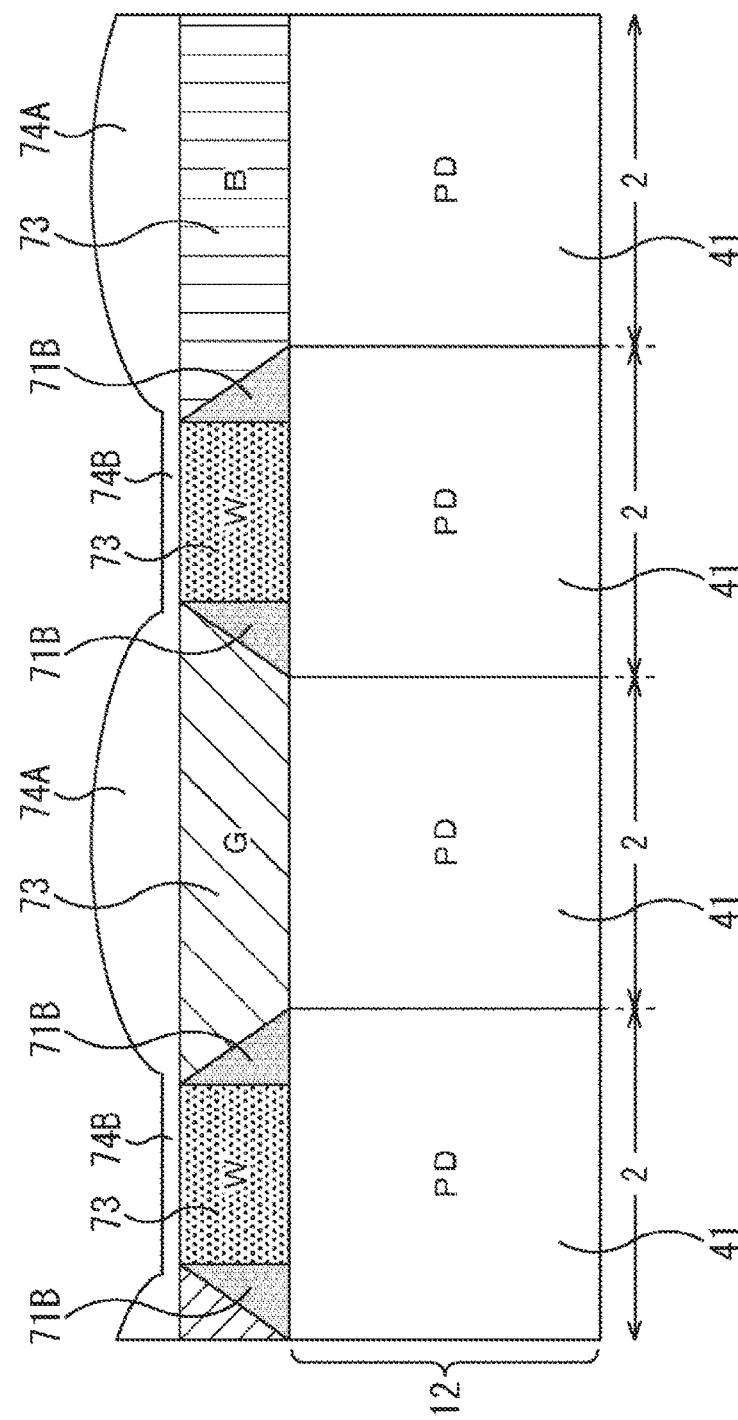
FIG. 31 is a cross-sectional view showing a modified example of the seventh embodiment of the pixels.

Note that as shown in FIG. 31, it is also possible to omit the inter-pixel light-shielding films 121 and the flattened film 122 formed between the semiconductor substrate 12 and the color filter layers 73.

12. First Method of Manufacturing Pixels According to Seventh Embodiment

Next, a description will be given, with reference to FIGS. 32A to 32D and FIGS. 33A to 33D, of a first method of manufacturing the pixels 2 according to the seventh embodiment.

Figure 32A:
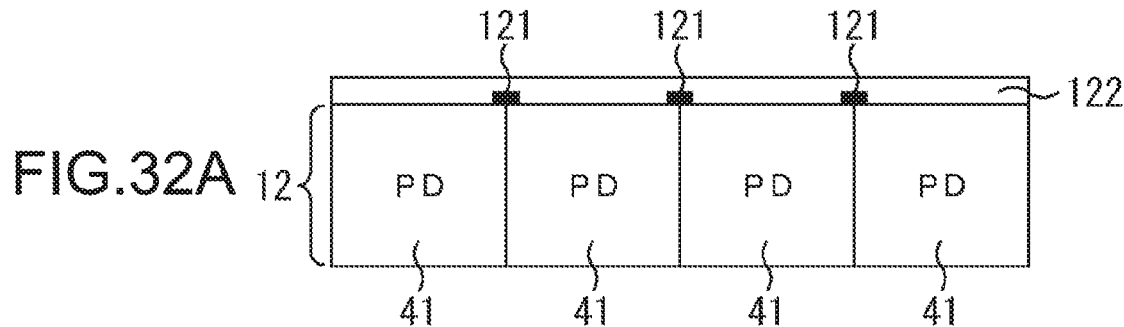
FIGS. 32A to 32D are views for describing a first method of manufacturing the pixels according to the seventh embodiment.

First, as shown in FIG. 32A, the photodiodes 41 are formed on a pixel-by-pixel basis inside the semiconductor substrate 12, and the inter-pixel light-shielding films 121 and the flattened film 122 are formed on the upper surface on the rear surface side of the semiconductor substrate 12. Note that although omitted in the figures, the element separation layers 68 between the photodiodes 41 and the multilevel wiring layer 66 including the plurality of pixel transistors Tr on the front surface side of the semiconductor substrate 12 are also formed as in the embodiments described above.

Figure 32B:
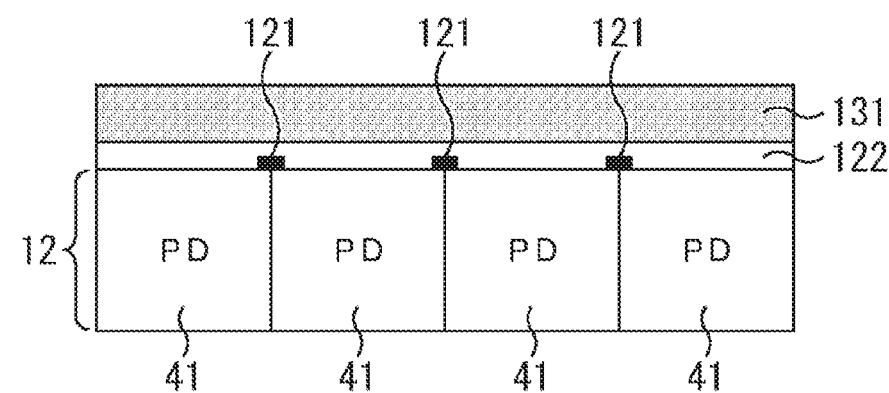

Next, as shown in FIG. 32B, a light-shielding material 131 as the material of the light-shielding walls 71B is deposited on the upper surface of the flattened film 122 with a prescribed film thickness. The light-shielding material 131 may be made of a low refractive index material or a metal material as in the embodiments described above.

Figure 32C:
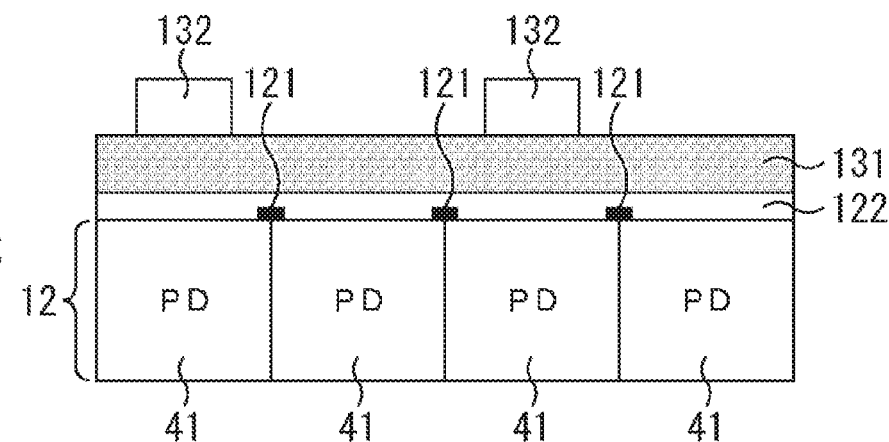

Then, as shown in FIG. 32C, a photoresist 132 is formed on the light-shielding material 131 and subsequently patterned to cause only regions where the color filters 73 colored in W are to be formed to remain.

Figure 32D:
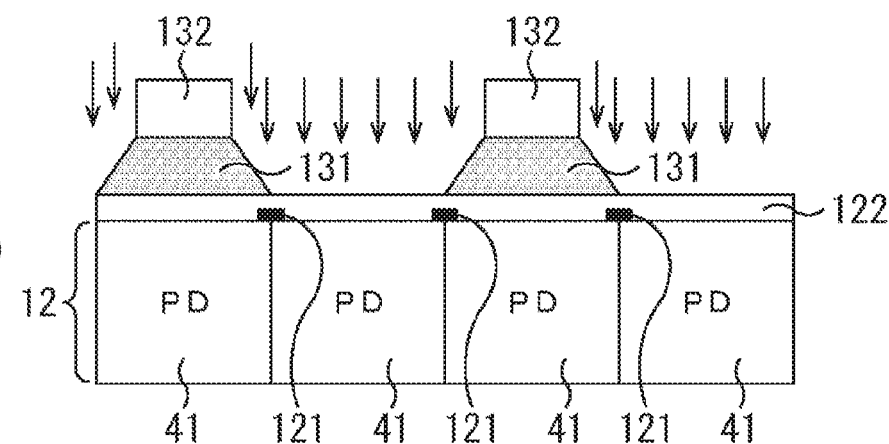

Next, as shown in FIG. 32D, dry etching is performed under the etching condition that the patterned photoresists 132 have a tapered angle at the peripheral portions thereof.

Figure 33A:
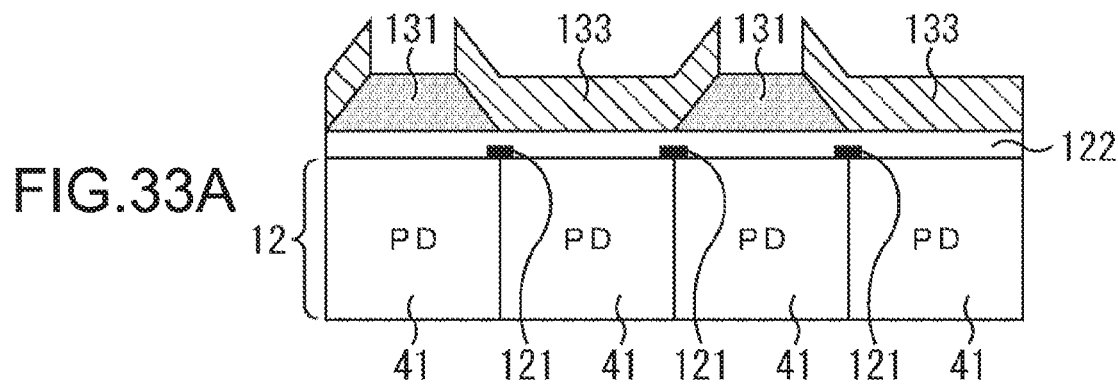
FIGS. 33A to 33D are views for describing the first method of manufacturing the pixels according to the seventh embodiment.

Then, as shown in FIG. 33A, a photoresist 133 is patterned with respect to the light-shielding materials 131 formed in a trapezoidal shape to open the regions where the color filters 73 colored in W are to be formed.

Figure 33B:
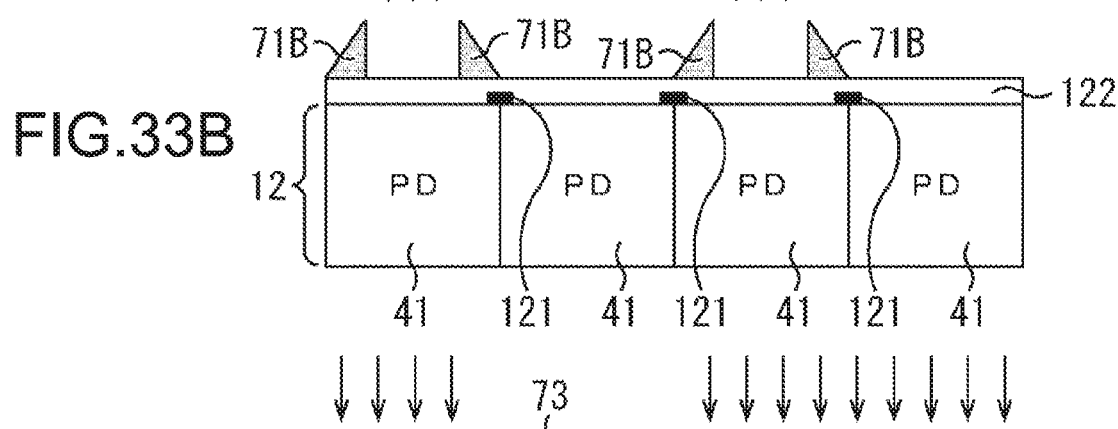

Next, as shown in FIG. 33B, dry etching is performed under the etching condition that a tapered angle is not formed based on the patterned photoresists 133. After the etching, the photoresists 133 are removed.

Figure 33C:
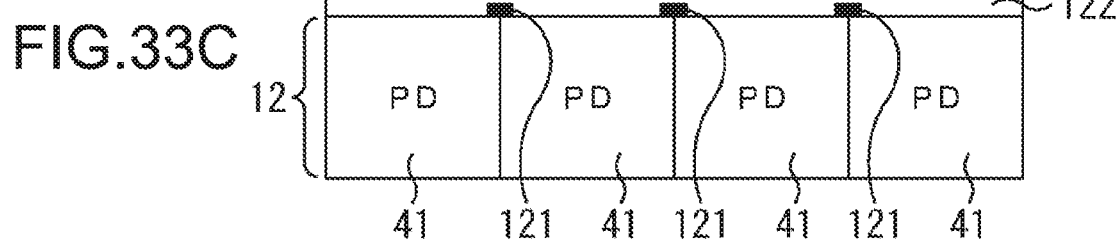

Then, as shown in FIG. 33C, the color filters 73 colored in G are patterned at desired pixel regions, and the color filters colored in G, B, and W are also patterned at desired pixel regions in a prescribed order.

Finally, the on-chip lenses 74A and the on-chip lens flattened layers 74B are formed on the color filter layers 73, whereby the pixel structure shown in FIG. 29 is completed.

13. Second Method of Manufacturing Pixels According to Seventh Embodiment

Next, a description will be given, with reference to FIGS. 34A to 34D and FIGS. 35A to 35D, of a second method of manufacturing the pixels 2 according to the seventh embodiment.

Figure 34A:
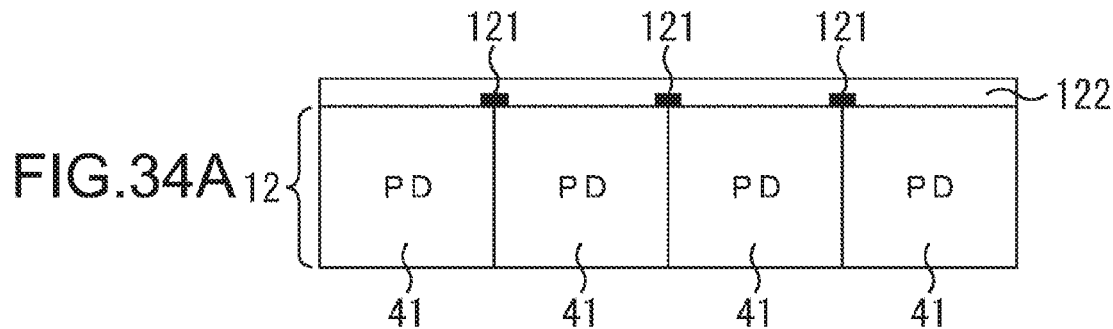
FIGS. 34A to 34D are views for describing a second method of manufacturing the pixels according to the seventh embodiment.

First, as shown in FIG. 34A, the photodiodes 41 are formed on a pixel-by-pixel basis inside the semiconductor substrate 12, and the inter-pixel light-shielding films 121 and the flattened film 122 are formed on the upper surface on the rear surface side of the semiconductor substrate 12. The above step is the same as that of FIG. 32A.

Figure 34B:
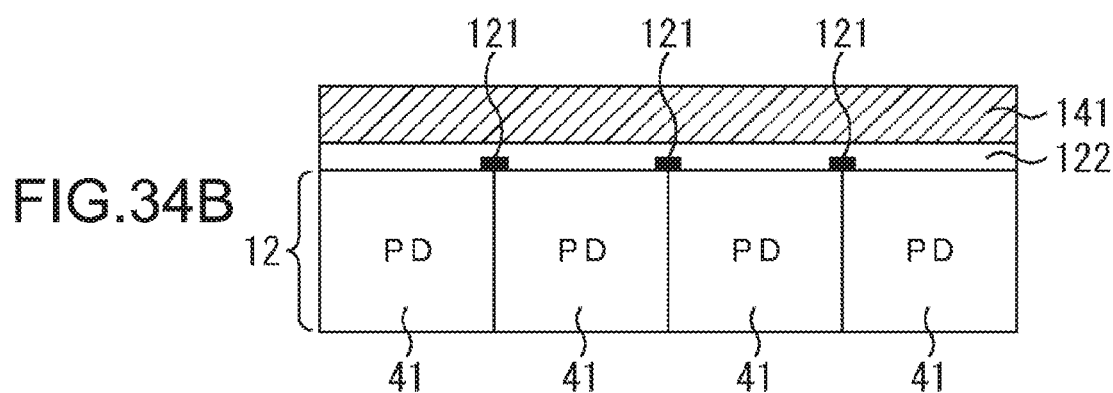

Next, as shown in FIG. 34B, polysilicon 141 is, for example, deposited on the upper surface of the flattened film 122 with the same film thickness as that of the color filter layers 73 that will be formed later. Note that since the material deposited here is to be finally removed, any material other than polysilicon may be used so long as a selective ratio to the material is ensurable.

Figure 34C:
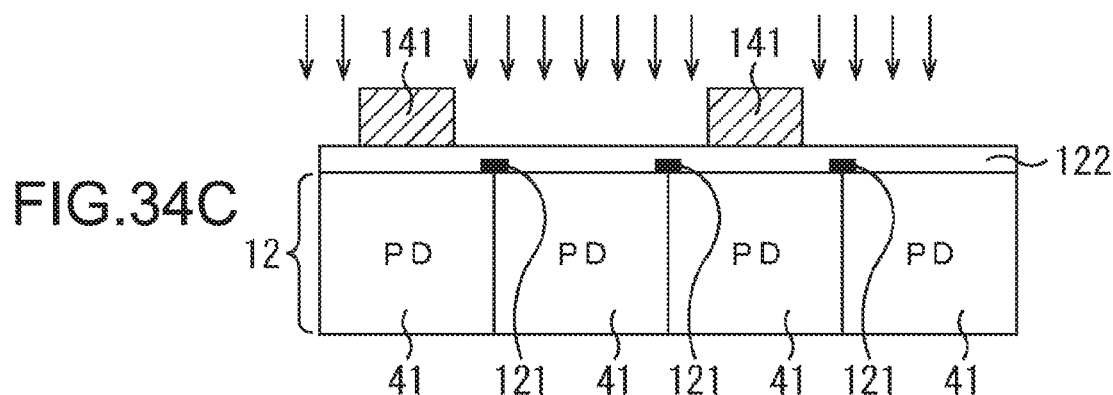

Then, as shown in FIG. 34C, the polysilicon 141 is patterned to cause only regions where the color filters 73 colored in W are to be formed to remain. The remaining portions of the polysilicon 141 serve as bases for forming the light-shielding walls 71B.

Figure 34D:
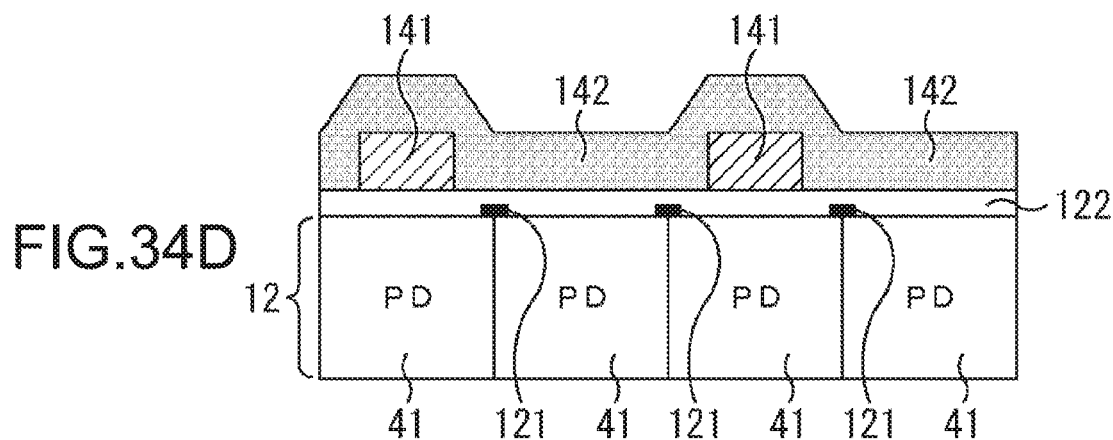

Next, as shown in FIG. 34D, a light-shielding material 142 as the material of the light-shielding walls 71B is deposited on the upper surfaces of the flattened film 122 and the polysilicon 141 with a prescribed film thickness. The light-shielding material 142 may be made of a low refractive index material or a metal material as in the embodiments described above.

Figure 35A:
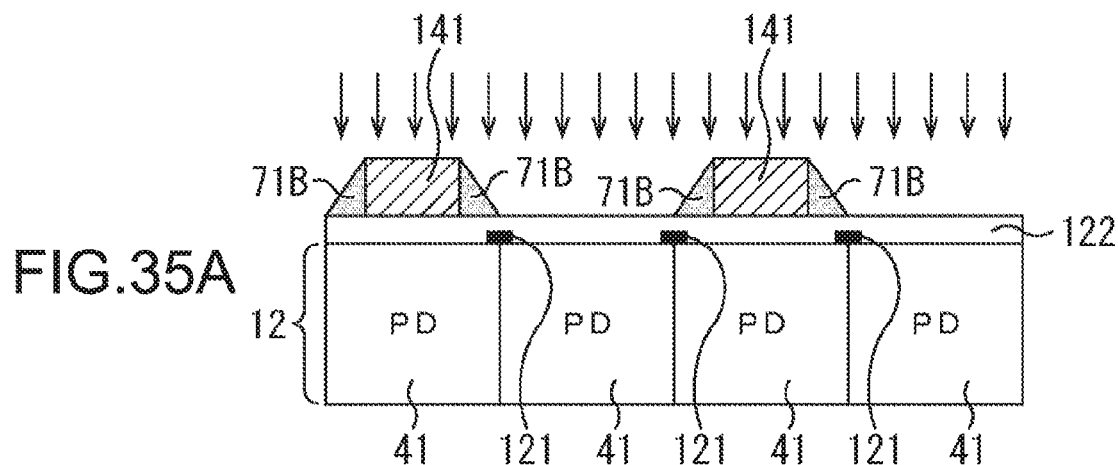
FIGS. 35A to 35D are views for describing the second method of manufacturing the pixels according to the seventh embodiment.

Then, as shown in FIG. 35A, the desired regions of the light-shielding material 142 are removed by dry etching. On this occasion, since the light-shielding material 142 is deposited with a large thickness at the peripheral portions of the polysilicon 141 serving as the bases, the light-shielding walls 71B like side walls may be formed only by entire-surface etching.

Figure 35B:
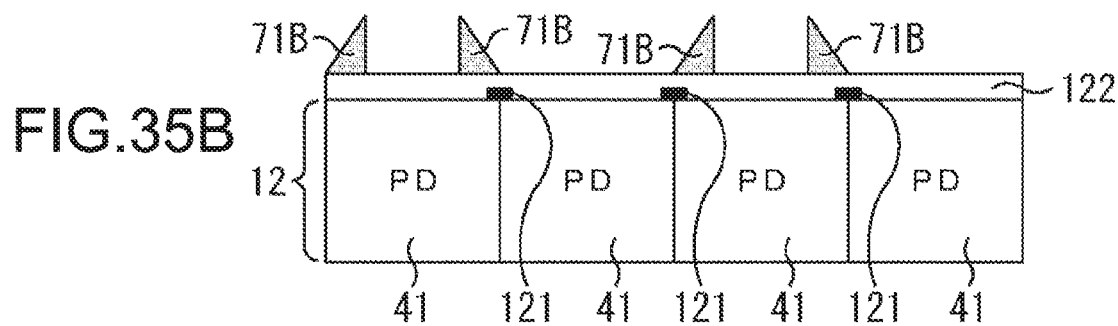

After the light-shielding walls 71B are formed, the polisilicon 141 serving as the bases is removed as shown in FIG. 35B.

Figure 33D:
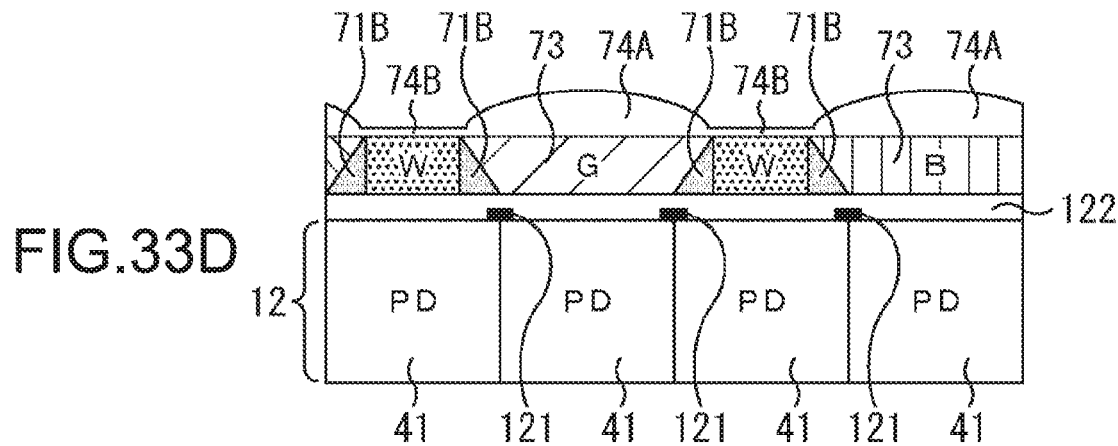
Figure 35C:
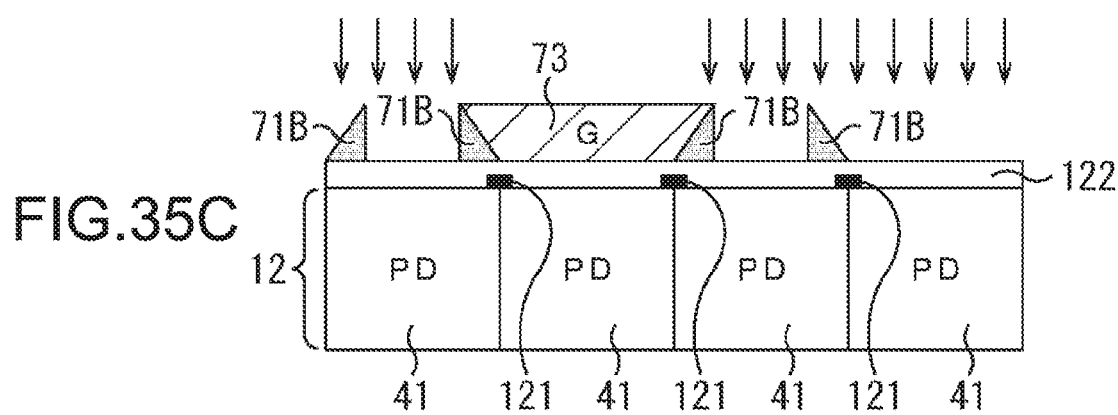
Figure 35D:
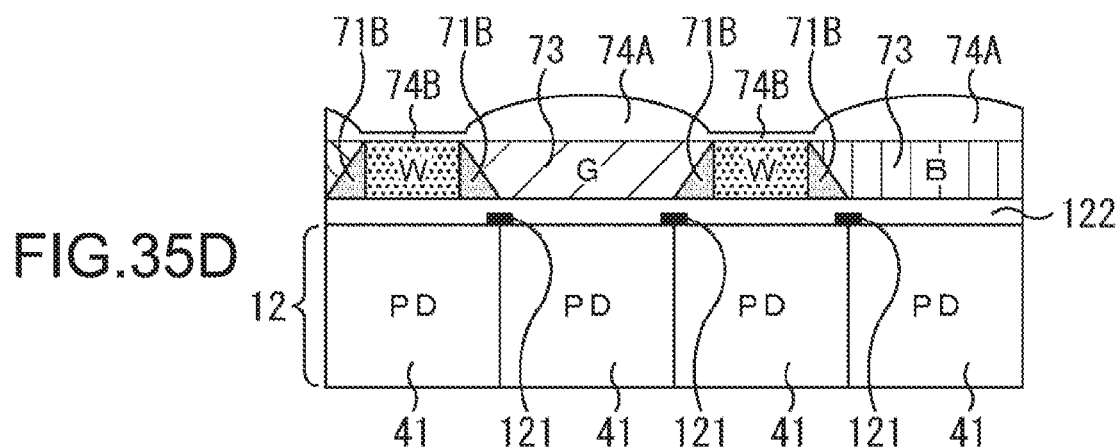

The following steps of FIGS. 35C and 35D are the same as those of FIGS. 33C and 33D described above. That is, the color filters 73 of the respective colors are formed between the light-shielding walls 71B and then the on-chip lenses 74A and the on-chip lens flattened layers 74B are formed, whereby the pixel structure shown in FIG. 29 is completed.

The pixel structure according to the seventh embodiment shown in FIG. 29 may be formed by the first or second manufacturing method described with reference to FIGS. 32A to 32D to FIGS. 35A to 35D. Thus, the pixel structure that prevents the degradation of color mixture may be achieved.

14. Eighth Embodiment of Pixels (Cross-Sectional Configuration View of Pixels)

Figure 36:
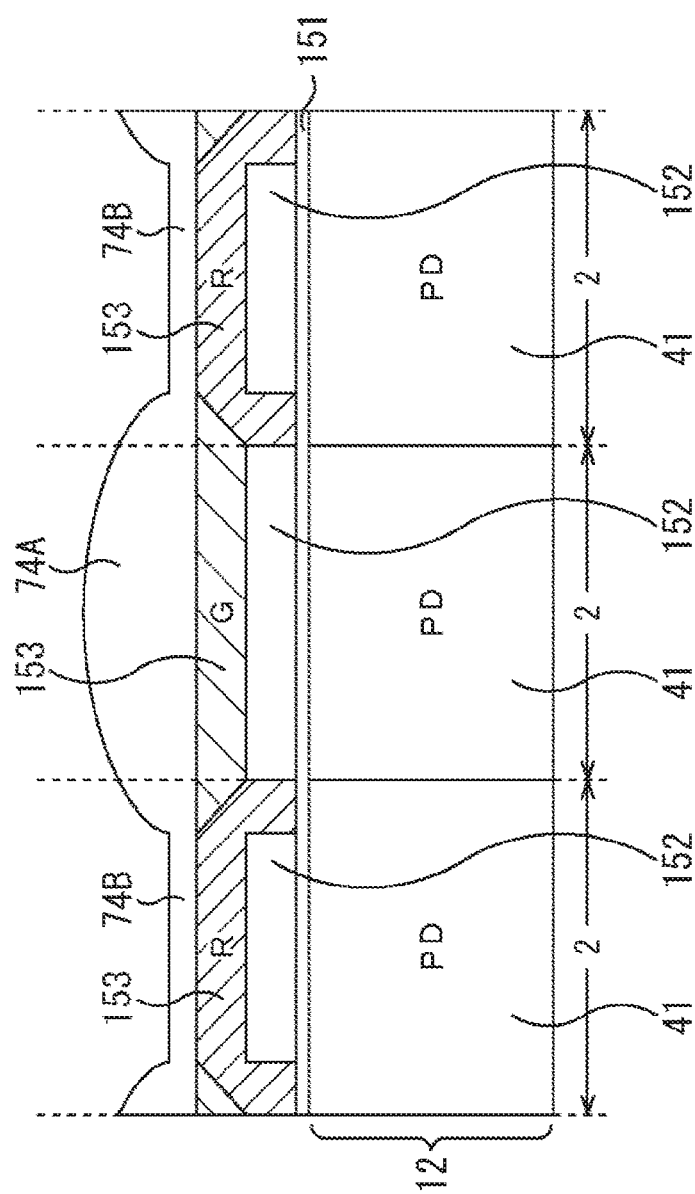
FIG. 36 is a cross-sectional configuration view according to an eighth embodiment of the pixels.

FIG. 36 is a cross-sectional configuration view according to an eighth embodiment of the pixels 2.

Note that components corresponding to the components of FIG. 3 according to the first embodiment described above are denoted by the same symbols in FIG. 36 and only components different from the components of the pixel structure shown in FIG. 3 will be described.

According to the eighth embodiment, the photodiodes 41 are formed on a pixel-by-pixel basis inside the semiconductor substrate 12 as shown in FIG. 36. Each of the photodiodes 41 is shown in such a way that the charge accumulation region 61 and the dark current prevention regions 62 and 63 shown in FIG. 3 are simplified.

In addition, the eighth embodiment of FIG. 36 does not have the embedded light-shielding portions 71A of FIG. 3 and omits the illustration of the element separation layers 68. Moreover, the eighth embodiment also omits the illustrations of the multilevel wiring layer 66 and the support substrate 67 formed on the front surface side of the semiconductor substrate 12.

On the upper surface on the rear surface side of the semiconductor substrate 12, a passivation film 151 is deposited. As the material of the passivation film 151, a silicon nitride film (SiN) or the like may be, for example, used.

On the upper surface of the passivation film 151, flattened films 152 are formed on a pixel-by-pixel basis. More specifically, the flattened films 152 are formed to be the same in size as the pixels 2 at the pixels 2 where the on-chip lenses 74A are present, and the flattened films 152 are formed to be the same in width as the on-chip lens flattened layers 74 at the pixels 2 where the on-chip lenses are absent. As the material of the flattened films 152, an organic material such as a resin having high transparency may be, for example, used.

The color filters 153 colored in R, G, or B are formed on the upper surfaces of the flattened films 152, and the on-chip lenses 74A and the on-chip lens flattened layers 74B are formed on the color filters 153.

Each of the color filters 153 at the pixels 2 where the on-chip lenses 74A are present is formed to have a trapezoidal cross section whose upper side of the color filter 153 is the same in width as the on-chip lens 74A and whose lower side is the same in width as the pixel 2. Note that the width of the lower side of each of the color filters 153 at the pixels 2 where the on-chip lenses 74A exist is not necessarily the same in size as the pixel 2 but may only be shorter than the upper side of each of the color filters 153. In other words, the side walls of each of the color filters 153 at the pixels 2 where the on-chip lenses 74A are present may be slant surfaces that do not hinder incident light passing through the end of the on-chip lens 74A.

On the other hand, each of the color filters 153 at the pixels 2 where the on-chip lenses 74A are absent is formed to have a substantially trapezoidal cross section whose upper side is the same in width as the on-chip lens flattened layer 74B and also formed at the peripheral portion of the pixel 2 on the passivation film 151 where the flattened film 152 is absent. Accordingly, at each of the pixels 2 where the on-chip lenses 74A are absent, the film thickness of the color filter 153 at the peripheral portion of the pixel 2 is the same as or larger than that of the color filter 153 at the central portion thereof. In addition, at each of the pixels 2 where the on-chip lenses 74A are absent, the film thickness of the color filter 153 at the central portion of the pixel 2 is the same as that of the color filter 153 at each of the pixels 2 where the on-chip lenses 74A are present and common to all the pixels.

In the cross-sectional structure of the pixels 2 according to the eighth embodiment configured as described above, each of the color filters 153 at the pixels 2 where the on-chip lenses 74A are absent is formed to have a larger thickness at the peripheral portion of the pixel 2 than at the central portion thereof.

Figure 37:
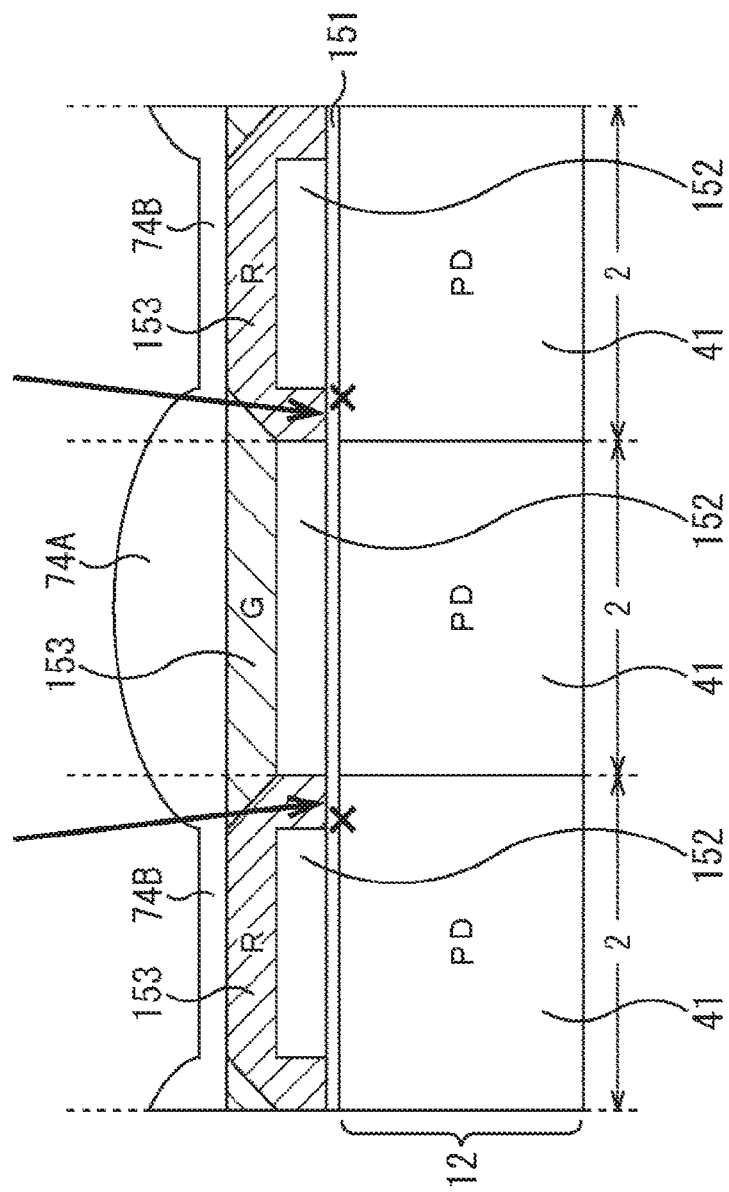
FIG. 37 is a view for describing the effect of the pixels according to the eighth embodiment.

Thus, since incident light as indicated by arrows in FIG. 37, which passes through the vicinities of the portions of the on-chip lenses 74A protruding to the adjacent pixels 2, passes through the film thickness portions of the color filters 153, the color mixture component of the incident light may be sufficiently attenuated.

The flattened films 152 the same in size as the on-chip lens flattened layers 74B are formed at the central portions at the pixels 2 where the on-chip lenses 74A are absent, whereby the film thickness of the color filters 153 are made common to all the pixels 2. Thus, since the film thickness of the color filters 153 is not large at regions where incident light is received, light condensing efficiency may be increased.

In addition, since each of the color filters 153 at the pixels 2 where the on-chip lenses 74 are present is formed to have a reverse trapezoidal shape whose upper surface is the same in size as the on-chip lens 74 and whose lower surface is the same in size as the pixel 2, the degradation of color mixture may be prevented without reducing light condensing efficiency.

15. Method of Manufacturing Pixels According to Eighth Embodiment

Next, a description will be given, with reference to FIGS. 38A to 38D and FIGS. 39A to 39D, of the method of manufacturing the pixels 2 according to the eighth embodiment.

Figure 38A:
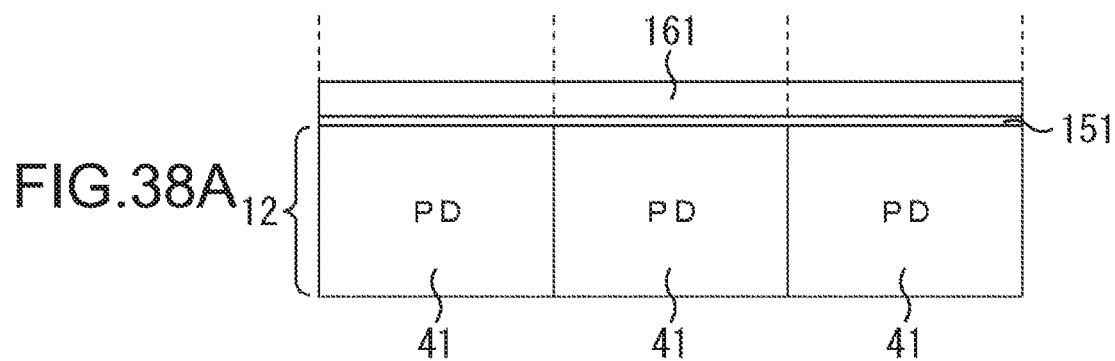
FIGS. 38A to 38D are views for describing the method of manufacturing the pixels according to the eighth embodiment.

First, as shown in FIG. 38A, the photodiodes 41 are formed on a pixel-by-pixel basis inside the semiconductor substrate 12, and the passivation film 151 and a transparent material 161 for forming the flattened films 152 are deposited on the upper surface on the rear surface side of the semiconductor substrate 12. Note that although omitted in the figures, the element separation layers 68 between the photodiodes 41 and the multilevel wiring layer 66 including the plurality of pixel transistors Tr on the front surface side of the semiconductor substrate 12 are also formed as in the embodiments described above.

Figure 38B:
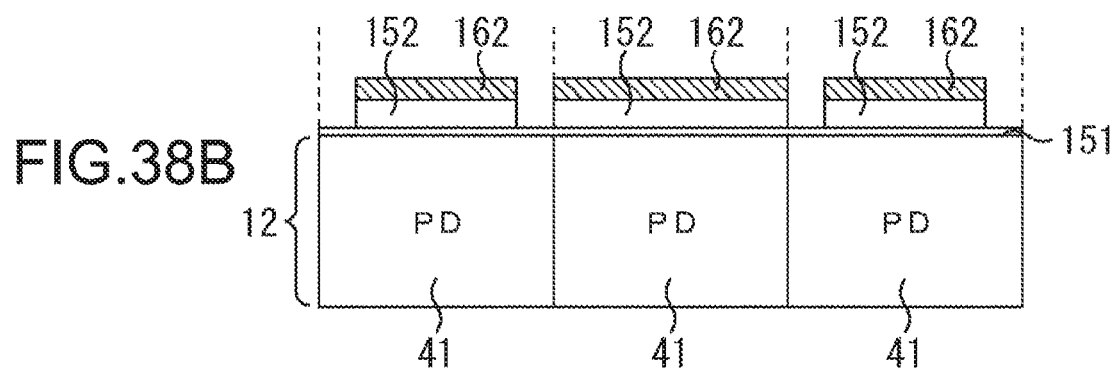

Then, as shown in FIG. 38B, after a photoresist 162 is deposited on the entire surface on the upper side of the transparent material 161 and patterned corresponding to the regions of the flattened films 152, the transparent material 161 is etched. By the etching, the flattened films 152 are formed.

As described above, the flattened films 152 are formed to be the same in size as the pixels 2 at the pixels 2 where the on-chip lenses 74A are present and formed to be smaller in size than the pixels 2, i.e., the same in size as the on-chip lens flattened layers 74B, which will be formed later, at the pixels 2 where the on-chip lenses 74A are absent.

At each of the pixels 2 where the on-chip lenses 74A are absent, the color filter 153 is formed at the peripheral portion of the pixel 2 where the flattened film 152 is not formed. Accordingly, the film thickness of the color filters 153 having the effect of attenuating the color mixture component of incident light depends on the patterning and etching amount of the photoresist 162.

Figure 38C:
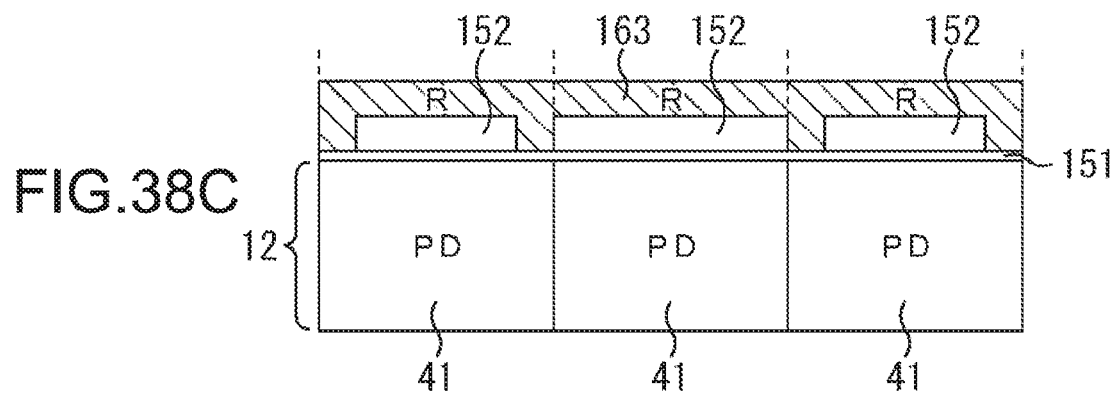

Next, as shown in FIG. 38C, after the photoresists 162 are removed, a color filter material 163 colored in a prescribed color (R in FIG. 38C) is coated on the upper surfaces of the passivation film 151 and the flattened films 152.

Figure 38D:
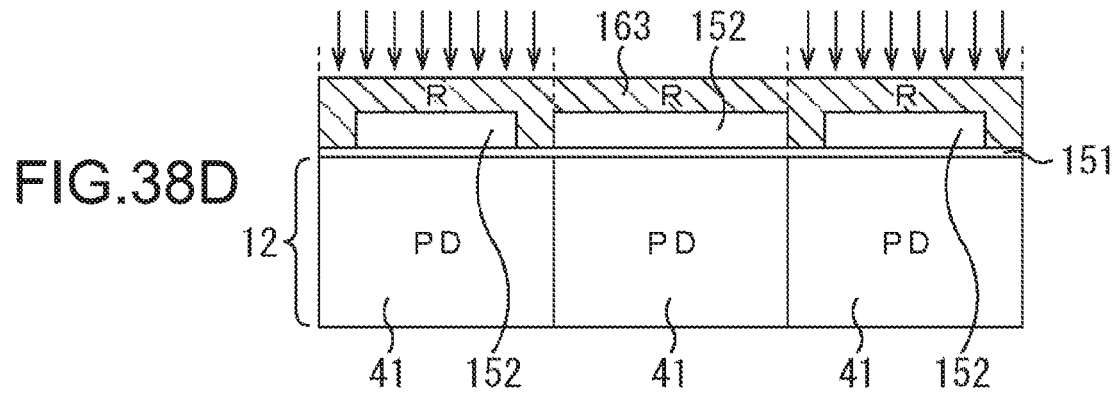

Then, as shown in FIG. 38D, only the desired regions of the R color filter material 163 coated on the entire surface are exposed. After that, as shown in FIG. 39A, the unnecessary portions of the R color filter material 163 are removed.

Next, a photoresist 164 having a prescribed size is patterned and etched at the central portions of the pixels 2 on the upper surfaces of the R color filter materials 163, whereby the R color filter materials 163 are tapered at the peripheral portions of the pixels 2. Thus, the color filters 153 colored in R are completed.

After the color filters 153 at the pixels 2 where the on-chip lenses 74A are not to be formed are first formed as described above, the color filters 153 colored in G at the pixels 2 where the on-chip lenses 74A are to be formed are formed as shown in FIG. 39C.

Finally, as shown in FIG. 39D, the on-chip lenses 74A and the on-chip lens flattened layers 74B are formed on the color filters colored in R, G, and B, whereby the pixel structure shown in FIG. 36 is completed.

16. Ninth Embodiment of Pixels (Cross-Sectional Configuration View of Pixels)

Figure 40:
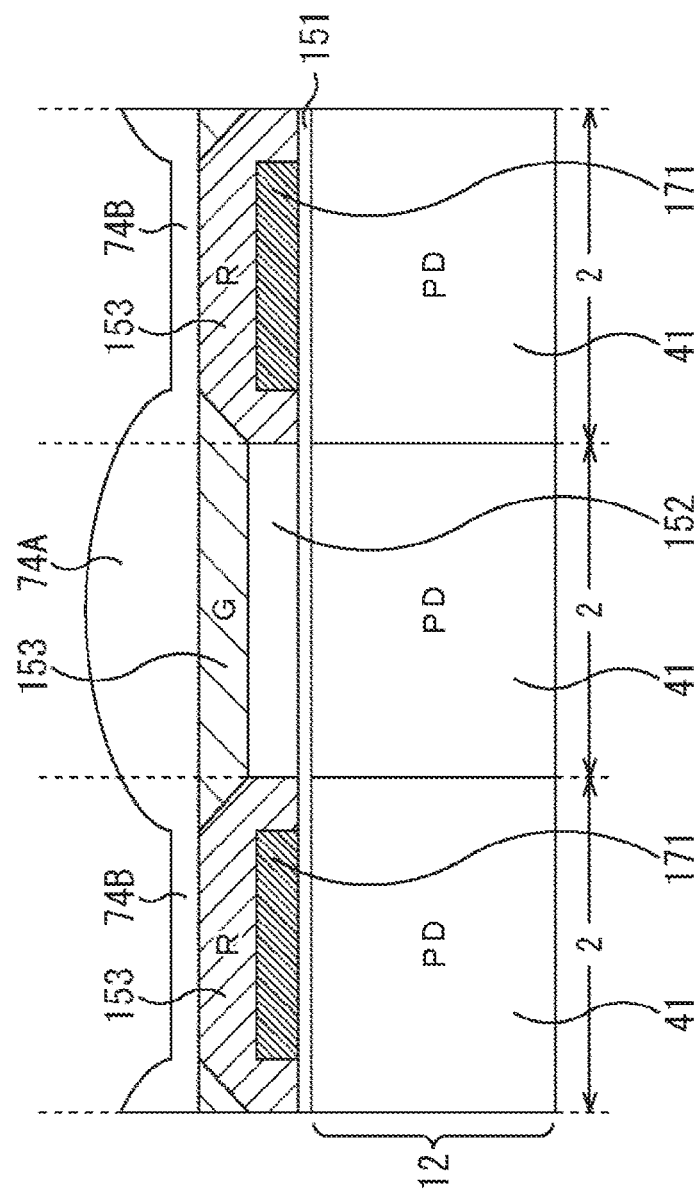
FIG. 40 is a cross-sectional configuration view according to a ninth embodiment of the pixels.

FIG. 40 is a cross-sectional configuration view according to a ninth embodiment of the pixels 2.

Note that components corresponding to the components of FIG. 36 according to the eighth embodiment described above are denoted by the same symbols in FIG. 40 and only components different from the components of the pixel structure shown in FIG. 36 will be described.

A pixel structure according to the ninth embodiment is different from the pixel structure according to the eighth embodiment shown in FIG. 36 in that transparent films 171 made of a material having high transparency are formed instead of the flattened films 152 on the upper surface of the passivation film 151 at the pixels 2 where the on-chip lenses 74A are absent.

In the pixel structure shown in FIG. 40, etching is performed based on the patterned photoresists 162 of FIG. 38B to cause only the flattened films 152 to remain at the pixels 2 where the on-chip lenses 74A are present. Then, on the passivation film 151 at the pixels 2 where the on-chip lenses 74A are absent, the transparent films 171 made of a material having high transparency may be patterned and formed. Other steps are the same as the steps of the manufacturing method according to the eighth embodiment described with reference to FIGS. 38A to 38D and FIG. 39A to 39D.

In the pixel structure according to the ninth embodiment, the transparent films 171 made of a material having high transparency are employed instead of the flattened films 152 at the pixels 2 where the on-chip lenses 74A are absent.

Therefore, compared with the pixel structure according to the eighth embodiment, incident light may be more efficiently condensed.

17. Tenth Embodiment of Pixels (Cross-Sectional Configuration View of Pixels)

Figure 41:
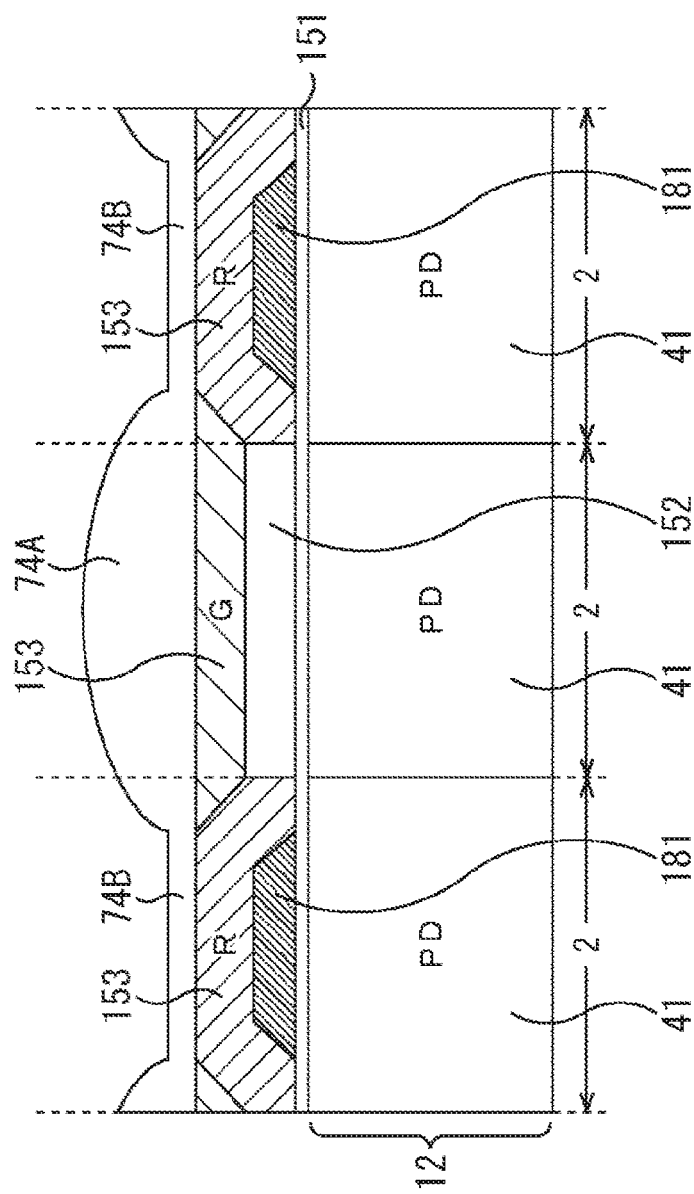
FIG. 41 is a cross-sectional configuration view according to a tenth embodiment of the pixels.

FIG. 41 is a cross-sectional configuration view according to a tenth embodiment of the pixels 2 of the solid-state imaging device 1.

Note that components corresponding to the components of FIG. 40 according to the ninth embodiment described above are denoted by the same symbols in FIG. 41 and only components different from the components of the pixel structure shown in FIG. 40 will be described.

A pixel structure according to the tenth embodiment is different from the pixel structure according to the ninth embodiment shown in FIG. 40 in that transparent films 181 having a trapezoidal cross-sectional shape are formed instead of the transparent films 171 having a rectangular cross-sectional shape on the upper surface of the passivation film 151 at the pixels 2 where the on-chip lenses 74A are absent.

With the trapezoidal cross-sectional shape of the transparent films 181, the shape of the color filters 153 formed on the transparent films 181 may be controlled. The trapezoidal transparent films 181 may be formed under the control of etching conditions. Other manufacturing steps are the same as the manufacturing steps of the pixel structure according to the ninth embodiment described above.

In the pixel structure according to the tenth embodiment, the transparent films 181 made of a material having high transparency are employed instead of the flattened films 152 at the pixels 2 where the on-chip lenses 74A are absent. Therefore, compared with the pixel structure according to the eighth embodiment, incident light may be more efficiently condensed.

Note that as the material of the transparent films 171 or 181, a material having high transparency such as an oxide film ($SiO_2$) may be, for example, used. However, if a material having a high refractive index such as a nitride film (SiN) and an oxynitride film (SiON) is, for example, used, condensing efficiency may be further increased.

18. Eleventh Embodiment of Pixels (Cross-Sectional Configuration View of Pixels)

Figure 42:
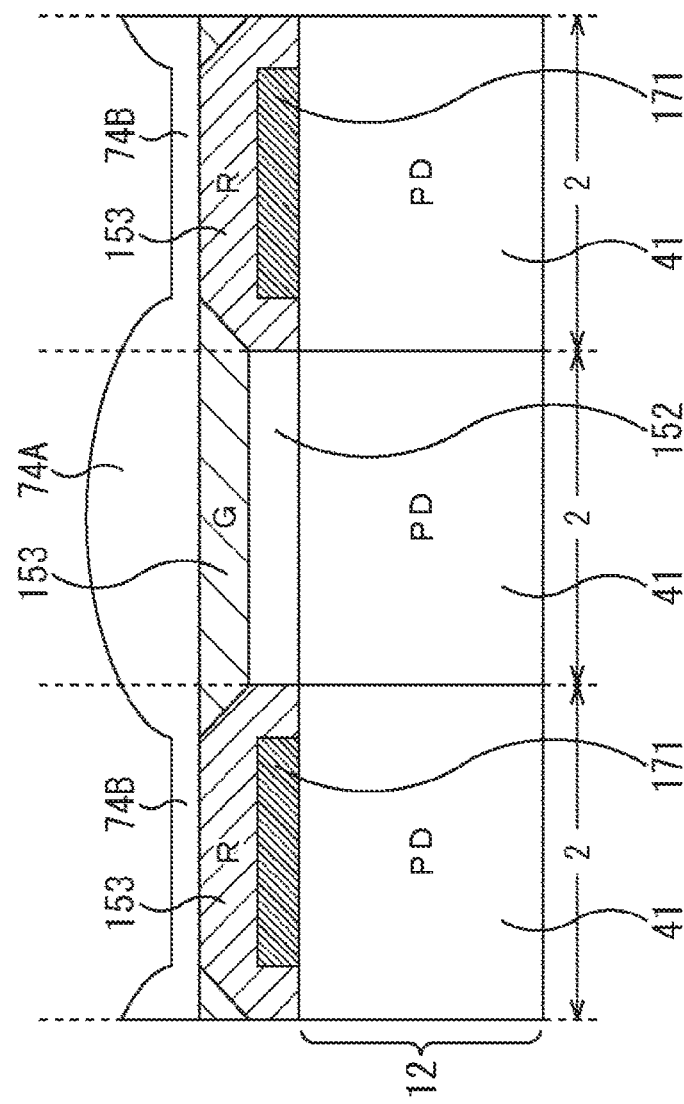
FIG. 42 is a cross-sectional configuration view according to an eleventh embodiment of the pixels.

FIG. 42 is a cross-sectional configuration view according to an eleventh embodiment of the pixels 2.

Note that components corresponding to the components of FIG. 40 according to the ninth embodiment described above are denoted by the same symbols in FIG. 42 and only components different from the components of the pixel structure shown in FIG. 40 will be described.

A pixel structure according to the eleventh embodiment is different from the pixel structure according to the ninth embodiment shown in FIG. 40 in that the passivation film 151 is not formed on the entire surface on the rear surface side of the semiconductor substrate 12. Like this, it is also possible to omit the passivation film 151.

Note that the pixel structure having the trapezoidal transparent films 181 shown in FIG. 41 may also omit the passivation film 151.

19. Twelfth Embodiment of Pixels (Cross-Sectional View of Pixels)

Figure 43:
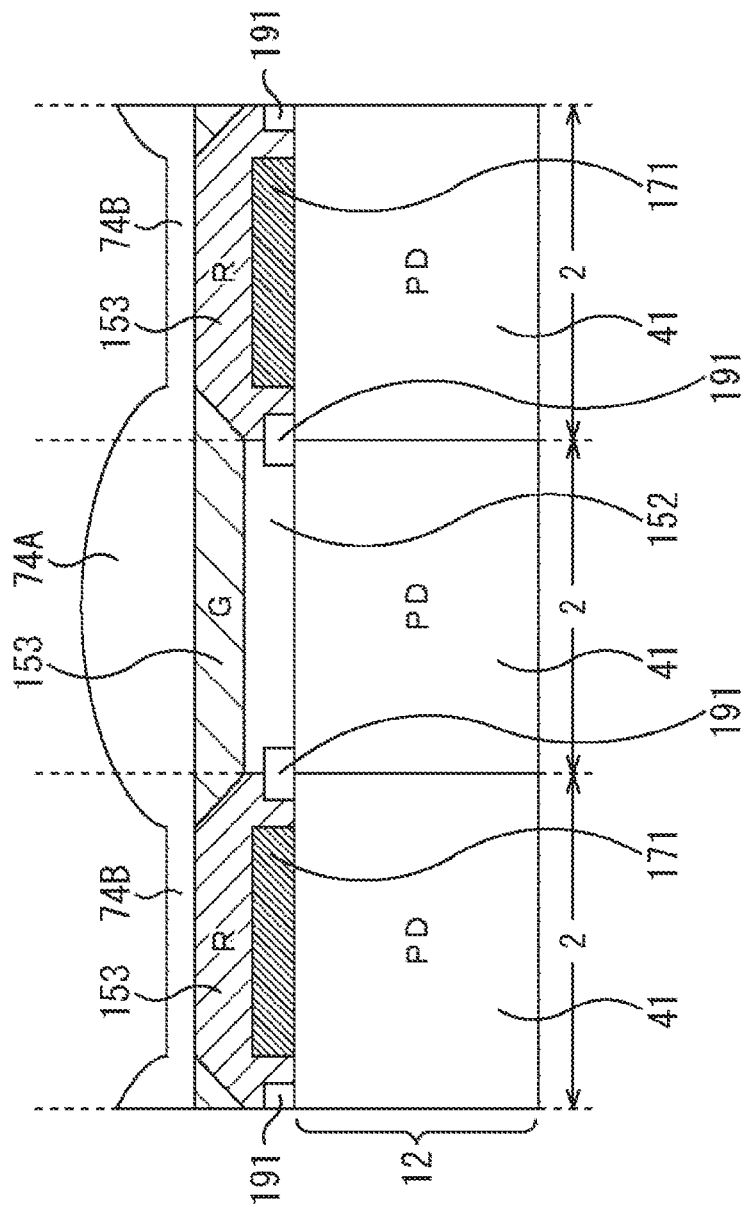
FIG. 43 is a cross-sectional configuration view according to a twelfth embodiment of the pixels.

FIG. 43 is a cross-sectional configuration view according to a twelfth embodiment of the pixels 2.

Note that components corresponding to the components of FIG. 42 according to the eleventh embodiment described above are denoted by the same symbols in FIG. 43 and only components different from the components of the pixel structure shown in FIG. 42 will be described.

A pixel structure according to the twelfth embodiment is different from the pixel structure according to the eleventh embodiment shown in FIG. 42 in that inter-pixel light-shielding films 191 are formed at pixel boundary portions at the interface on the rear surface side of the semiconductor substrate 12. By the inter-pixel light-shielding films 191, the leakage of light from the adjacent pixels 2 may be reliably prevented.

In the solid-state imaging device 1 according to the eighth to twelfth embodiments described above, the degradation of color mixture may be prevented in the pixel structure of the rear surface irradiation type in which the on-chip lenses larger in size than the pixels are formed for every other pixel.

20. Thirteenth Embodiment of Pixels (Cross-Sectional Configuration View of Pixels)

Figure 44:
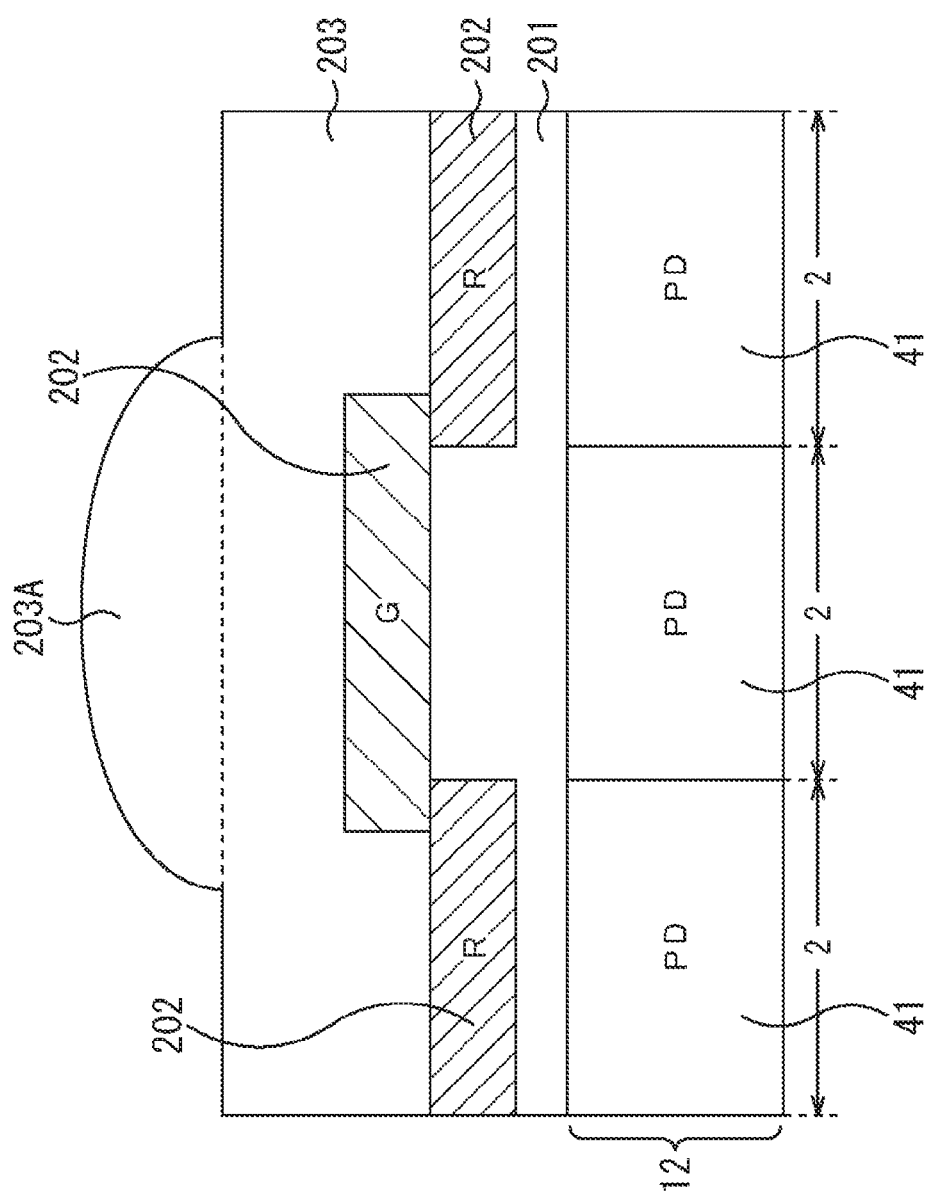
FIG. 44 is a cross-sectional configuration view according to a thirteenth embodiment of the pixels.

FIG. 44 is a cross-sectional configuration view according to a thirteenth embodiment of the pixels 2.

Note that components corresponding to the components of FIG. 3 according to the first embodiment described above are denoted by the same symbols in FIG. 44 and only components different from the components of the pixel structure shown in FIG. 3 will be described.

According to the thirteenth embodiment, the photodiodes 41 are formed on a pixel-by-pixel basis inside the semiconductor substrate 12 as in the embodiments described above. Each of the photodiodes 41 is shown in such a way that the charge accumulation region 61 and the dark current prevention regions 62 and 63 shown in FIG. 3 are simplified.

In addition, the thirteenth embodiment of FIG. 44 does not have the embedded light-shielding portions 71A of FIG. 3 and omits the illustration of the element separation layers 68. Moreover, the thirteenth embodiment also omits the illustrations of the multilevel wiring layer 66 and the support substrate 67 formed on the front surface side of the semiconductor substrate 12.

A protection film 201 is formed with a prescribed thickness on the upper surface on the rear surface side of the semiconductor substrate 12, and color filters 202 are formed on the protection film 201. Moreover, over the color filters 202, on-chip lenses 203A are formed on the upper surface of a heightened on-chip lens layer for every other pixel.

The protection film 201 is formed to have a different thickness between the pixels 2 where the on-chip lenses 203A are present and the pixels 2 where the on-chip lenses 203A are absent. Specifically, the thickness of the protection film 201 at the pixels 2 where the on-chip lenses 203A are present is equivalent to the sum of the thickness of the protection film 201 and the thickness of the color filters 202 at the pixels 2 where the on-chip lenses 203A are absent. Further, the color filters 202 formed on the protection film 201 at the pixels 2 where the on-chip lenses 203A are present are formed to be larger in size than the pixels 2 so as to be superimposed on the color filters 202 at the pixels 2 where the on-chip lenses 203A are absent.

In the example of FIG. 44, the color filters 202 colored in R are formed at the pixels 2 where the on-chip lenses 203A are absent, and the color filters 202 colored in G are formed at the pixels 2 where the on-chip lenses 203A are present. The arrangement of the colors of the color filters 202 is not limited to this example, but the various arrangement methods shown in FIG. 4A and FIGS. 24 to 27 may be employed.

The protection film 201 may be, for example, an inorganic transparent film made of $SiO_2$ or the like. The on-chip lenses 203A and the on-chip lens layer 203 are made of, for example, a silicon nitride film (SiN) or a resin material such as a styrene resin, an acrylic resin, a styrene-acryl copolymer resin, and a siloxane resin.

Figure 45:
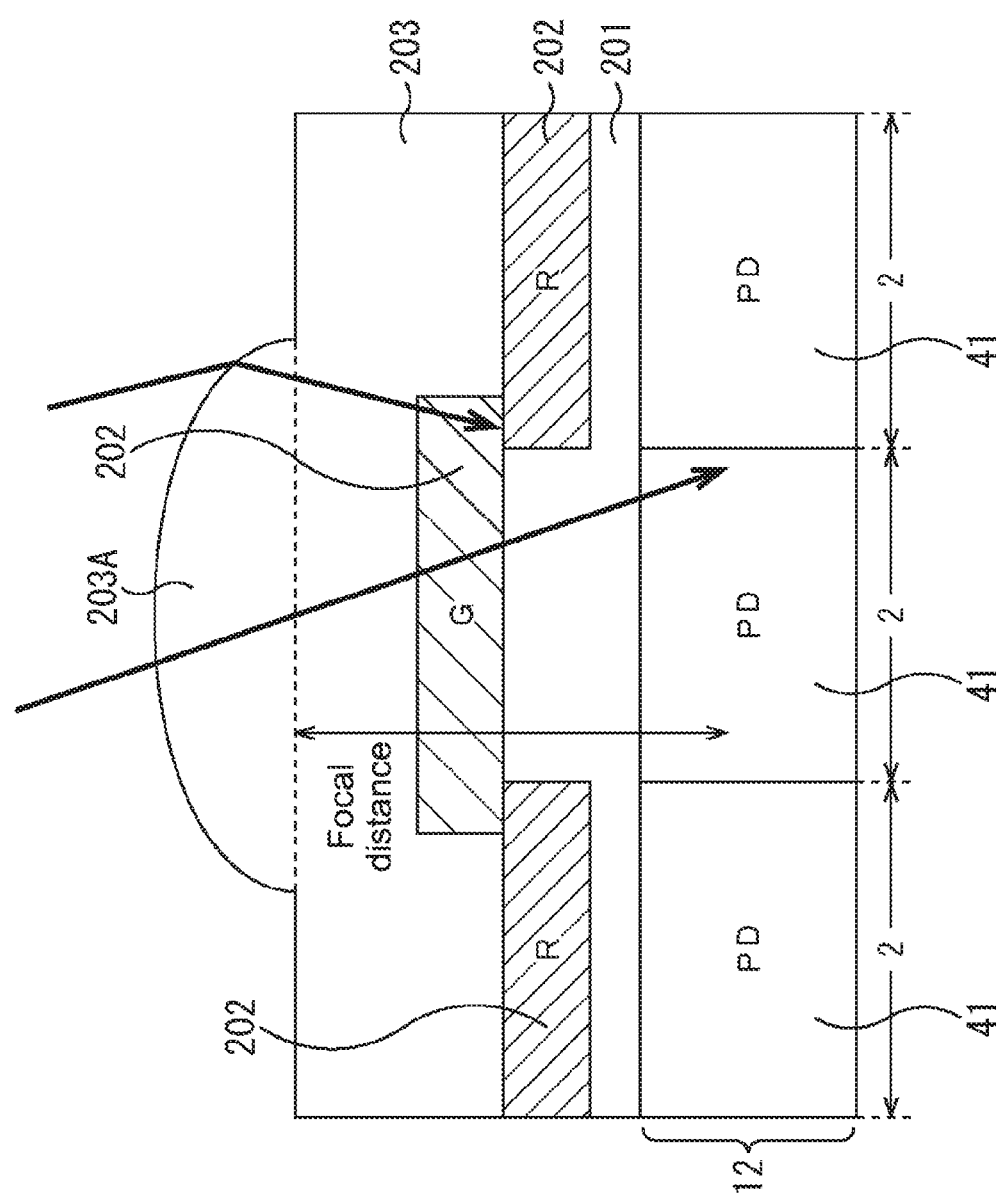
FIG. 45 is a view for describing an effect according to the thirteenth embodiment.

In a pixel structure according to the thirteenth embodiment, the on-chip lens layer 203 is formed to heighten the pixel structure as shown in FIG. 45 to optimize a focal distance, whereby incident light passing through the on-chip lenses 203 formed to be larger in size than the pixels 2 may be prevented from being incident on the photodiodes 41 at the adjacent pixels 2.

In addition, in the pixel structure according to the thirteenth embodiment, the color filters 202 at the pixels 2 where the on-chip lenses 203A are present are formed to be superimposed on the color filters 202 at the adjacent pixels 2 where the on-chip lenses 203A are absent. As shown in FIG. 45, the superimposed portions may attenuate incident light leaking into the adjacent pixels 2.

Accordingly, in the pixel structure according to the thirteenth embodiment, the degradation of color mixture may be prevented in the pixel structure of the rear surface irradiation type in which the on-chip lenses larger in size than the pixels are formed for every other pixel.

(Superimposed Amount S of Color Filters)

A description will be given, with reference to FIG. 46, of the optimum value of the superimposed amount S between the color filter 202 at the pixel 2 where the on-chip lens 203A is present and the color filters 202 at the adjacent pixels 2 where the on-chip lenses 203A are absent.

The superimposed amount S may be calculated by defining the width of the color filter 202 right below the on-chip lens 203A such that all light condensed into the pixel 2 right below the on-chip lens 203A passes through the color filter 202 right below the on-chip lens 203A.

Figure 46:
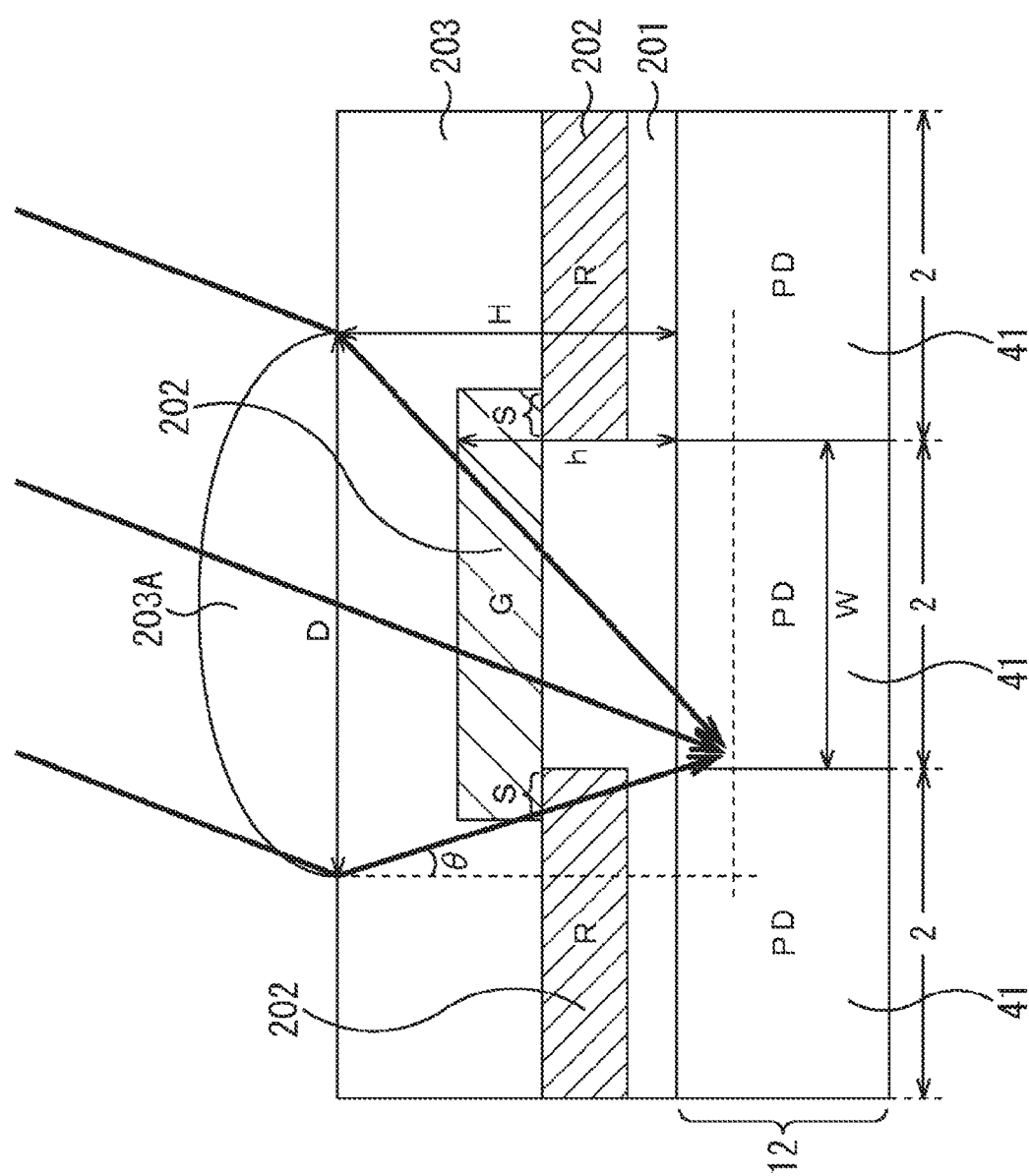
FIG. 46 is a view for describing the optimum value of the superimposed amount of the color filters.

More specifically, when consideration is given to ideal condensing with the on-chip lens 203A as shown in FIG. 46, the minimum value of the superimposed amount S of the color filter 202 may be calculated by the following expression.

$$S = h \cdot (D-W)/2H$$

$$\therefore S = h \cdot \tan\theta, \ \tan\theta = (D-W)/2H$$

Here, H represents a height from the interface on the rear surface side of the semiconductor substrate 12 to the uppermost surface of the on-chip lens layer 203, and h represents a height from the interface on the rear surface side of the semiconductor substrate 12 to the uppermost surface of the color filter 202 right below the on-chip lens 203A. In addition, W represents the width of the pixel 2, and D represents the width of the on-chip lens 203A.

21. Method of Manufacturing Pixels According to Thirteenth Embodiment

Next, a description will be given, with reference to FIGS. 47A to 47D and FIGS. 48A to 48D, of the method of manufacturing the pixels 2 according to the thirteenth embodiment.

Figure 47A:
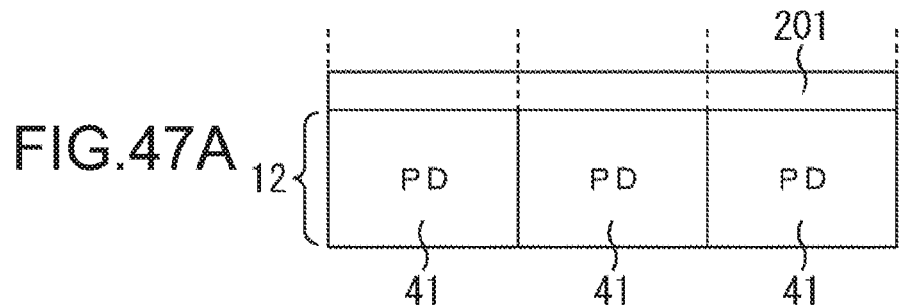
FIGS. 47A to 47D are views for describing the method of manufacturing the pixels according to the thirteenth embodiment.

First, as shown in FIG. 47A, the photodiodes 41 are formed on a pixel-by-pixel basis inside the semiconductor substrate 12, and the protection film 201 is formed with a prescribed thickness on the entire surface on the rear surface side of the semiconductor substrate 12. Note that although omitted in the figures, the element separation layers 68 between the photodiodes 41 and the multilevel wiring layer 66 including the plurality of pixel transistors Tr are also formed as in the embodiments described above.

Figure 47B:
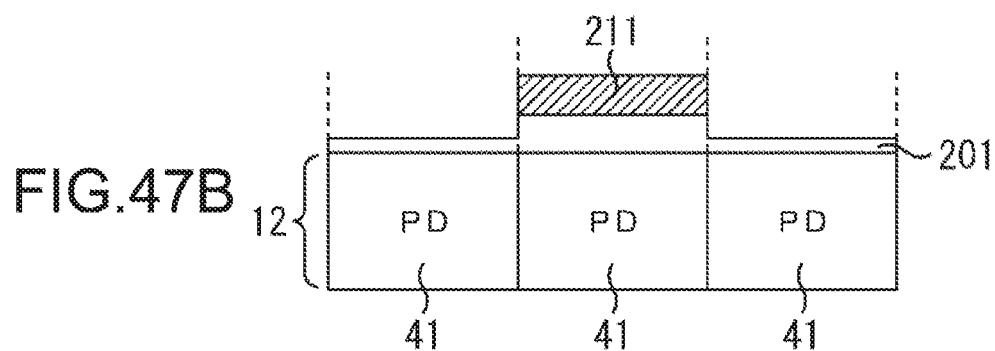

Then, as shown in FIG. 47B, a photoresist 211 is deposited on the entire surface on the upper side of the protection film 201 and patterned to remain only at the pixels 2 where the on-chip lenses 74A are to be formed, and the protection film 201 is etched. By the etching, the protection film 201 is formed to have a larger thickness at the pixels 2 where the on-chip lenses 74A are to be formed than at the pixels 2 where the on-chip lenses 74A are not to be formed.

Figure 47C:
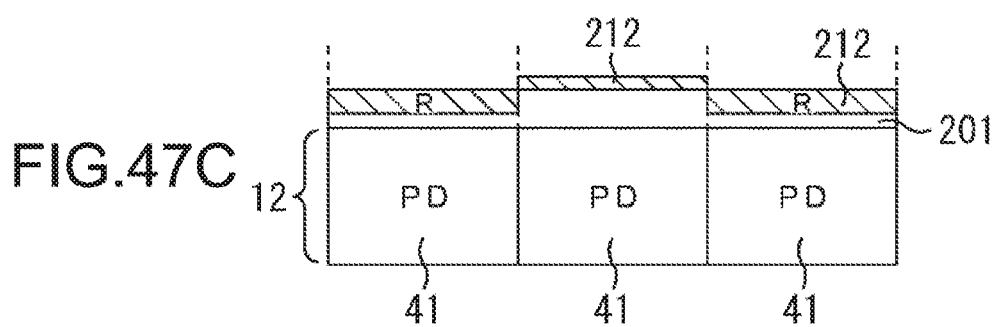

Next, as shown in FIG. 47C, after the removal of the photoresist 211, an R color filter material 212 formed at the pixels 2 where the on-chip lenses 74A are not to be formed is coated by rotation.

Figure 47D:
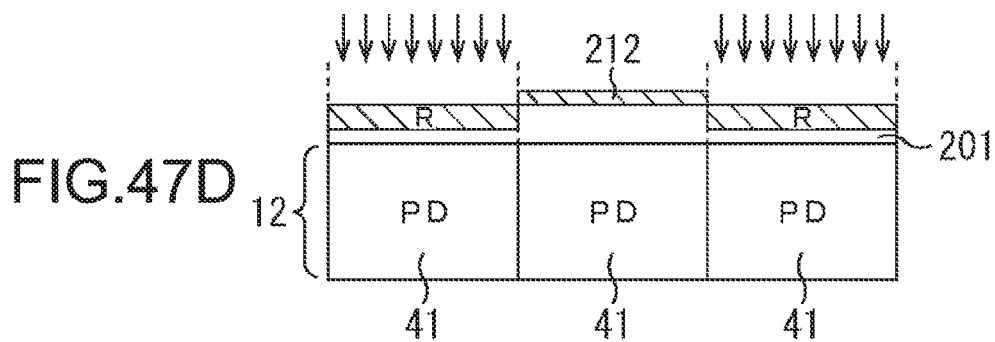
Figure 48A:
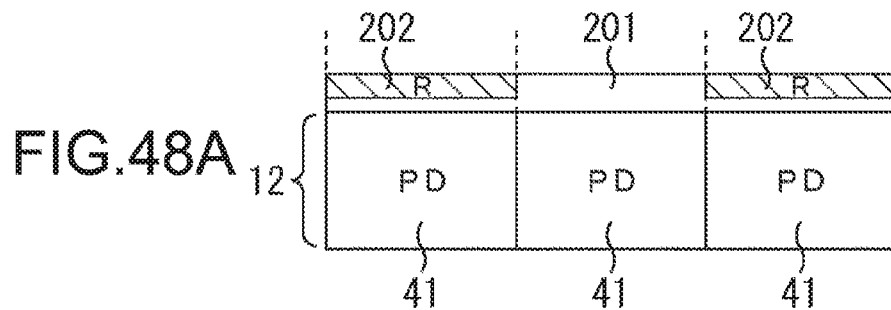
FIGS. 48A to 48D are views for describing the method of manufacturing the pixels according to the thirteenth embodiment.

Then, as shown in FIG. 47D, only the desired regions of the R color filter material 212 coated by rotation are exposed. After that, as shown in FIG. 48A, the unnecessary portions of the R color filter material 212 are removed. Thus, the color filters 202 colored in R are completed at the pixels 2 where the on-chip lenses 74A are not to be formed.

Figure 48B:
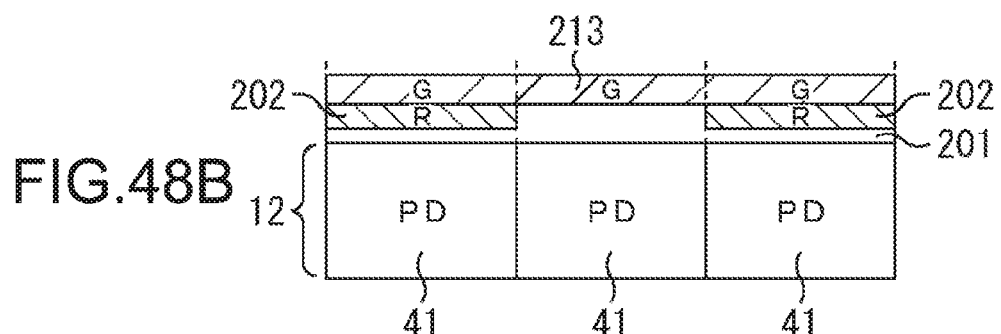

Next, as shown in FIG. 48B, a G color filter material 213 formed at the pixels 2 where the on-chip lenses 74A are not to be formed is coated by rotation.

Figure 48C:
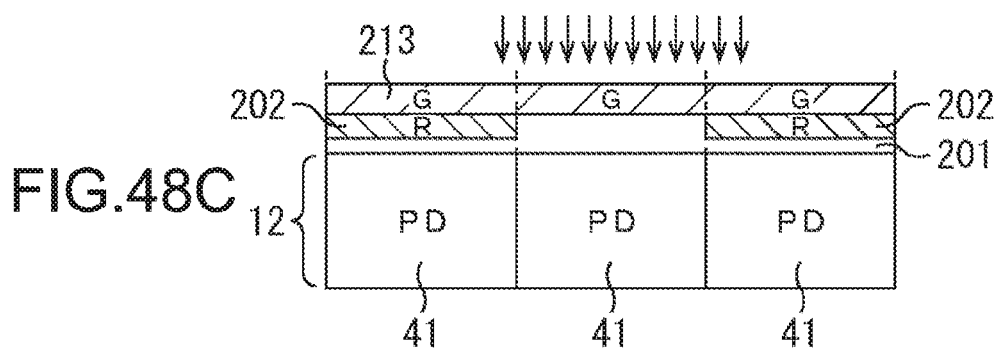
Figure 48D:
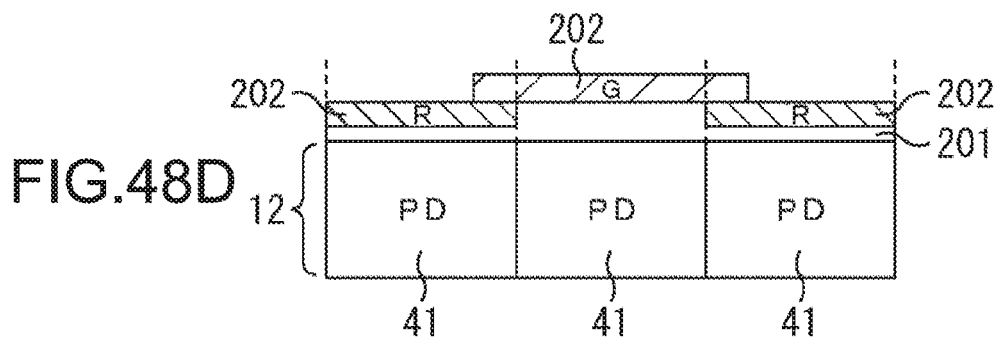

Then, as shown in FIG. 48C, only the desired regions of the G color filter material 213 coated by rotation are exposed. After that, as shown in FIG. 48D, the unnecessary portions of the G color filter material 213 are removed. Thus, the color filters 202 colored in G are completed at the pixels 2 where the on-chip lenses 74A are to be formed.

After that, the on-chip lens layer 203 and the on-chip lenses 203A are formed on the color filters 202 at the respective colors 2, whereby the pixel structure shown in FIG. 44 is completed.

22. Fourteenth Embodiment of Pixels (Cross-Sectional Configuration View of Pixels)

Figure 49:
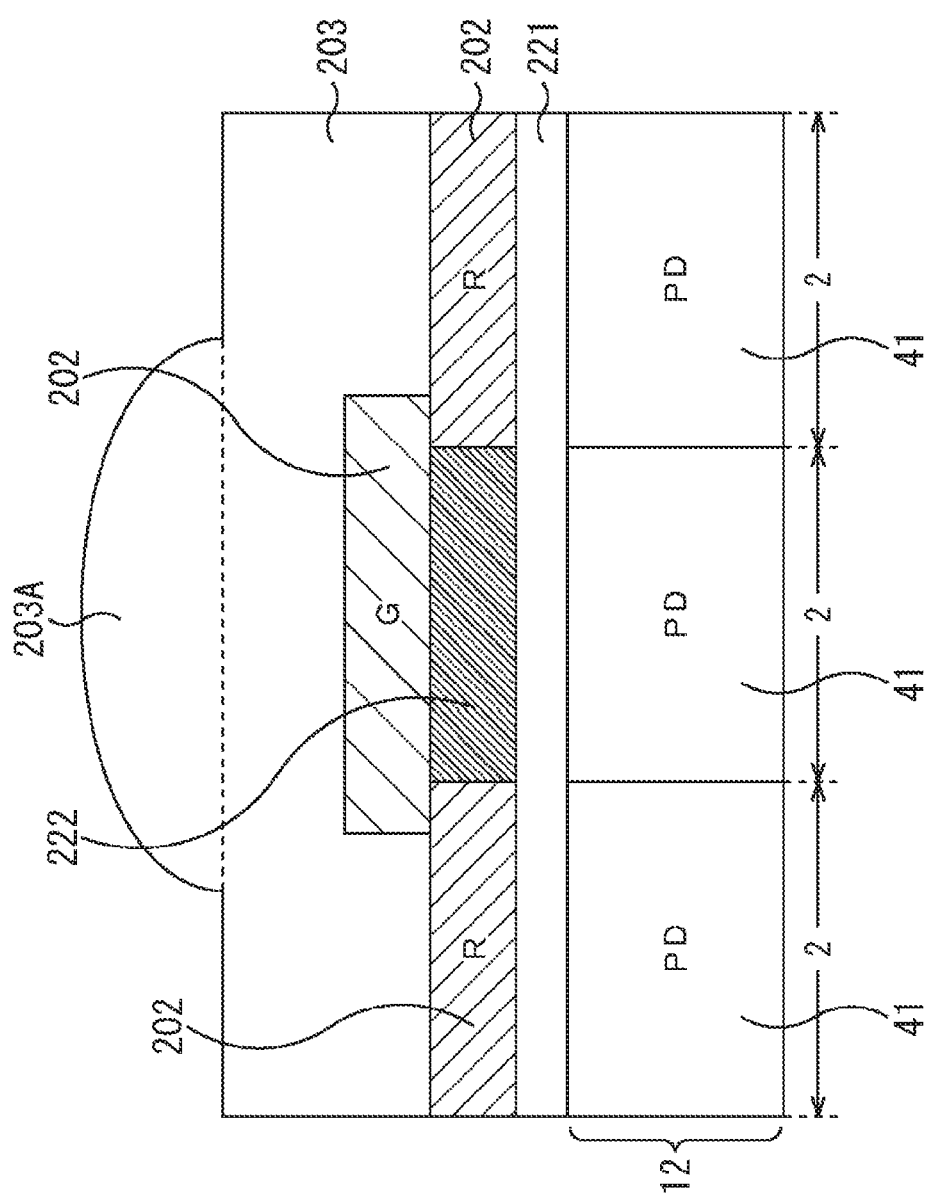
FIG. 49 is a cross-sectional configuration view according to a fourteenth embodiment of the pixels.

FIG. 49 is a cross-sectional configuration view according to a fourteenth embodiment of the pixels 2.

Note that components corresponding to the components of FIG. 44 according to the thirteenth embodiment described above are denoted by the same symbols in FIG. 49 and only components different from the components of the pixel structure shown in FIG. 44 will be described.

In a pixel structure according to the fourteenth embodiment, a protection film 221 formed on the upper surface on the rear surface side of the semiconductor substrate 12 has the same thickness between the pixels 2 where the on-chip lenses 203A are present and the pixels 2 where the on-chip lenses 203A are absent.

Further, in the pixel structure according to the fourteenth embodiment, photosensitive transparent resin films 222 are formed between the protection film 221 and the color filters 202 colored in G at the pixels 2 where the on-chip lenses 203A are present. Like this, the steps between the pixels 2 where the on-chip lenses 203A are present and the pixels 2 where the on-chip lenses 203A are absent may be formed by any material other than the protection film 221.

23. Method of Manufacturing Pixels According to Fourteenth Embodiment

A description will be given, with reference to FIGS. 50A to 50E and FIGS. 51A to 51D, of the method of manufacturing the pixels 2 according to the fourteenth embodiment.

Figure 50A:
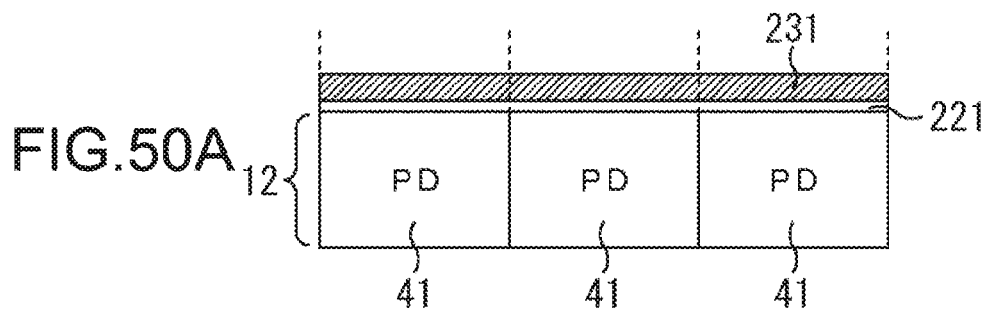
FIGS. 50A to 50E are views for describing the method of manufacturing the pixels according to the fourteenth embodiment.

As shown in FIG. 50A, after the photodiodes 41 are formed on a pixel-by-pixel basis inside the semiconductor substrate 12 and the protection film 221 is formed on the entire surface on the rear surface side of the semiconductor substrate 12, a photosensitive transparent resin layer 231 is laminated with a prescribed film thickness. Note that although omitted in the figures, the element separation layers 68 between the photodiodes 41 and the multilevel wiring layer 66 including the plurality of pixel transistors Tr are also formed as in the embodiments described above.

Figure 50B:
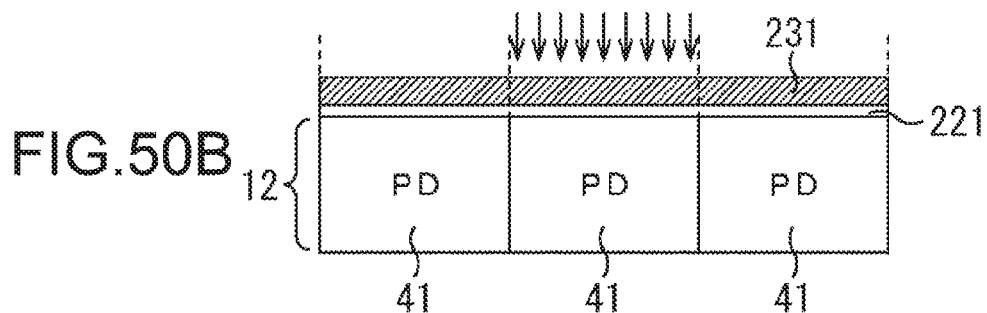
Figure 50C:
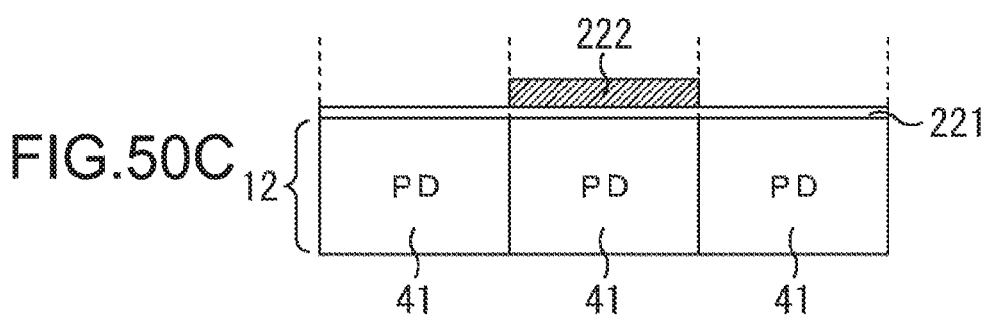

Then, as shown in FIG. 50B, the photosensitive transparent resin layer 231 is exposed only at the pixels 2 where the on-chip lenses 203A are to be formed. As a result, as shown in FIG. 50C, the photosensitive transparent resin films 222 are formed only at the pixels 2 where the on-chip lenses 203A are to be formed.

The following steps are the same as the manufacturing steps of the pixel structure according to the thirteenth embodiment described above.

Figure 50D:
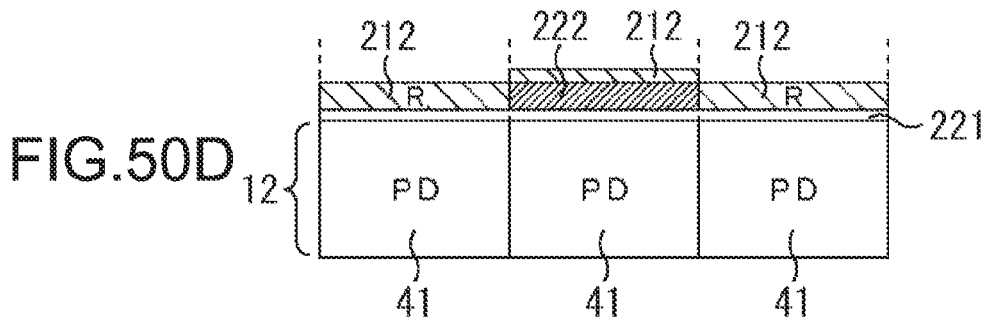

That is, as shown in FIG. 50D, an R color filter material 212 formed at the pixels 2 where the on-chip lenses 74A are not to be formed is coated by rotation.

Figure 50E:
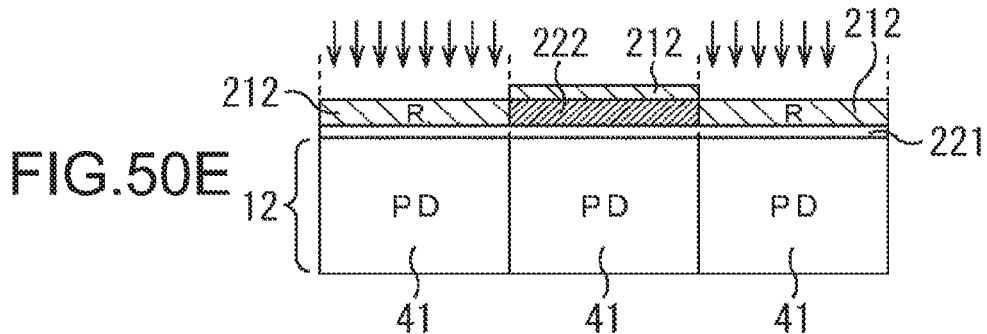

Then, as shown in FIG. 50E, only the desired regions of the R color filter material 212 coated by rotation are exposed. After that, as shown in FIG. 51A, the unnecessary portions of the R color filter material 212 are removed. Thus, the color filters 202 colored in R are completed at the pixels 2 where the on-chip lenses 74A are not to be formed.

Next, as shown in FIG. 51B, a G color filter material 213 formed at the pixels 2 where the on-chip lenses 74A are not to be formed is coated by rotation.

Then, as shown in FIG. 51C, only the desired regions of the G color filter material 213 coated by rotation are exposed. After that, as shown in FIG. 51D, the unnecessary portions of the G color filter material 213 are removed. Thus, the color filters 202 colored in G are completed at the pixels 2 where the on-chip lenses 74A are to be formed.

After that, the on-chip lens layer 203 and the on-chip lenses 203A are formed on the color filters 202 at the respective colors 2, whereby the pixel structure shown in FIG. 49 is completed.

24. Fifteenth Embodiment of Pixels (Cross-Sectional Configuration View of Pixels)

Figure 52:
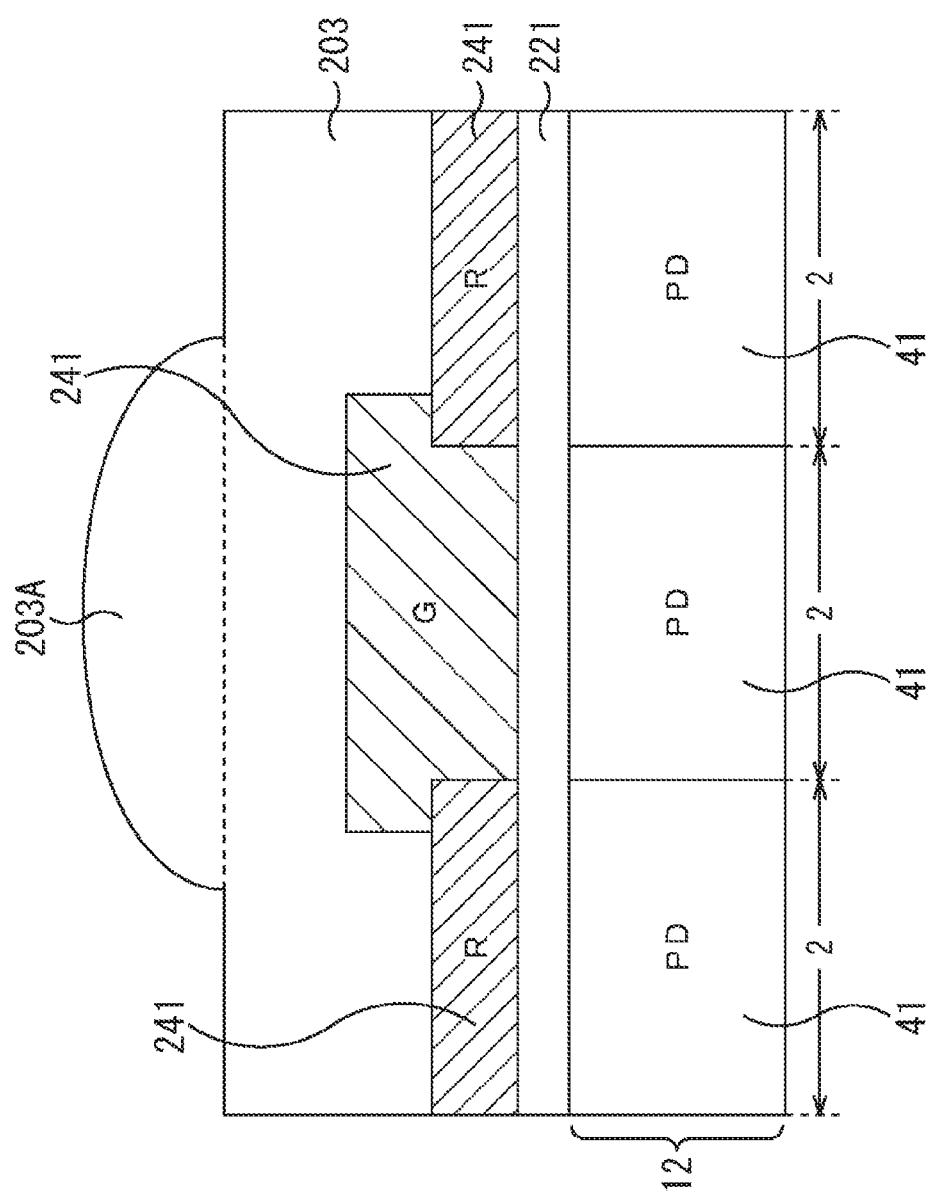
FIG. 52 is a cross-sectional configuration view according to a fifteenth embodiment of the pixels.

FIG. 52 is a cross-sectional configuration view according to a fifteenth embodiment of the pixels 2.

Note that components corresponding to the components of FIG. 49 according to the fourteenth embodiment described above are denoted by the same symbols in FIG. 52 and only components different from the components of the pixel structure shown in FIG. 49 will be described.

In a pixel structure according to the fifteenth embodiment, color filters 241 colored in G including the portions of the photosensitive transparent resin films 222 according to the fourteenth embodiment shown in FIG. 49 are formed. Color filters 241 colored in R at the pixels 2 where the on-chip lenses 203A are absent are the same as the color filters 202 colored in R according to the fourteenth embodiment shown in FIG. 49. Such a pixel structure causes a difference in spectral characteristics due to a difference in the film thickness of the color filters 241 between the pixels 2 where the on-chip lenses 203A are present and the pixels 2 where the on-chip lenses 203A are absent but has the advantage of less manufacturing steps.

In the fourteenth and fifteenth embodiments described above, the on-chip lens layer 203 is formed to heighten the pixel structure to optimize a focal distance, and the color filters 202 (241) at the pixels 2 where the on-chip lenses 203A are present are formed to be superimposed on the color filters 202 (241) at the adjacent pixels 2 where the on-chip lenses 203A are absent. Accordingly, the degradation of color mixture may be prevented in the pixel structure of the rear surface irradiation type in which the on-chip lenses larger in size than the pixels are formed for every other pixel.

The arrangement of the colors of the color filters 202 (241) is not limited to this example in the fourteenth and fifteenth embodiments described above, but the various arrangement methods shown in FIG. 4A and FIGS. 24 to 27 may be employed.

25. Application Example to Electronic Apparatuses

The application of the technology of the present disclosure is not limited to solid-state imaging devices. In other words, the technology of the present disclosure is applicable to overall electronic apparatuses having solid-state imaging devices as image capturing portions (photoelectric conversion portions) such as imaging apparatuses including digital still cameras and video cameras, mobile terminal apparatuses having imaging functions, and copiers having solid-state imaging devices as image capturing portions. The solid-state imaging devices may be of a one-chip form or a module-like form having an imaging function and having an imaging unit and a signal processing unit or an optical system packaged therein.

FIG. 53 is a block diagram showing a configuration example of an imaging apparatus serving as an electronic apparatus according to an embodiment of the present disclosure.

An imaging apparatus 300 of FIG. 53 has an optical unit 301 including a group of lenses, a solid-state imaging device (imaging device) employing the configuration of the solid-state imaging device 1 of FIG. 1, and a DSP (Digital Signal Processor) circuit 303 serving as a camera signal processing circuit. In addition, the imaging apparatus 300 has a frame memory 304, a display unit 305, a recording unit 306, an operation unit 307, and a power supply unit 308. The DSP circuit 303, the frame memory 304, the display unit 305, the recording unit 306, the operation unit 307, and the power supply unit 308 are connected to each other via a bus line 309.

The optical unit 301 captures incident light (image light) from a subject and forms the same on the imaging surface of the solid-state imaging device 302. The solid-state imaging device 302 converts the light amount of incident light formed on the imaging surface by the optical unit 301 into an electric signal on a pixel-by-pixel basis and outputs the converted electric signal as a pixel signal. As the solid-state imaging device 302, the solid-state imaging device 1 of FIG. 1, i.e., the solid-state imaging device of the rear-surface irradiation type in which the on-chip lenses larger in size than the pixels are formed for every other pixel to prevent the degradation of color mixture may be used.

The display unit 305 is made of, for example, a panel display device such as a liquid crystal panel and an organic EL (Electro Luminescence) panel and displays moving images or still images captured by the solid-state imaging device 302. The recording unit 306 records moving images or still images captured by the solid-state imaging device 302 on a recording medium such as a hard disk and a semiconductor memory.

The operation unit 307 issues an operating command for the various functions of the imaging apparatus 300 according to user's operations. The power supply unit 308 appropriately supplies various power supplies serving as power supplies for operating the DSP circuit 303, the frame memory 304, the display unit 305, the recording unit 306, and the operation unit 307 to these supply targets.

As described above, the degradation of color mixture may be prevented when the solid-state imaging device 1 described above is used as the solid-state imaging device 302. Accordingly, the high quality of captured images may be achieved even in the imaging apparatuses 300 of camera modules or the like for mobile equipment such as video cameras, digital still cameras, and mobile phones.

The example described above refers to the solid-state imaging device in which the first conductive types serve as n-types, the second conductive types serve as p-types, and the electrons serve as signal charges. However, the technology of the present disclosure may also be applied to solid-state imaging devices in which holes serve as signal charges. That is, with the first conductive types serving as p-types and the second conductive types as n-types, the respective semiconductor regions described above may be constituted of semiconductor regions having the reverse conductive types.

In addition, the application of the technology of the present disclosure is not limited to solid-state imaging devices that detect the distribution of the incident light amounts of visible light and capture the same as images, but the technology of the present disclosure is applicable to solid-state imaging devices that capture the distribution of the incident amounts of infrared rays, X-rays, or particles as images and is applicable, in a broad sense, to overall solid-state imaging devices (physical amounts distribution detection devices) such as finger print detection sensors that detect the distribution of other physical amounts such as pressure and capacitances and capture the same as images.

The embodiments of the present disclosure are not limited to the embodiments described above but may be modified in various ways insofar as they are within the scope of the present disclosure.

For example, all or some of the plurality of embodiments described above may be combined together.

Note that the effects described in the specification are only for illustration purposes and the effects of the present disclosure are not limited to them. That is, effects other than those described in the specification may be produced.

Note that the present technology may also employ the following configurations.

(1) A solid-state imaging device, including:

a plurality of pixels arranged in a matrix pattern, each of the pixels having a photoelectric conversion portion configured to photoelectrically convert light incident from a rear surface side of a semiconductor substrate; and a plurality of on-chip lenses arranged for every other pixel, the on-chip lenses being larger in size than the pixels, in which each of color filters at the pixels where the on-chip lenses are present has a cross-sectional shape whose upper side close to the on-chip lens is the same in width as the on-chip lens and whose lower side close to the photoelectric conversion portion is shorter than the upper side.

(2) The solid-state imaging device according to (1), in which a film thickness at a peripheral portion of each of the color filters at the pixels where the on-chip lenses are absent is larger than a film thickness at a central portion thereof.

(3) The solid-state imaging device according to (1) or (2), in which each of the color filters at the pixels where the on-chip lenses are absent is formed on a transparent film made of a material having high transparency.

(4) The solid-state imaging device according to (3), in which the transparent film has a trapezoidal cross section.

(5) The solid-state imaging device according to any one of (1) to (4), in which each of the color filters at the pixels where the on-chip lenses are present has a trapezoidal cross section.

(6) The solid-state imaging device according to any one of (1) to (5), further including
a plurality of light-shielding walls each having a triangular cross section, the light shielding walls being arranged at positions adjacent to the color filters at the pixels where the on-chip lenses are present.

(7) The solid-state imaging device according to (6), in which
each of the light-shielding walls is made of one of a low refractive index material having a lower refractive index than the color filters and a metal material.

(8) The solid-state imaging device according to any one of (1) to (7), in which
each of the color filters at the pixels where the on-chip lenses are absent has a rectangular cross section.

(9) The solid-state imaging device according to any one of (1) to (8), in which
the lower side is the same in width as the pixels.

(10) The solid-state imaging device according to any one of (1) to (9), in which
each of the color filters is formed on a flattened film.

(11) The solid-state imaging device according to any one of (1) to (10), further including
a plurality of inter-pixel light-shielding films arranged at pixel boundary portions at an interface on the rear surface side of the semiconductor substrate.

(12) The solid-state imaging device according to (6), further including
a plurality of light-shielding portions embedded between the adjacent photoelectric conversion portions with a desired depth from the rear surface side of the semiconductor substrate.

(13) The solid-state imaging device according to (12), in which
the light-shielding walls and the light-shielding portions are connected to each other at an interface on the rear surface side of the semiconductor substrate.

(14) The solid-state imaging device according to (12), in which
the light-shielding walls and the light-shielding portions are made of a same material.

(15) The solid-state imaging device according to (12), in which
both side walls of the light-shielding walls held between the color filters are slant surfaces.

(16) The solid-state imaging device according to (12), in which
the light-shielding walls are the same in height as the color filters.

(17) The solid-state imaging device according to (12), in which
the light-shielding walls are lower in height than the color filters.

(18) The solid-state imaging device according to (12), in which
each of the light-shielding walls has a trapezoidal cross section.

(19) A method of manufacturing a solid-state imaging device having a plurality of pixels arranged in a matrix pattern, each of the pixels having a photoelectric conversion portion configured to photoelectrically convert light incident from a rear surface side of a semiconductor substrate and a plurality of on-chip lenses arranged for every other pixel, the on-chip lenses being larger in size than the pixels, the method including
forming each of color filters at the pixels where the on-chip lenses are present such that the color filter has a cross-sectional shape whose upper side close to the on-chip lens is the same in width as the on-chip lens and whose lower side close to the photoelectric conversion portion is shorter than the upper side.

(20) An electronic apparatus, including
a solid-state imaging device having
a plurality of pixels arranged in a matrix pattern, each of the pixels having a photoelectric conversion portion configured to photoelectrically convert light incident from a rear surface side of a semiconductor substrate, and
a plurality of on-chip lenses arranged for every other pixel, the on-chip lenses being larger in size than the pixels, in which
each of color filters at the pixels where the on-chip lenses are present has a cross-sectional shape whose upper side close to the on-chip lens is the same in width as the on-chip lens and whose lower side close to the photoelectric conversion portion is shorter than the upper side.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
a plurality of photodiodes including a group of first photodiodes, a group of second photodiodes, and a group of third photodiodes,
wherein the first photodiodes are configured to receive light in a range of wavelengths corresponding to green light,
wherein the second photodiodes are configured to receive light in a range of wavelengths corresponding to red light,
wherein the third photodiodes are configured to receive light in a range of wavelengths corresponding to blue light,
wherein the group of first photodiodes includes a first photodiode and a second photodiode disposed diagonally,
wherein the group of second photodiodes includes a third photodiode and a fourth photodiode disposed in a horizontal direction,
wherein the group of third photodiodes includes a fifth photodiode and a sixth photodiode disposed in the horizontal direction,
wherein the first photodiode is disposed between the third photodiode and the fourth photodiode in a horizontal direction,
wherein the second photodiode is disposed between the fifth photodiode and the sixth photodiode in the horizontal direction,
wherein a size of the third photodiode is larger than a size of the first photodiode, and
wherein a size of the second photodiode is smaller than the size of the fifth photodiode.

2. The imaging device of claim 1, wherein a shape of the first photodiode in a plan view is different than a shape of the third photodiode in the plan view.

3. The imaging device of claim 2, wherein the shape of the first photodiode in the plan view is different than a shape of the fifth photodiode in the plan view.

4. The imaging device of claim 3, wherein the shape of the third photodiode in the plan view is the same as the shape of the fifth photodiode in the plan view.

5. The imaging device of claim 1, wherein a size of the third photodiode is equal to a size of the fifth photodiode.

6. An imaging device, comprising:
a plurality of color filters including a group of green color filters, a group of red color filters, and a group of blue color filters,
wherein the group of the green color filters includes a first color filter and a second color filter disposed diagonally,
wherein the group of the red color filters include a third color filter and a fourth color filter disposed in a horizontal direction,
wherein the group of the blue color filters include a fifth color filter and a sixth color filter disposed in the horizontal direction,
wherein the first color filter is disposed between the third color filter and the fourth color filter in a horizontal direction,
wherein the second color filter is disposed between the fifth color filter and the sixth color filter in the horizontal direction,
wherein a size of the third color filter is larger than a size of the first color filter in a plan view, and
wherein a size of the second color filter is smaller than the size of the fifth color filter in the plan view.

7. The imaging device of claim 6, wherein a shape of the first color filter in a plan view is different than a shape of the third color filter in the plan view.

8. The imaging device of claim 7, wherein the shape of the first color filter in the plan view is different than a shape of the fifth color filter in the plan view.

9. The imaging device of claim 8, wherein the shape of the third color filter in the plan view is the same as a shape of the fifth color filter in the plan view.

10. The imaging device of claim 6, wherein a size of the third color filter in the plan view is equal to a size of the fifth color filter in the plan view.

11. An imaging device, comprising:
a plurality of photodiodes including a group of first photodiodes, a group of second photodiodes, and a group of third photodiodes,
wherein the first photodiodes are configured to receive light in a range of wavelengths corresponding to green light,
wherein the second photodiodes are configured to receive a range of wavelength corresponding to red light,
wherein the third photodiodes are configured to receive a range of wavelength corresponding to blue light,
wherein the group of first photodiodes includes a first photodiode and a second photodiode disposed diagonally,
wherein the group of second photodiodes includes a third photodiode and a fourth photodiode disposed in a horizontal direction,
wherein the group of third photodiodes includes a fifth photodiode and a sixth photodiode disposed in the horizontal direction,
wherein the first photodiode is disposed between the third photodiode and the fourth photodiode in a horizontal direction,
wherein the second photodiode is disposed between the fifth photodiode and the sixth photodiode in the horizontal direction,
wherein a size of the fifth photodiode is larger than a size of the second photodiode, and
wherein a size of the first photodiode is smaller than the size of the third photodiode.

12. The imaging device of claim 11, wherein a shape of the first photodiode in a plan view is different than a shape of the third photodiode in the plan view.

13. The imaging device of claim 12, wherein the shape of the first photodiode in the plan view is different than a shape of the fifth photodiode in the plan view.

14. The imaging device of claim 13, wherein the shape of the third photodiode in the plan view is the same as the shape of the fifth photodiode in the plan view.

15. The imaging device of claim 11, wherein a size of the third photodiode is equal to a size of the fifth photodiode.

16. An imaging device, comprising:
a plurality of color filters including a group of green color filters, a group of red color filters, and a group of blue color filters,
wherein the group of first color filters includes a first color filter and a second color filter disposed diagonally,
wherein the group of second color filters includes a third color filter and a fourth color filter disposed in a horizontal direction,
wherein the group of third color filters includes a fifth color filter and a sixth color filter disposed in the horizontal direction,
wherein the first color filter is disposed between the third color filter and the fourth color filter in a horizontal direction,
wherein the second color filter is disposed between the fifth color filter and the sixth color filter in the horizontal direction,
wherein a size of the fifth color filter is larger than a size of the second color filter in a plan view, and
wherein a size of the first color filter is smaller than the size of the third color filter in the plan view.

17. The imaging device of claim 16, wherein a shape of the first color filter in a plan view is different than a shape of the third color filter in the plan view.

18. The imaging device of claim 17, wherein the shape of the first color filter in the plan view is different than a shape of the fifth color filter in the plan view.

19. The imaging device of claim 18, wherein the shape of the third color filter in the plan view is the same as a shape of the fifth color filter in the plan view.

20. The imaging device of claim 16, wherein a size of the third color filter in the plan view is equal to a size of the fifth color filter in the plan view.

* * * * *